(12) United States Patent
Sella et al.

(10) Patent No.: US 9,543,889 B2
(45) Date of Patent: Jan. 10, 2017

(54) DISTRIBUTED POWER HARVESTING SYSTEMS USING DC POWER SOURCES

(71) Applicant: Solaredge Technologies Ltd., Hod Hasharon (IL)

(72) Inventors: Guy Sella, Bitan Aharon (IL); Lior Handelsman, Givataim (IL); Yoav Galin, Raanana (IL); Amir Fishelov, Tel Aviv (IL); Meir Adest, Raanana (IL)

(73) Assignee: Solaredge Technologies Ltd., Herzliya Pituah (IL)

( * ) Notice: Subject to any disclaimer, the term of this patent is extended or adjusted under 35 U.S.C. 154(b) by 0 days.

(21) Appl. No.: 14/582,381

(22) Filed: Dec. 24, 2014

(65) Prior Publication Data

US 2015/0155825 A1    Jun. 4, 2015

Related U.S. Application Data

(63) Continuation of application No. 12/411,294, filed on Mar. 25, 2009, now Pat. No. 8,963,369, and a
(Continued)

(51) Int. Cl.
*H02J 1/10* (2006.01)
*H02S 40/34* (2014.01)
(Continued)

(52) U.S. Cl.
CPC ......... *H02S 40/34* (2014.12); *H01L 31/02021* (2013.01); *H01R 13/514* (2013.01);
(Continued)

(58) Field of Classification Search
CPC .......................... H02J 1/102; H01L 2924/0002
(Continued)

(56) References Cited

U.S. PATENT DOCUMENTS

| 2,367,925 A | 1/1945 | Brown |
| 2,758,219 A | 8/1956 | Miller |

(Continued)

FOREIGN PATENT DOCUMENTS

| AU | 2073800 A | 9/2000 |
| AU | 2005262278 A1 | 1/2006 |

(Continued)

OTHER PUBLICATIONS

Ciobotaru, et al., Control of single-stage single-phase PV inverter, Aug. 7, 2006.

(Continued)

*Primary Examiner* — Jared Fureman
*Assistant Examiner* — Alfonso Perez Borroto
(74) *Attorney, Agent, or Firm* — Banner & Witcoff, Ltd.

(57) ABSTRACT

A distributed power harvesting system including multiple direct current (DC) power sources with respective DC outputs adapted for interconnection into a interconnected DC power source output. A converter includes input terminals adapted for coupling to the interconnected DC power source output. A circuit loop sets the voltage and current at the input terminals of the converter according to predetermined criteria. A power conversion portion converts the power received at the input terminals to an output power at the output terminals. A power supplier is coupled to the output terminals. The power supplier includes a control part for maintaining the input to the power supplier at a predetermined value. The control part maintains the input voltage and/or input current to the power supplier at a predetermined value.

24 Claims, 17 Drawing Sheets

Related U.S. Application Data continuation-in-part of application No. 11/950,271, filed on Dec. 4, 2007.

(60) Provisional application No. 61/039,113, filed on Mar. 25, 2008, provisional application No. 60/916,815, filed on May 9, 2007, provisional application No. 60/908,095, filed on Mar. 26, 2007, provisional application No. 60/868,962, filed on Dec. 7, 2006, provisional application No. 60/868,893, filed on Dec. 6, 2006, provisional application No. 60/868,851, filed on Dec. 6, 2006.

(51) Int. Cl.
*H01L 31/02* (2006.01)
*H02J 3/38* (2006.01)
*H01R 13/514* (2006.01)
*H02J 7/35* (2006.01)

(52) U.S. Cl.
CPC .............. *H02J 1/102* (2013.01); *H02J 3/383* (2013.01); *H02J 7/35* (2013.01); *Y02B 10/14* (2013.01); *Y02E 10/563* (2013.01); *Y02E 10/566* (2013.01); *Y10T 29/49117* (2015.01); *Y10T 307/50* (2015.04); *Y10T 307/549* (2015.04)

(58) Field of Classification Search
USPC ............ 307/52; 174/50, 564; 439/76.1, 492; 136/244; 361/641
See application file for complete search history.

(56) References Cited

U.S. PATENT DOCUMENTS

| | | |
|---|---|---|
| 2,852,721 A | 9/1958 | Harders et al. |
| 2,958,171 A | 11/1960 | Deckers |
| 3,369,210 A | 2/1968 | Manickella |
| 3,392,326 A | 7/1968 | Lamberton |
| 3,566,143 A | 2/1971 | Paine et al. |
| 3,596,229 A | 7/1971 | Hohorst |
| 3,696,286 A | 10/1972 | Ule |
| 3,958,136 A | 5/1976 | Schroeder |
| 4,060,757 A | 11/1977 | McMurray |
| 4,101,816 A | 7/1978 | Shepter |
| 4,104,687 A | 8/1978 | Zulaski |
| 4,129,788 A | 12/1978 | Chavannes |
| 4,146,785 A | 3/1979 | Neale |
| 4,161,771 A | 7/1979 | Bates |
| 4,171,861 A | 10/1979 | Hohorst |
| 4,183,079 A | 1/1980 | Wachi |
| 4,257,087 A | 3/1981 | Cuk |
| 4,296,461 A | 10/1981 | Mallory et al. |
| 4,321,581 A | 3/1982 | Tappeiner et al. |
| 4,346,341 A | 8/1982 | Blackburn et al. |
| 4,367,557 A | 1/1983 | Stern et al. |
| 4,375,662 A | 3/1983 | Baker |
| 4,404,472 A | 9/1983 | Steigerwald |
| 4,412,142 A | 10/1983 | Ragonese et al. |
| 4,452,867 A | 6/1984 | Conforti |
| 4,453,207 A | 6/1984 | Paul |
| 4,460,232 A | 7/1984 | Sotolongo |
| 4,479,175 A | 10/1984 | Gille et al. |
| 4,481,654 A | 11/1984 | Daniels et al. |
| 4,488,136 A | 12/1984 | Hansen et al. |
| 4,545,997 A | 10/1985 | Wong et al. |
| 4,549,254 A | 10/1985 | Kissel |
| 4,554,502 A | 11/1985 | Rohatyn |
| 4,554,515 A | 11/1985 | Burson et al. |
| 4,580,090 A | 4/1986 | Bailey et al. |
| 4,591,965 A | 5/1986 | Dickerson |
| 4,598,330 A | 7/1986 | Woodworth |
| 4,602,322 A | 7/1986 | Merrick |
| 4,604,567 A | 8/1986 | Chetty |
| 4,623,753 A | 11/1986 | Feldman et al. |
| 4,626,983 A | 12/1986 | Harada et al. |
| 4,631,565 A | 12/1986 | Tihanyi |
| 4,637,677 A | 1/1987 | Barkus |
| 4,639,844 A | 1/1987 | Gallios et al. |
| 4,641,042 A | 2/1987 | Miyazawa |
| 4,641,079 A | 2/1987 | Kato et al. |
| 4,644,458 A | 2/1987 | Harafuji et al. |
| 4,649,334 A | 3/1987 | Nakajima |
| 4,652,770 A | 3/1987 | Kumano |
| 4,683,529 A | 7/1987 | Bucher, II |
| 4,685,040 A | 8/1987 | Steigerwald et al. |
| 4,686,617 A | 8/1987 | Colton |
| 4,706,181 A | 11/1987 | Mercer |
| 4,719,553 A | 1/1988 | Hinckley |
| 4,720,667 A | 1/1988 | Lee et al. |
| 4,720,668 A | 1/1988 | Lee et al. |
| 4,736,151 A | 4/1988 | Dishner |
| 4,772,994 A | 9/1988 | Harada et al. |
| 4,783,728 A | 11/1988 | Hoffman |
| 4,819,121 A | 4/1989 | Saito et al. |
| RE33,057 E | 9/1989 | Clegg et al. |
| 4,864,213 A | 9/1989 | Kido |
| 4,868,379 A | 9/1989 | West |
| 4,873,480 A | 10/1989 | Lafferty |
| 4,888,063 A | 12/1989 | Powell |
| 4,888,702 A | 12/1989 | Gerken et al. |
| 4,899,269 A | 2/1990 | Rouzies |
| 4,903,851 A | 2/1990 | Slough |
| 4,906,859 A | 3/1990 | Kobayashi et al. |
| 4,910,518 A | 3/1990 | Kim et al. |
| 4,951,117 A | 8/1990 | Kasai |
| 4,978,870 A | 12/1990 | Chen et al. |
| 4,987,360 A | 1/1991 | Thompson |
| 5,001,415 A | 3/1991 | Watkinson |
| 5,027,051 A | 6/1991 | Lafferty |
| 5,027,059 A | 6/1991 | de Montgolfier et al. |
| 5,045,988 A | 9/1991 | Gritter et al. |
| 5,081,558 A | 1/1992 | Mahler |
| 5,138,422 A | 8/1992 | Fujii et al. |
| 5,144,222 A | 9/1992 | Herbert |
| 5,155,670 A | 10/1992 | Brian |
| 5,191,519 A | 3/1993 | Kawakami |
| 5,196,781 A | 3/1993 | Jamieson et al. |
| 5,237,194 A | 8/1993 | Takahashi |
| 5,268,832 A | 12/1993 | Kandatsu |
| 5,280,133 A | 1/1994 | Nath |
| 5,280,232 A | 1/1994 | Kohl et al. |
| 5,287,261 A | 2/1994 | Ehsani |
| 5,289,361 A | 2/1994 | Vinciarelli |
| 5,289,998 A | 3/1994 | Bingley et al. |
| 5,327,071 A | 7/1994 | Frederick et al. |
| 5,329,222 A | 7/1994 | Gyugyi et al. |
| 5,345,375 A | 9/1994 | Mohan |
| 5,379,209 A | 1/1995 | Goff |
| 5,381,327 A | 1/1995 | Yan |
| 5,391,235 A | 2/1995 | Inoue |
| 5,402,060 A | 3/1995 | Erisman |
| 5,404,059 A | 4/1995 | Loffler |
| 5,412,558 A | 5/1995 | Sakurai et al. |
| 5,413,313 A | 5/1995 | Mutterlein et al. |
| 5,428,286 A | 6/1995 | Kha |
| 5,446,645 A | 8/1995 | Shirahama et al. |
| 5,460,546 A | 10/1995 | Kunishi et al. |
| 5,493,154 A | 2/1996 | Smith et al. |
| 5,497,289 A | 3/1996 | Sugishima et al. |
| 5,504,418 A | 4/1996 | Ashley |
| 5,504,449 A | 4/1996 | Prentice |
| 5,517,378 A | 5/1996 | Asplund et al. |
| 5,530,335 A | 6/1996 | Decker et al. |
| 5,539,238 A | 7/1996 | Malhi |
| 5,548,504 A | 8/1996 | Takehara |
| 5,563,780 A | 10/1996 | Goad |
| 5,565,855 A | 10/1996 | Knibbe |
| 5,576,941 A | 11/1996 | Nguyen et al. |
| 5,585,749 A | 12/1996 | Pace et al. |
| 5,604,430 A | 2/1997 | Decker et al. |
| 5,616,913 A | 4/1997 | Litterst |
| 5,636,107 A | 6/1997 | Lu et al. |

(56) References Cited

U.S. PATENT DOCUMENTS

| | | |
|---|---|---|
| 5,644,219 A | 7/1997 | Kurokawa |
| 5,646,501 A | 7/1997 | Fishman et al. |
| 5,648,731 A | 7/1997 | Decker et al. |
| 5,654,740 A | 8/1997 | Schulha |
| 5,659,465 A | 8/1997 | Flack et al. |
| 5,677,833 A | 10/1997 | Bingley |
| 5,684,385 A | 11/1997 | Guyonneau et al. |
| 5,686,766 A | 11/1997 | Tamechika |
| 5,696,439 A | 12/1997 | Presti et al. |
| 5,703,390 A | 12/1997 | Itoh |
| 5,708,576 A | 1/1998 | Jones et al. |
| 5,719,758 A | 2/1998 | Nakata et al. |
| 5,722,057 A | 2/1998 | Wu |
| 5,726,505 A | 3/1998 | Yamada et al. |
| 5,726,615 A | 3/1998 | Bloom |
| 5,731,603 A | 3/1998 | Nakagawa et al. |
| 5,734,259 A | 3/1998 | Sisson et al. |
| 5,734,565 A | 3/1998 | Mueller et al. |
| 5,747,967 A | 5/1998 | Muljadi et al. |
| 5,773,963 A | 6/1998 | Blanc et al. |
| 5,777,515 A | 7/1998 | Kimura |
| 5,777,858 A | 7/1998 | Rodulfo |
| 5,780,092 A | 7/1998 | Agbo et al. |
| 5,793,184 A | 8/1998 | O'Connor |
| 5,798,631 A | 8/1998 | Spee et al. |
| 5,801,519 A | 9/1998 | Midya et al. |
| 5,804,894 A | 9/1998 | Leeson et al. |
| 5,812,045 A | 9/1998 | Ishikawa et al. |
| 5,814,970 A | 9/1998 | Schmidt |
| 5,821,734 A | 10/1998 | Faulk |
| 5,822,186 A | 10/1998 | Bull et al. |
| 5,838,148 A | 11/1998 | Kurokami et al. |
| 5,847,549 A | 12/1998 | Dodson, III |
| 5,859,772 A | 1/1999 | Hilpert |
| 5,869,956 A | 2/1999 | Nagao et al. |
| 5,873,738 A | 2/1999 | Shimada et al. |
| 5,886,882 A | 3/1999 | Rodulfo |
| 5,886,890 A | 3/1999 | Ishida et al. |
| 5,892,354 A | 4/1999 | Nagao et al. |
| 5,898,585 A | 4/1999 | Sirichote et al. |
| 5,903,138 A | 5/1999 | Hwang et al. |
| 5,905,645 A | 5/1999 | Cross |
| 5,917,722 A | 6/1999 | Singh |
| 5,919,314 A | 7/1999 | Kim |
| 5,923,100 A | 7/1999 | Lukens et al. |
| 5,923,158 A | 7/1999 | Kurokami et al. |
| 5,929,614 A | 7/1999 | Copple |
| 5,930,128 A | 7/1999 | Dent |
| 5,930,131 A | 7/1999 | Feng |
| 5,932,994 A | 8/1999 | Jo et al. |
| 5,933,327 A | 8/1999 | Leighton et al. |
| 5,945,806 A | 8/1999 | Faulk |
| 5,946,206 A | 8/1999 | Shimizu et al. |
| 5,949,668 A | 9/1999 | Schweighofer |
| 5,961,739 A | 10/1999 | Osborne |
| 5,963,010 A | 10/1999 | Hayashi et al. |
| 5,963,078 A | 10/1999 | Wallace |
| 5,982,253 A | 11/1999 | Perrin et al. |
| 5,986,909 A | 11/1999 | Hammond et al. |
| 5,990,659 A | 11/1999 | Frannhagen |
| 6,002,290 A | 12/1999 | Avery et al. |
| 6,002,603 A | 12/1999 | Carver |
| 6,021,052 A | 2/2000 | Unger et al. |
| 6,031,736 A | 2/2000 | Takehara et al. |
| 6,037,720 A | 3/2000 | Wong et al. |
| 6,038,148 A | 3/2000 | Farrington et al. |
| 6,046,470 A | 4/2000 | Williams et al. |
| 6,046,919 A | 4/2000 | Madenokouji et al. |
| 6,050,779 A | 4/2000 | Nagao et al. |
| 6,058,035 A | 5/2000 | Madenokouji et al. |
| 6,064,086 A | 5/2000 | Nakagawa et al. |
| 6,078,511 A | 6/2000 | Fasullo et al. |
| 6,081,104 A | 6/2000 | Kern |
| 6,082,122 A | 7/2000 | Madenokouji et al. |
| 6,087,738 A | 7/2000 | Hammond |
| 6,093,885 A | 7/2000 | Takehara et al. |
| 6,094,129 A | 7/2000 | Baiatu |
| 6,101,073 A | 8/2000 | Takehara |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,130,458 A | 10/2000 | Takagi et al. |
| 6,150,739 A | 11/2000 | Baumgartl et al. |
| 6,151,234 A | 11/2000 | Oldenkamp |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,175,219 B1 | 1/2001 | Imamura et al. |
| 6,175,512 B1 | 1/2001 | Hagihara et al. |
| 6,191,456 B1 | 2/2001 | Stoisiek et al. |
| 6,219,623 B1 | 4/2001 | Wills |
| 6,225,793 B1 | 5/2001 | Dickmann |
| 6,255,360 B1 | 7/2001 | Domschke et al. |
| 6,255,804 B1 | 7/2001 | Herniter et al. |
| 6,256,234 B1 | 7/2001 | Keeth et al. |
| 6,259,234 B1 | 7/2001 | Perol |
| 6,262,558 B1 | 7/2001 | Weinberg |
| 6,268,559 B1 * | 7/2001 | Yamawaki .................. 136/244 |
| 6,274,804 B1 | 8/2001 | Psyk et al. |
| 6,281,485 B1 | 8/2001 | Siri |
| 6,285,572 B1 | 9/2001 | Onizuka et al. |
| 6,292,379 B1 | 9/2001 | Edevold et al. |
| 6,297,621 B1 | 10/2001 | Hui et al. |
| 6,301,128 B1 | 10/2001 | Jang et al. |
| 6,304,065 B1 | 10/2001 | Wittenbreder |
| 6,307,749 B1 | 10/2001 | Daanen et al. |
| 6,311,137 B1 | 10/2001 | Kurokami et al. |
| 6,316,716 B1 | 11/2001 | Hilgrath |
| 6,320,769 B2 | 11/2001 | Kurokami et al. |
| 6,331,670 B2 | 12/2001 | Takehara et al. |
| 6,339,538 B1 | 1/2002 | Handleman |
| 6,344,612 B1 | 2/2002 | Kuwahara et al. |
| 6,346,451 B1 | 2/2002 | Simpson et al. |
| 6,350,944 B1 | 2/2002 | Sherif et al. |
| 6,351,130 B1 | 2/2002 | Preiser et al. |
| 6,369,461 B1 | 4/2002 | Jungreis et al. |
| 6,369,462 B1 | 4/2002 | Siri |
| 6,380,719 B2 | 4/2002 | Underwood et al. |
| 6,396,170 B1 | 5/2002 | Laufenberg et al. |
| 6,396,239 B1 | 5/2002 | Benn et al. |
| 6,425,248 B1 | 7/2002 | Tonomura et al. |
| 6,429,546 B1 | 8/2002 | Ropp et al. |
| 6,429,621 B1 | 8/2002 | Arai |
| 6,433,522 B1 | 8/2002 | Siri |
| 6,433,978 B1 | 8/2002 | Neiger et al. |
| 6,441,597 B1 | 8/2002 | Lethellier |
| 6,445,599 B1 | 9/2002 | Nguyen |
| 6,448,489 B2 | 9/2002 | Kimura et al. |
| 6,452,814 B1 | 9/2002 | Wittenbreder |
| 6,465,931 B2 | 10/2002 | Knowles et al. |
| 6,469,919 B1 | 10/2002 | Bennett |
| 6,472,254 B2 | 10/2002 | Cantarini et al. |
| 6,483,203 B1 | 11/2002 | McCormack |
| 6,493,246 B2 | 12/2002 | Suzui et al. |
| 6,501,362 B1 | 12/2002 | Hoffman et al. |
| 6,507,176 B2 | 1/2003 | Wittenbreder, Jr. |
| 6,509,712 B1 | 1/2003 | Landis |
| 6,512,444 B1 | 1/2003 | Morris, Jr. et al. |
| 6,515,215 B1 | 2/2003 | Mimura |
| 6,519,165 B2 | 2/2003 | Koike |
| 6,528,977 B2 | 3/2003 | Arakawa |
| 6,531,848 B1 | 3/2003 | Chitsazan et al. |
| 6,545,211 B1 | 4/2003 | Mimura |
| 6,548,205 B2 | 4/2003 | Leung et al. |
| 6,560,131 B1 | 5/2003 | vonBrethorst |
| 6,587,051 B2 | 7/2003 | Takehara et al. |
| 6,590,793 B1 | 7/2003 | Nagao et al. |
| 6,590,794 B1 | 7/2003 | Carter |
| 6,593,520 B2 | 7/2003 | Kondo et al. |
| 6,593,521 B2 | 7/2003 | Kobayashi |
| 6,600,100 B2 | 7/2003 | Ho et al. |
| 6,603,672 B1 | 8/2003 | Deng et al. |

(56) References Cited

U.S. PATENT DOCUMENTS

| | | |
|---|---|---|
| 6,608,468 B2 | 8/2003 | Nagase |
| 6,611,130 B2 | 8/2003 | Chang |
| 6,611,441 B2 | 8/2003 | Kurokami et al. |
| 6,628,011 B2 | 9/2003 | Droppo et al. |
| 6,633,824 B2 | 10/2003 | Dollar, II |
| 6,650,031 B1 | 11/2003 | Goldack |
| 6,650,560 B2 | 11/2003 | MacDonald et al. |
| 6,653,549 B2 | 11/2003 | Matsushita et al. |
| 6,655,987 B2 | 12/2003 | Higashikozono et al. |
| 6,657,419 B2 | 12/2003 | Renyolds |
| 6,672,018 B2 | 1/2004 | Shingleton |
| 6,678,174 B2 | 1/2004 | Suzui et al. |
| 6,690,590 B2 | 2/2004 | Stamenic et al. |
| 6,693,327 B2 | 2/2004 | Priefert et al. |
| 6,693,781 B1 | 2/2004 | Kroker |
| 6,709,291 B1 | 3/2004 | Wallace et al. |
| 6,731,136 B2 | 5/2004 | Knee |
| 6,738,692 B2 | 5/2004 | Schienbein et al. |
| 6,744,643 B2 | 6/2004 | Luo et al. |
| 6,750,391 B2 | 6/2004 | Bower et al. |
| 6,765,315 B2 | 7/2004 | Hammerstrom et al. |
| 6,768,047 B2 | 7/2004 | Chang et al. |
| 6,768,180 B2 | 7/2004 | Salama et al. |
| 6,788,033 B2 | 9/2004 | Vinciarelli |
| 6,788,146 B2 | 9/2004 | Forejt et al. |
| 6,795,318 B2 | 9/2004 | Haas et al. |
| 6,800,964 B2 | 10/2004 | Beck |
| 6,801,442 B2 | 10/2004 | Suzui et al. |
| 6,807,069 B2 | 10/2004 | Nieminen et al. |
| 6,809,942 B2 | 10/2004 | Madenokouji et al. |
| 6,810,339 B2 | 10/2004 | Wills |
| 6,812,396 B2 | 11/2004 | Makita et al. |
| 6,828,503 B2 * | 12/2004 | Yoshikawa et al. ............ 174/50 |
| 6,828,901 B2 | 12/2004 | Birchfield et al. |
| 6,837,739 B2 | 1/2005 | Gorringe et al. |
| 6,838,611 B2 | 1/2005 | Kondo et al. |
| 6,842,354 B1 | 1/2005 | Tallam et al. |
| 6,850,074 B2 | 2/2005 | Adams et al. |
| 6,856,102 B1 | 2/2005 | Lin et al. |
| 6,882,131 B1 | 4/2005 | Takada et al. |
| 6,888,728 B2 | 5/2005 | Takagi et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 | 8/2005 | Wilhelm |
| 6,933,714 B2 | 8/2005 | Fasshauer et al. |
| 6,936,995 B2 | 8/2005 | Kapsokavathis et al. |
| 6,940,735 B2 | 9/2005 | Deng et al. |
| 6,949,843 B2 | 9/2005 | Dubovsky |
| 6,950,323 B2 | 9/2005 | Achleitner et al. |
| 6,963,147 B2 | 11/2005 | Kurokami et al. |
| 6,966,184 B2 | 11/2005 | Toyomura et al. |
| 6,980,783 B2 | 12/2005 | Liu et al. |
| 6,984,967 B2 | 1/2006 | Notman |
| 6,984,970 B2 | 1/2006 | Capel |
| 6,996,741 B1 | 2/2006 | Pittelkow et al. |
| 7,030,597 B2 | 4/2006 | Bruno et al. |
| 7,031,176 B2 | 4/2006 | Kotsopoulos et al. |
| 7,038,430 B2 | 5/2006 | Itabashi et al. |
| 7,042,195 B2 | 5/2006 | Tsunetsugu et al. |
| 7,045,991 B2 | 5/2006 | Nakamura et al. |
| 7,046,531 B2 | 5/2006 | Zocchi et al. |
| 7,053,506 B2 | 5/2006 | Alonso et al. |
| 7,061,211 B2 | 6/2006 | Satoh et al. |
| 7,061,214 B2 | 6/2006 | Mayega et al. |
| 7,064,967 B2 | 6/2006 | Ichinose et al. |
| 7,068,017 B2 | 6/2006 | Willner et al. |
| 7,072,194 B2 | 7/2006 | Nayar et al. |
| 7,078,883 B2 | 7/2006 | Chapman et al. |
| 7,079,406 B2 | 7/2006 | Kurokami et al. |
| 7,087,332 B2 | 8/2006 | Harris |
| 7,090,509 B1 | 8/2006 | Gilliland et al. |
| 7,091,707 B2 | 8/2006 | Cutler |
| 7,097,516 B2 | 8/2006 | Werner et al. |
| 7,099,169 B2 | 8/2006 | West et al. |
| 7,126,053 B2 | 10/2006 | Kurokami et al. |
| 7,126,294 B2 | 10/2006 | Minami et al. |
| 7,138,786 B2 | 11/2006 | Ishigaki et al. |
| 7,142,997 B1 | 11/2006 | Widner |
| 7,148,669 B2 | 12/2006 | Maksimovic et al. |
| 7,158,359 B2 | 1/2007 | Bertele et al. |
| 7,158,395 B2 | 1/2007 | Deng et al. |
| 7,161,082 B2 | 1/2007 | Matsushita et al. |
| 7,174,973 B1 | 2/2007 | Lysaght |
| 7,183,667 B2 | 2/2007 | Colby et al. |
| 7,193,872 B2 | 3/2007 | Siri |
| 7,202,653 B2 | 4/2007 | Pai |
| 7,218,541 B2 | 5/2007 | Price et al. |
| 7,248,946 B2 | 7/2007 | Bashaw et al. |
| 7,256,566 B2 | 8/2007 | Bhavaraju et al. |
| 7,259,474 B2 | 8/2007 | Blanc |
| 7,262,979 B2 | 8/2007 | Wai et al. |
| 7,276,886 B2 | 10/2007 | Kinder et al. |
| 7,277,304 B2 | 10/2007 | Stancu et al. |
| 7,281,141 B2 | 10/2007 | Elkayam et al. |
| 7,282,814 B2 | 10/2007 | Jacobs |
| 7,291,036 B1 | 11/2007 | Daily et al. |
| RE39,976 E | 1/2008 | Schiff et al. |
| 7,315,052 B2 | 1/2008 | Alter |
| 7,319,313 B2 | 1/2008 | Dickerson et al. |
| 7,324,361 B2 | 1/2008 | Siri |
| 7,336,004 B2 | 2/2008 | Lai |
| 7,336,056 B1 | 2/2008 | Dening |
| 7,339,287 B2 | 3/2008 | Jepsen et al. |
| 7,348,802 B2 | 3/2008 | Kasanyal et al. |
| 7,352,154 B2 | 4/2008 | Cook |
| 7,361,952 B2 | 4/2008 | Miura et al. |
| 7,371,963 B2 | 5/2008 | Suenaga et al. |
| 7,372,712 B2 | 5/2008 | Stancu et al. |
| 7,385,380 B2 | 6/2008 | Ishigaki et al. |
| 7,385,833 B2 | 6/2008 | Keung |
| 7,388,348 B2 | 6/2008 | Mattichak |
| 7,394,237 B2 | 7/2008 | Chou et al. |
| 7,405,117 B2 | 7/2008 | Zuniga et al. |
| 7,414,870 B2 | 8/2008 | Rottger et al. |
| 7,420,354 B2 | 9/2008 | Cutler |
| 7,420,815 B2 | 9/2008 | Love |
| 7,432,691 B2 | 10/2008 | Cutler |
| 7,435,134 B2 | 10/2008 | Lenox |
| 7,435,897 B2 | 10/2008 | Russell |
| 7,443,052 B2 | 10/2008 | Wendt et al. |
| 7,443,152 B2 | 10/2008 | Utsunomiya |
| 7,450,401 B2 | 11/2008 | Iida |
| 7,456,523 B2 | 11/2008 | Kobayashi |
| 7,463,500 B2 | 12/2008 | West |
| 7,466,566 B2 | 12/2008 | Fukumoto |
| 7,471,014 B2 | 12/2008 | Lum et al. |
| 7,471,524 B1 | 12/2008 | Batarseh et al. |
| 7,479,774 B2 | 1/2009 | Wai et al. |
| 7,482,238 B2 | 1/2009 | Sung |
| 7,485,987 B2 | 2/2009 | Mori et al. |
| 7,495,419 B1 | 2/2009 | Ju |
| 7,504,811 B2 | 3/2009 | Watanabe et al. |
| 7,518,346 B2 | 4/2009 | Prexl et al. |
| 7,538,451 B2 | 5/2009 | Nomoto |
| 7,560,915 B2 | 7/2009 | Ito et al. |
| 7,589,437 B2 | 9/2009 | Henne et al. |
| 7,595,616 B2 | 9/2009 | Prexl et al. |
| 7,596,008 B2 | 9/2009 | Iwata et al. |
| 7,599,200 B2 | 10/2009 | Tomonaga |
| 7,600,349 B2 | 10/2009 | Liebendorfer |
| 7,602,080 B1 | 10/2009 | Hadar et al. |
| 7,605,498 B2 | 10/2009 | Ledenev et al. |
| 7,612,283 B2 | 11/2009 | Toyomura et al. |
| 7,626,834 B2 | 12/2009 | Chisenga et al. |
| 7,646,116 B2 | 1/2010 | Batarseh et al. |
| 7,649,434 B2 | 1/2010 | Xu et al. |
| 7,701,083 B2 | 4/2010 | Savage |
| 7,709,727 B2 | 5/2010 | Roehrig et al. |
| 7,719,140 B2 | 5/2010 | Ledenev et al. |
| 7,723,865 B2 | 5/2010 | Kitanaka |
| 7,733,069 B2 | 6/2010 | Toyomura et al. |
| 7,748,175 B2 | 7/2010 | Liebendorfer |
| 7,759,575 B2 | 7/2010 | Jones et al. |

(56) References Cited

U.S. PATENT DOCUMENTS

| | | |
|---|---|---|
| 7,763,807 B2 | 7/2010 | Richter |
| 7,772,716 B2 | 8/2010 | Shaver, II et al. |
| 7,780,472 B2 | 8/2010 | Lenox |
| 7,782,031 B2 | 8/2010 | Qiu et al. |
| 7,783,389 B2 | 8/2010 | Yamada et al. |
| 7,787,273 B2 | 8/2010 | Lu et al. |
| 7,804,282 B2 | 9/2010 | Bertele |
| 7,807,919 B2 | 10/2010 | Powell et al. |
| 7,808,125 B1 | 10/2010 | Sachdeva et al. |
| 7,812,701 B2 | 10/2010 | Lee et al. |
| 7,821,225 B2 | 10/2010 | Chou et al. |
| 7,839,022 B2 | 11/2010 | Wolfs |
| 7,843,085 B2 | 11/2010 | Ledenev et al. |
| 7,864,497 B2 | 1/2011 | Quardt et al. |
| 7,868,599 B2 | 1/2011 | Rahman et al. |
| 7,880,334 B2 | 2/2011 | Evans et al. |
| 7,883,808 B2 | 2/2011 | Norimatsu et al. |
| 7,884,278 B2 | 2/2011 | Powell et al. |
| 7,893,346 B2 | 2/2011 | Nachamkin et al. |
| 7,898,112 B2 | 3/2011 | Powell et al. |
| 7,900,361 B2 | 3/2011 | Adest et al. |
| 7,906,870 B2 | 3/2011 | Ohm |
| 7,919,952 B1 | 4/2011 | Fahrenbruch |
| 7,919,953 B2 | 4/2011 | Porter et al. |
| 7,925,552 B2 | 4/2011 | Tarbell et al. |
| 7,944,191 B2 | 5/2011 | Xu |
| 7,945,413 B2 | 5/2011 | Krein |
| 7,948,221 B2 | 5/2011 | Watanabe et al. |
| 7,952,897 B2 | 5/2011 | Nocentini et al. |
| 7,960,650 B2 | 6/2011 | Richter et al. |
| 7,960,950 B2 | 6/2011 | Glovinsky |
| 7,969,133 B2 | 6/2011 | Zhang et al. |
| 8,003,885 B2 | 8/2011 | Richter et al. |
| 8,004,113 B2 | 8/2011 | Sander et al. |
| 8,004,116 B2 | 8/2011 | Ledenev et al. |
| 8,004,117 B2 | 8/2011 | Adest et al. |
| 8,004,866 B2 | 8/2011 | Bucella et al. |
| 8,013,472 B2 | 9/2011 | Adest et al. |
| 8,018,748 B2 | 9/2011 | Leonard |
| 8,035,249 B2 | 10/2011 | Shaver, II et al. |
| 8,039,730 B2 | 10/2011 | Hadar et al. |
| 8,058,747 B2 | 11/2011 | Avrutsky et al. |
| 8,058,752 B2 | 11/2011 | Erickson, Jr. et al. |
| 8,067,855 B2 | 11/2011 | Mumtaz et al. |
| 8,077,437 B2 | 12/2011 | Mumtaz et al. |
| 8,089,780 B2 | 1/2012 | Mochikawa et al. |
| 8,089,785 B2 | 1/2012 | Rodriguez |
| 8,090,548 B2 | 1/2012 | Abdennadher et al. |
| 8,093,756 B2 | 1/2012 | Porter et al. |
| 8,093,757 B2 | 1/2012 | Wolfs |
| 8,097,818 B2 | 1/2012 | Gerull et al. |
| 8,098,055 B2 | 1/2012 | Avrutsky et al. |
| 8,102,074 B2 | 1/2012 | Hadar et al. |
| 8,102,144 B2 | 1/2012 | Capp et al. |
| 8,111,052 B2 | 2/2012 | Glovinsky |
| 8,116,103 B2 | 2/2012 | Zacharias et al. |
| 8,138,631 B2 | 3/2012 | Allen et al. |
| 8,138,914 B2 | 3/2012 | Wong et al. |
| 8,139,335 B2 | 3/2012 | Quardt et al. |
| 8,158,877 B2 | 4/2012 | Klein et al. |
| 8,169,252 B2 | 5/2012 | Fahrenbruch et al. |
| 8,179,147 B2 | 5/2012 | Dargatz et al. |
| 8,184,460 B2 | 5/2012 | O'Brien et al. |
| 8,204,709 B2 | 6/2012 | Presher, Jr. et al. |
| 8,212,408 B2 | 7/2012 | Fishman |
| 8,212,409 B2 | 7/2012 | Bettenwort et al. |
| 8,271,599 B2 | 9/2012 | Eizips et al. |
| 8,274,172 B2 | 9/2012 | Hadar et al. |
| 8,279,644 B2 | 10/2012 | Zhang et al. |
| 8,289,183 B1 | 10/2012 | Foss |
| 8,289,742 B2 | 10/2012 | Adest et al. |
| 8,294,451 B2 | 10/2012 | Hasenfus |
| 8,304,932 B2 | 11/2012 | Ledenev et al. |
| 8,310,101 B2 | 11/2012 | Amaratunga et al. |
| 8,310,102 B2 | 11/2012 | Raju |
| 8,314,375 B2 | 11/2012 | Arditi et al. |
| 8,324,921 B2 | 12/2012 | Adest et al. |
| 8,325,059 B2 | 12/2012 | Rozenboim |
| 8,369,113 B2 | 2/2013 | Rodriguez |
| 8,378,656 B2 | 2/2013 | de Rooij et al. |
| 8,395,366 B2 | 3/2013 | Uno |
| 8,405,248 B2 | 3/2013 | Mumtaz et al. |
| 8,405,349 B2 | 3/2013 | Kikinis et al. |
| 8,405,367 B2 | 3/2013 | Chisenga et al. |
| 8,415,552 B2 | 4/2013 | Hadar et al. |
| 8,415,937 B2 | 4/2013 | Hester |
| 8,427,009 B2 | 4/2013 | Shaver, II et al. |
| 8,436,592 B2 | 5/2013 | Saitoh |
| 8,461,809 B2 | 6/2013 | Rodriguez |
| 8,473,250 B2 | 6/2013 | Adest et al. |
| 8,509,032 B2 | 8/2013 | Rakib |
| 8,570,017 B2 | 10/2013 | Perichon et al. |
| 8,581,441 B2 | 11/2013 | Rotzoll et al. |
| 8,653,689 B2 | 2/2014 | Rozenboim |
| 8,669,675 B2 | 3/2014 | Capp et al. |
| 8,686,333 B2 | 4/2014 | Arditi et al. |
| 8,751,053 B2 | 6/2014 | Hadar et al. |
| 8,773,236 B2 | 7/2014 | Makhota et al. |
| 8,791,598 B2 | 7/2014 | Jain |
| 8,811,047 B2 | 8/2014 | Rodriguez |
| 8,816,535 B2 | 8/2014 | Adest et al. |
| 8,823,218 B2 | 9/2014 | Hadar et al. |
| 8,823,342 B2 | 9/2014 | Williams |
| 8,835,748 B2 | 9/2014 | Frolov et al. |
| 8,841,916 B2 | 9/2014 | Avrutsky |
| 8,853,886 B2 | 10/2014 | Avrutsky et al. |
| 8,854,193 B2 | 10/2014 | Makhota et al. |
| 8,860,241 B2 | 10/2014 | Hadar et al. |
| 8,860,246 B2 | 10/2014 | Hadar et al. |
| 8,922,061 B2 | 12/2014 | Arditi |
| 8,933,321 B2 | 1/2015 | Hadar et al. |
| 8,972,765 B1 | 3/2015 | Krolak et al. |
| 2001/0000957 A1 | 5/2001 | Birchfield et al. |
| 2001/0023703 A1 | 9/2001 | Kondo et al. |
| 2001/0032664 A1 | 10/2001 | Takehara et al. |
| 2001/0034982 A1 | 11/2001 | Nagao et al. |
| 2001/0035180 A1 | 11/2001 | Kimura et al. |
| 2001/0048605 A1 | 12/2001 | Kurokami et al. |
| 2001/0050102 A1 | 12/2001 | Matsumi et al. |
| 2001/0054881 A1 | 12/2001 | Watanabe |
| 2002/0014262 A1 | 2/2002 | Matsushita et al. |
| 2002/0034083 A1 | 3/2002 | Ayyanar et al. |
| 2002/0038667 A1 | 4/2002 | Kondo et al. |
| 2002/0041505 A1 | 4/2002 | Suzui et al. |
| 2002/0044473 A1 | 4/2002 | Toyomura et al. |
| 2002/0047309 A1 | 4/2002 | Droppo et al. |
| 2002/0047693 A1 | 4/2002 | Chang |
| 2002/0056089 A1 | 5/2002 | Houston |
| 2002/0063552 A1 | 5/2002 | Arakawa |
| 2002/0078991 A1 | 6/2002 | Nagao et al. |
| 2002/0080027 A1 | 6/2002 | Conley |
| 2002/0118559 A1 | 8/2002 | Kurokami et al. |
| 2002/0134567 A1* | 9/2002 | Rasmussen et al. ............ 174/50 |
| 2002/0148497 A1 | 10/2002 | Sasaoka et al. |
| 2002/0149950 A1 | 10/2002 | Takebayashi |
| 2002/0165458 A1 | 11/2002 | Carter et al. |
| 2002/0177401 A1 | 11/2002 | Judd et al. |
| 2002/0179140 A1 | 12/2002 | Toyomura |
| 2002/0180408 A1 | 12/2002 | McDaniel et al. |
| 2002/0190696 A1 | 12/2002 | Darshan |
| 2003/0038615 A1 | 2/2003 | Elbanhawy |
| 2003/0058593 A1 | 3/2003 | Bertele et al. |
| 2003/0058662 A1 | 3/2003 | Baudelot et al. |
| 2003/0066076 A1 | 4/2003 | Minahan |
| 2003/0066555 A1 | 4/2003 | Hui et al. |
| 2003/0075211 A1 | 4/2003 | Makita et al. |
| 2003/0080741 A1 | 5/2003 | LeRow et al. |
| 2003/0085621 A1 | 5/2003 | Potega |
| 2003/0090233 A1 | 5/2003 | Browe |
| 2003/0090246 A1 | 5/2003 | Shenai et al. |
| 2003/0094931 A1 | 5/2003 | Renyolds |
| 2003/0107352 A1 | 6/2003 | Downer et al. |
| 2003/0111103 A1 | 6/2003 | Bower et al. |
| 2003/0116154 A1 | 6/2003 | Butler et al. |

(56) References Cited

U.S. PATENT DOCUMENTS

| | | |
|---|---|---|
| 2003/0156439 A1 | 8/2003 | Ohmichi et al. |
| 2003/0164695 A1 | 9/2003 | Fasshauer et al. |
| 2003/0185026 A1 | 10/2003 | Matsuda et al. |
| 2003/0193821 A1 | 10/2003 | Krieger et al. |
| 2003/0201674 A1 | 10/2003 | Droppo et al. |
| 2003/0214274 A1 | 11/2003 | Lethellier |
| 2003/0223257 A1 | 12/2003 | Onoe |
| 2004/0004402 A1 | 1/2004 | Kippley |
| 2004/0041548 A1 | 3/2004 | Perry |
| 2004/0056642 A1 | 3/2004 | Nebrigic et al. |
| 2004/0056768 A1 | 3/2004 | Matsushita et al. |
| 2004/0061527 A1 | 4/2004 | Knee |
| 2004/0076028 A1 | 4/2004 | Achleitner et al. |
| 2004/0117676 A1 | 6/2004 | Kobayashi et al. |
| 2004/0118446 A1 | 6/2004 | Toyomura |
| 2004/0123894 A1 | 7/2004 | Erban |
| 2004/0124816 A1 | 7/2004 | DeLepaut |
| 2004/0125618 A1 | 7/2004 | De Rooij et al. |
| 2004/0140719 A1 | 7/2004 | Vulih et al. |
| 2004/0150410 A1 | 8/2004 | Schoepf et al. |
| 2004/0164718 A1 | 8/2004 | McDaniel et al. |
| 2004/0165408 A1 | 8/2004 | West et al. |
| 2004/0169499 A1 | 9/2004 | Huang et al. |
| 2004/0170038 A1 | 9/2004 | Ichinose et al. |
| 2004/0189432 A1 | 9/2004 | Yan et al. |
| 2004/0201279 A1 | 10/2004 | Templeton |
| 2004/0201933 A1 | 10/2004 | Blanc |
| 2004/0207366 A1 | 10/2004 | Sung |
| 2004/0211458 A1 | 10/2004 | Gui et al. |
| 2004/0223351 A1 | 11/2004 | Kurokami et al. |
| 2004/0230343 A1 | 11/2004 | Zalesski |
| 2004/0233685 A1 | 11/2004 | Matsuo et al. |
| 2004/0246226 A1 | 12/2004 | Moon |
| 2004/0258141 A1 | 12/2004 | Tustison et al. |
| 2004/0263183 A1 | 12/2004 | Naidu et al. |
| 2004/0264225 A1 | 12/2004 | Bhavaraju et al. |
| 2005/0002214 A1 | 1/2005 | Deng et al. |
| 2005/0005785 A1 | 1/2005 | Poss et al. |
| 2005/0006958 A1 | 1/2005 | Dubovsky |
| 2005/0017697 A1 | 1/2005 | Capel |
| 2005/0017701 A1 | 1/2005 | Hsu |
| 2005/0030772 A1 | 2/2005 | Phadke |
| 2005/0040800 A1 | 2/2005 | Sutardja |
| 2005/0057214 A1 | 3/2005 | Matan |
| 2005/0057215 A1 | 3/2005 | Matan |
| 2005/0068012 A1 | 3/2005 | Cutler |
| 2005/0068820 A1 | 3/2005 | Radosevich et al. |
| 2005/0099138 A1 | 5/2005 | Wilhelm |
| 2005/0103376 A1 | 5/2005 | Matsushita et al. |
| 2005/0105224 A1 | 5/2005 | Nishi |
| 2005/0105306 A1 | 5/2005 | Deng et al. |
| 2005/0110454 A1 | 5/2005 | Tsai et al. |
| 2005/0121067 A1 | 6/2005 | Toyomura et al. |
| 2005/0135031 A1 | 6/2005 | Colby et al. |
| 2005/0139258 A1 | 6/2005 | Liu et al. |
| 2005/0162018 A1 | 7/2005 | Realmuto et al. |
| 2005/0172995 A1* | 8/2005 | Rohrig et al. ............... 136/243 |
| 2005/0179420 A1 | 8/2005 | Satoh et al. |
| 2005/0194937 A1 | 9/2005 | Jacobs |
| 2005/0201397 A1 | 9/2005 | Petite |
| 2005/0213272 A1 | 9/2005 | Kobayashi |
| 2005/0225090 A1 | 10/2005 | Wobben |
| 2005/0226017 A1 | 10/2005 | Kotsopoulos et al. |
| 2005/0242795 A1 | 11/2005 | Al-Kuran et al. |
| 2005/0257827 A1 | 11/2005 | Gaudiana et al. |
| 2005/0269988 A1 | 12/2005 | Thrap |
| 2005/0275386 A1 | 12/2005 | Jepsen et al. |
| 2005/0275527 A1 | 12/2005 | Kates |
| 2005/0275979 A1 | 12/2005 | Xu |
| 2005/0281064 A1 | 12/2005 | Olsen et al. |
| 2006/0001406 A1 | 1/2006 | Matan |
| 2006/0017327 A1 | 1/2006 | Siri et al. |
| 2006/0034106 A1 | 2/2006 | Johnson |
| 2006/0038692 A1 | 2/2006 | Schnetker |
| 2006/0043792 A1 | 3/2006 | Hjort et al. |
| 2006/0043942 A1 | 3/2006 | Cohen |
| 2006/0053447 A1 | 3/2006 | Krzyzanowski et al. |
| 2006/0066349 A1 | 3/2006 | Murakami |
| 2006/0068239 A1 | 3/2006 | Norimatsu et al. |
| 2006/0103360 A9 | 5/2006 | Cutler |
| 2006/0108979 A1 | 5/2006 | Daniel et al. |
| 2006/0109009 A1 | 5/2006 | Banke et al. |
| 2006/0113843 A1 | 6/2006 | Beveridge |
| 2006/0113979 A1 | 6/2006 | Ishigaki et al. |
| 2006/0118162 A1 | 6/2006 | Saelzer et al. |
| 2006/0132102 A1 | 6/2006 | Harvey |
| 2006/0149396 A1 | 7/2006 | Templeton |
| 2006/0152085 A1 | 7/2006 | Flett et al. |
| 2006/0162772 A1 | 7/2006 | Presher et al. |
| 2006/0163946 A1 | 7/2006 | Henne et al. |
| 2006/0164065 A1 | 7/2006 | Hoouk et al. |
| 2006/0171182 A1 | 8/2006 | Siri et al. |
| 2006/0174939 A1 | 8/2006 | Matan |
| 2006/0176029 A1 | 8/2006 | McGinty et al. |
| 2006/0176031 A1 | 8/2006 | Forman et al. |
| 2006/0176036 A1 | 8/2006 | Flatness et al. |
| 2006/0176716 A1 | 8/2006 | Balakrishnan et al. |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0222916 A1 | 10/2006 | Norimatsu et al. |
| 2006/0227578 A1 | 10/2006 | Datta et al. |
| 2006/0231132 A1 | 10/2006 | Neussner |
| 2006/0232220 A1 | 10/2006 | Melis |
| 2006/0235717 A1 | 10/2006 | Sharma et al. |
| 2006/0237058 A1 | 10/2006 | McClintock et al. |
| 2006/0261751 A1 | 11/2006 | Okabe et al. |
| 2006/0266408 A1 | 11/2006 | Horne et al. |
| 2006/0267515 A1 | 11/2006 | Burke et al. |
| 2006/0290317 A1 | 12/2006 | McNulty et al. |
| 2007/0001653 A1 | 1/2007 | Xu |
| 2007/0013349 A1 | 1/2007 | Bassett |
| 2007/0019613 A1 | 1/2007 | Frezzolini |
| 2007/0024257 A1 | 2/2007 | Boldo |
| 2007/0027644 A1 | 2/2007 | Bettenwort et al. |
| 2007/0029636 A1 | 2/2007 | Kanemaru et al. |
| 2007/0030068 A1 | 2/2007 | Motonobu et al. |
| 2007/0035975 A1 | 2/2007 | Dickerson et al. |
| 2007/0040540 A1 | 2/2007 | Cutler |
| 2007/0044837 A1 | 3/2007 | Simburger et al. |
| 2007/0075689 A1 | 4/2007 | Kinder et al. |
| 2007/0075711 A1 | 4/2007 | Blanc et al. |
| 2007/0081364 A1 | 4/2007 | Andreycak |
| 2007/0085523 A1 | 4/2007 | Scoones et al. |
| 2007/0089778 A1 | 4/2007 | Horne et al. |
| 2007/0103108 A1 | 5/2007 | Capp et al. |
| 2007/0107767 A1 | 5/2007 | Hayden et al. |
| 2007/0115635 A1* | 5/2007 | Low et al. .................... 361/700 |
| 2007/0119718 A1 | 5/2007 | Gibson et al. |
| 2007/0121648 A1 | 5/2007 | Hahn |
| 2007/0133241 A1 | 6/2007 | Mumtaz et al. |
| 2007/0133421 A1 | 6/2007 | Young |
| 2007/0147075 A1 | 6/2007 | Bang |
| 2007/0158185 A1 | 7/2007 | Andelman et al. |
| 2007/0159866 A1 | 7/2007 | Siri |
| 2007/0164612 A1 | 7/2007 | Wendt et al. |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0209656 A1 | 9/2007 | Lee |
| 2007/0211888 A1 | 9/2007 | Corcoran et al. |
| 2007/0227574 A1 | 10/2007 | Cart |
| 2007/0235071 A1 | 10/2007 | Work et al. |
| 2007/0236187 A1 | 10/2007 | Wai et al. |
| 2007/0247135 A1 | 10/2007 | Koga |
| 2007/0247877 A1 | 10/2007 | Kwon et al. |
| 2007/0271006 A1 | 11/2007 | Golden et al. |
| 2007/0273339 A1 | 11/2007 | Haines |
| 2007/0273342 A1 | 11/2007 | Kataoka et al. |
| 2007/0273351 A1 | 11/2007 | Matan |
| 2007/0290636 A1 | 12/2007 | Beck et al. |
| 2007/0290656 A1 | 12/2007 | Lee Tai Keung |
| 2008/0021707 A1 | 1/2008 | Bou-Ghazale et al. |
| 2008/0024098 A1 | 1/2008 | Hojo |

(56) References Cited

U.S. PATENT DOCUMENTS

| | | |
|---|---|---|
| 2008/0036440 A1 | 2/2008 | Garmer |
| 2008/0055941 A1 | 3/2008 | Victor et al. |
| 2008/0080177 A1 | 4/2008 | Chang |
| 2008/0088184 A1 | 4/2008 | Tung et al. |
| 2008/0089277 A1 | 4/2008 | Alexander et al. |
| 2008/0097655 A1 | 4/2008 | Hadar et al. |
| 2008/0106250 A1 | 5/2008 | Prior et al. |
| 2008/0111529 A1 | 5/2008 | Shah et al. |
| 2008/0115823 A1 | 5/2008 | Kinsey |
| 2008/0121272 A1 | 5/2008 | Besser et al. |
| 2008/0122449 A1 | 5/2008 | Besser et al. |
| 2008/0122518 A1 | 5/2008 | Besser et al. |
| 2008/0136367 A1 | 6/2008 | Adest et al. |
| 2008/0142071 A1 | 6/2008 | Dorn et al. |
| 2008/0143188 A1 | 6/2008 | Adest et al. |
| 2008/0143462 A1 | 6/2008 | Belisle et al. |
| 2008/0144294 A1 | 6/2008 | Adest et al. |
| 2008/0147335 A1 | 6/2008 | Adest et al. |
| 2008/0149167 A1 | 6/2008 | Liu |
| 2008/0150366 A1 | 6/2008 | Adest et al. |
| 2008/0150484 A1 | 6/2008 | Kimball et al. |
| 2008/0164766 A1 | 7/2008 | Adest et al. |
| 2008/0179949 A1 | 7/2008 | Besser et al. |
| 2008/0186004 A1 | 8/2008 | Williams |
| 2008/0191560 A1 | 8/2008 | Besser et al. |
| 2008/0191675 A1 | 8/2008 | Besser et al. |
| 2008/0192519 A1 | 8/2008 | Iwata et al. |
| 2008/0198523 A1 | 8/2008 | Schmidt et al. |
| 2008/0205096 A1 | 8/2008 | Lai et al. |
| 2008/0218152 A1 | 9/2008 | Bo |
| 2008/0224652 A1 | 9/2008 | Zhu et al. |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0238372 A1 | 10/2008 | Cintra et al. |
| 2008/0246460 A1 | 10/2008 | Smith |
| 2008/0246463 A1 | 10/2008 | Sinton et al. |
| 2008/0252273 A1 | 10/2008 | Woo et al. |
| 2008/0264470 A1 | 10/2008 | Masuda et al. |
| 2008/0266919 A1 | 10/2008 | Mallwitz |
| 2008/0291707 A1 | 11/2008 | Fang |
| 2008/0294472 A1 | 11/2008 | Yamada |
| 2008/0297963 A1 | 12/2008 | Lee et al. |
| 2008/0303503 A1 | 12/2008 | Wolfs |
| 2008/0304296 A1 | 12/2008 | NadimpalliRaju et al. |
| 2008/0304298 A1 | 12/2008 | Toba et al. |
| 2009/0012917 A1 | 1/2009 | Thompson et al. |
| 2009/0014050 A1 | 1/2009 | Haaf |
| 2009/0014057 A1 | 1/2009 | Croft et al. |
| 2009/0015071 A1 | 1/2009 | Iwata et al. |
| 2009/0020151 A1 | 1/2009 | Fornage |
| 2009/0021877 A1 | 1/2009 | Fornage et al. |
| 2009/0039852 A1 | 2/2009 | Fishelov et al. |
| 2009/0066357 A1 | 3/2009 | Fornage |
| 2009/0066399 A1 | 3/2009 | Chen et al. |
| 2009/0069950 A1 | 3/2009 | Kurokami et al. |
| 2009/0073726 A1 | 3/2009 | Babcock |
| 2009/0080226 A1 | 3/2009 | Fornage |
| 2009/0084570 A1 | 4/2009 | Gherardini et al. |
| 2009/0097172 A1 | 4/2009 | Bremicker et al. |
| 2009/0101191 A1 | 4/2009 | Beck et al. |
| 2009/0102440 A1 | 4/2009 | Coles |
| 2009/0114263 A1 | 5/2009 | Powell et al. |
| 2009/0120485 A1 | 5/2009 | Kikinis |
| 2009/0121549 A1 | 5/2009 | Leonard |
| 2009/0133736 A1 | 5/2009 | Powell et al. |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0150005 A1 | 6/2009 | Hadar et al. |
| 2009/0179500 A1 | 7/2009 | Ragonese et al. |
| 2009/0179662 A1 | 7/2009 | Moulton et al. |
| 2009/0182532 A1 | 7/2009 | Stoeber et al. |
| 2009/0184746 A1 | 7/2009 | Fahrenbruch |
| 2009/0189456 A1 | 7/2009 | Skutt |
| 2009/0190275 A1 | 7/2009 | Gilmore et al. |
| 2009/0195081 A1 | 8/2009 | Quardt et al. |
| 2009/0206666 A1 | 8/2009 | Sella et al. |
| 2009/0207543 A1 | 8/2009 | Boniface et al. |
| 2009/0217965 A1 | 9/2009 | Dougal et al. |
| 2009/0224817 A1 | 9/2009 | Nakamura et al. |
| 2009/0234692 A1 | 9/2009 | Powell et al. |
| 2009/0237042 A1 | 9/2009 | Glovinski |
| 2009/0237043 A1 | 9/2009 | Glovinsky |
| 2009/0242011 A1 | 10/2009 | Proisy et al. |
| 2009/0243547 A1 | 10/2009 | Andelfinger |
| 2009/0273241 A1 | 11/2009 | Gazit et al. |
| 2009/0278496 A1 | 11/2009 | Nakao et al. |
| 2009/0282755 A1 | 11/2009 | Abbott et al. |
| 2009/0283129 A1 | 11/2009 | Foss |
| 2009/0283130 A1 | 11/2009 | Gilmore et al. |
| 2009/0284232 A1 | 11/2009 | Zhang et al. |
| 2009/0284998 A1 | 11/2009 | Zhang et al. |
| 2009/0295225 A1 | 12/2009 | Asplund et al. |
| 2009/0322494 A1 | 12/2009 | Lee |
| 2009/0325003 A1 | 12/2009 | Aberle et al. |
| 2010/0001587 A1 | 1/2010 | Casey et al. |
| 2010/0002349 A1 | 1/2010 | La Scala et al. |
| 2010/0013452 A1 | 1/2010 | Tang et al. |
| 2010/0020576 A1 | 1/2010 | Falk |
| 2010/0026097 A1 | 2/2010 | Avrutsky et al. |
| 2010/0026736 A1 | 2/2010 | Plut |
| 2010/0052735 A1 | 3/2010 | Burkland et al. |
| 2010/0057267 A1 | 3/2010 | Liu et al. |
| 2010/0060000 A1 | 3/2010 | Scholte-Wassink |
| 2010/0071742 A1 | 3/2010 | de Rooij et al. |
| 2010/0085670 A1 | 4/2010 | Palaniswami et al. |
| 2010/0115093 A1 | 5/2010 | Rice |
| 2010/0124027 A1 | 5/2010 | Handelsman et al. |
| 2010/0124087 A1 | 5/2010 | Falk |
| 2010/0127570 A1 | 5/2010 | Hadar et al. |
| 2010/0127571 A1 | 5/2010 | Hadar et al. |
| 2010/0132757 A1 | 6/2010 | He et al. |
| 2010/0132758 A1 | 6/2010 | Gilmore |
| 2010/0133911 A1 | 6/2010 | Williams et al. |
| 2010/0139734 A1 | 6/2010 | Hadar et al. |
| 2010/0139743 A1 | 6/2010 | Hadar et al. |
| 2010/0141041 A1 | 6/2010 | Bose et al. |
| 2010/0154858 A1 | 6/2010 | Jain |
| 2010/0176773 A1 | 7/2010 | Capel |
| 2010/0181957 A1 | 7/2010 | Goeltner |
| 2010/0191383 A1 | 7/2010 | Gaul |
| 2010/0195361 A1 | 8/2010 | Stem |
| 2010/0206378 A1 | 8/2010 | Erickson, Jr. et al. |
| 2010/0207764 A1 | 8/2010 | Muhlberger et al. |
| 2010/0207770 A1 | 8/2010 | Thiemann |
| 2010/0208501 A1 | 8/2010 | Matan et al. |
| 2010/0214808 A1 | 8/2010 | Rodriguez |
| 2010/0229915 A1 | 9/2010 | Ledenev et al. |
| 2010/0241375 A1 | 9/2010 | Kumar et al. |
| 2010/0244575 A1 | 9/2010 | Coccia et al. |
| 2010/0246223 A1 | 9/2010 | Xuan |
| 2010/0264736 A1 | 10/2010 | Mumtaz et al. |
| 2010/0269430 A1 | 10/2010 | Haddock |
| 2010/0277001 A1 | 11/2010 | Wagoner |
| 2010/0282290 A1 | 11/2010 | Schwarze et al. |
| 2010/0286836 A1 | 11/2010 | Shaver, II et al. |
| 2010/0288327 A1 | 11/2010 | Lisi et al. |
| 2010/0294528 A1 | 11/2010 | Sella et al. |
| 2010/0294903 A1 | 11/2010 | Shmukler et al. |
| 2010/0295680 A1 | 11/2010 | Dumps |
| 2010/0297860 A1 | 11/2010 | Shmukler et al. |
| 2010/0301991 A1 | 12/2010 | Sella et al. |
| 2010/0308662 A1 | 12/2010 | Schatz et al. |
| 2010/0309692 A1 | 12/2010 | Chisenga et al. |
| 2010/0321148 A1 | 12/2010 | Gevorkian |
| 2010/0326809 A1 | 12/2010 | Lang et al. |
| 2010/0327657 A1 | 12/2010 | Kuran |
| 2010/0327659 A1 | 12/2010 | Lisi et al. |
| 2010/0332047 A1 | 12/2010 | Arditi et al. |
| 2011/0006743 A1 | 1/2011 | Fabbro |

(56) References Cited

U.S. PATENT DOCUMENTS

| | | |
|---|---|---|
| 2011/0012430 A1 | 1/2011 | Cheng et al. |
| 2011/0025130 A1 | 2/2011 | Hadar et al. |
| 2011/0031816 A1 | 2/2011 | Buthker et al. |
| 2011/0031946 A1 | 2/2011 | Egan et al. |
| 2011/0037600 A1 | 2/2011 | Takehara et al. |
| 2011/0043172 A1 | 2/2011 | Dearn |
| 2011/0049990 A1 | 3/2011 | Amaratunga et al. |
| 2011/0050190 A1 | 3/2011 | Avrutsky |
| 2011/0056533 A1 | 3/2011 | Kuan |
| 2011/0061713 A1 | 3/2011 | Powell et al. |
| 2011/0062784 A1 | 3/2011 | Wolfs |
| 2011/0068633 A1 | 3/2011 | Quardt et al. |
| 2011/0079263 A1 | 4/2011 | Avrutsky |
| 2011/0080147 A1 | 4/2011 | Schoenlinner et al. |
| 2011/0083733 A1 | 4/2011 | Marroquin et al. |
| 2011/0084553 A1 | 4/2011 | Adest et al. |
| 2011/0108087 A1 | 5/2011 | Croft et al. |
| 2011/0114154 A1 | 5/2011 | Lichy et al. |
| 2011/0115295 A1 | 5/2011 | Moon et al. |
| 2011/0121652 A1 | 5/2011 | Sella et al. |
| 2011/0125431 A1 | 5/2011 | Adest et al. |
| 2011/0132424 A1 | 6/2011 | Rakib |
| 2011/0133552 A1 | 6/2011 | Binder et al. |
| 2011/0139213 A1 | 6/2011 | Lee |
| 2011/0140536 A1 | 6/2011 | Adest et al. |
| 2011/0161722 A1 | 6/2011 | Makhota et al. |
| 2011/0172842 A1 | 7/2011 | Makhota et al. |
| 2011/0173276 A1 | 7/2011 | Eizips et al. |
| 2011/0181251 A1 | 7/2011 | Porter et al. |
| 2011/0181340 A1 | 7/2011 | Gazit |
| 2011/0210610 A1 | 9/2011 | Mitsuoka et al. |
| 2011/0210611 A1 | 9/2011 | Ledenev et al. |
| 2011/0210612 A1 | 9/2011 | Leutwein |
| 2011/0218687 A1 | 9/2011 | Hadar et al. |
| 2011/0227411 A1 | 9/2011 | Arditi |
| 2011/0232714 A1 | 9/2011 | Bhavaraju et al. |
| 2011/0245989 A1 | 10/2011 | Makhota et al. |
| 2011/0246338 A1 | 10/2011 | Eich |
| 2011/0254372 A1 | 10/2011 | Haines et al. |
| 2011/0260866 A1 | 10/2011 | Avrutsky et al. |
| 2011/0267859 A1 | 11/2011 | Chapman |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0273302 A1 | 11/2011 | Fornage et al. |
| 2011/0285205 A1 | 11/2011 | Ledenev et al. |
| 2011/0290317 A1 | 12/2011 | Naumovitz et al. |
| 2011/0291486 A1 | 12/2011 | Adest et al. |
| 2011/0301772 A1 | 12/2011 | Zuercher et al. |
| 2011/0304204 A1 | 12/2011 | Avrutsky et al. |
| 2011/0304213 A1 | 12/2011 | Avrutsky et al. |
| 2011/0304215 A1 | 12/2011 | Avrutsky et al. |
| 2011/0316346 A1 | 12/2011 | Porter et al. |
| 2012/0007613 A1 | 1/2012 | Gazit |
| 2012/0019966 A1 | 1/2012 | DeBoer |
| 2012/0026769 A1 | 2/2012 | Schroeder et al. |
| 2012/0032515 A1 | 2/2012 | Ledenev et al. |
| 2012/0033392 A1 | 2/2012 | Golubovic et al. |
| 2012/0033463 A1 | 2/2012 | Rodriguez |
| 2012/0039099 A1 | 2/2012 | Rodriguez |
| 2012/0043818 A1 | 2/2012 | Stratakos et al. |
| 2012/0044014 A1 | 2/2012 | Stratakos et al. |
| 2012/0048325 A1 | 3/2012 | Matsuo et al. |
| 2012/0049627 A1 | 3/2012 | Matsuo et al. |
| 2012/0049801 A1 | 3/2012 | Chang |
| 2012/0056483 A1 | 3/2012 | Capp et al. |
| 2012/0063177 A1 | 3/2012 | Garrity |
| 2012/0081009 A1 | 4/2012 | Shteynberg et al. |
| 2012/0081933 A1 | 4/2012 | Garrity |
| 2012/0081934 A1 | 4/2012 | Garrity et al. |
| 2012/0081937 A1 | 4/2012 | Phadke |
| 2012/0087159 A1 | 4/2012 | Chapman et al. |
| 2012/0091810 A1 | 4/2012 | Aiello et al. |
| 2012/0098344 A1 | 4/2012 | Bergveld et al. |
| 2012/0104863 A1 | 5/2012 | Yuan |
| 2012/0113554 A1 | 5/2012 | Paoletti et al. |
| 2012/0119584 A1 | 5/2012 | Hadar et al. |
| 2012/0139343 A1 | 6/2012 | Adest et al. |
| 2012/0146420 A1 | 6/2012 | Wolfs |
| 2012/0146583 A1 | 6/2012 | Gaul et al. |
| 2012/0161526 A1 | 6/2012 | Huang et al. |
| 2012/0161528 A1 | 6/2012 | Mumtaz et al. |
| 2012/0169124 A1 | 7/2012 | Nakashima et al. |
| 2012/0174961 A1 | 7/2012 | Larson et al. |
| 2012/0187769 A1 | 7/2012 | Spannhake et al. |
| 2012/0199172 A1 | 8/2012 | Avrutsky |
| 2012/0215367 A1 | 8/2012 | Eizips et al. |
| 2012/0217973 A1 | 8/2012 | Avrutsky |
| 2012/0240490 A1 | 9/2012 | Gangemi |
| 2012/0253533 A1 | 10/2012 | Eizips et al. |
| 2012/0253541 A1 | 10/2012 | Arditi et al. |
| 2012/0255591 A1 | 10/2012 | Arditi et al. |
| 2012/0274145 A1 | 11/2012 | Taddeo |
| 2012/0274264 A1 | 11/2012 | Mun et al. |
| 2012/0280571 A1 | 11/2012 | Hargis |
| 2013/0026839 A1 | 1/2013 | Grana |
| 2013/0026840 A1 | 1/2013 | Arditi et al. |
| 2013/0026842 A1 | 1/2013 | Arditi et al. |
| 2013/0026843 A1 | 1/2013 | Arditi et al. |
| 2013/0038124 A1 | 2/2013 | Newdoll et al. |
| 2013/0063119 A1 | 3/2013 | Lubomirsky |
| 2013/0094262 A1 | 4/2013 | Avrutsky |
| 2013/0134790 A1 | 5/2013 | Amaratunga et al. |
| 2013/0181533 A1 | 7/2013 | Capp et al. |
| 2013/0192657 A1 | 8/2013 | Hadar et al. |
| 2013/0222144 A1 | 8/2013 | Hadar et al. |
| 2013/0229834 A1 | 9/2013 | Garrity et al. |
| 2013/0229842 A1 | 9/2013 | Garrity |
| 2013/0234518 A1 | 9/2013 | Mumtaz et al. |
| 2013/0235637 A1 | 9/2013 | Rodriguez |
| 2013/0279210 A1 | 10/2013 | Chisenga et al. |
| 2013/0294126 A1 | 11/2013 | Garrity et al. |
| 2013/0307556 A1 | 11/2013 | Ledenev et al. |
| 2013/0332093 A1 | 12/2013 | Adest et al. |
| 2014/0191583 A1 | 7/2014 | Chisenga et al. |
| 2014/0246915 A1 | 9/2014 | Mumtaz |
| 2014/0246927 A1 | 9/2014 | Mumtaz |
| 2014/0252859 A1 | 9/2014 | Chisenga et al. |
| 2014/0265579 A1 | 9/2014 | Mumtaz |
| 2014/0265638 A1 | 9/2014 | Orr et al. |
| 2014/0306543 A1 | 10/2014 | Garrity et al. |
| 2014/0327313 A1 | 11/2014 | Arditi et al. |
| 2015/0022006 A1 | 1/2015 | Garrity et al. |
| 2015/0028683 A1 | 1/2015 | Hadar et al. |
| 2015/0028692 A1 | 1/2015 | Makhota et al. |
| 2015/0188415 A1 | 7/2015 | Abido et al. |

FOREIGN PATENT DOCUMENTS

| | | |
|---|---|---|
| CA | 1183574 A1 | 3/1985 |
| CA | 2063243 A1 | 12/1991 |
| CA | 2301657 A1 | 3/1999 |
| CA | 2394761 A1 | 6/2001 |
| CA | 2658087 A1 | 6/2001 |
| CA | 2443450 A1 | 3/2005 |
| CA | 2572452 A1 | 1/2006 |
| CA | 2613038 A1 | 1/2007 |
| CA | 2704605 A1 | 5/2009 |
| CN | 2305016 Y | 1/1999 |
| CN | 1236213 A | 11/1999 |
| CN | 1262552 A | 8/2000 |
| CN | 1064487 C | 4/2001 |
| CN | 1309451 A | 8/2001 |
| CN | 1362655 A | 8/2002 |
| CN | 2514538 Y | 10/2002 |
| CN | 1122905 C | 10/2003 |
| CN | 1185782 C | 1/2005 |
| CN | 2672938 Y | 1/2005 |
| CN | 1245795 C | 3/2006 |
| CN | 1787717 A | 6/2006 |
| CN | 1841254 A | 10/2006 |
| CN | 1841823 A | 10/2006 |
| CN | 1892239 A | 1/2007 |
| CN | 1902809 A | 1/2007 |

(56) References Cited

FOREIGN PATENT DOCUMENTS

| | | |
|---|---|---|
| CN | 1929276 A | 3/2007 |
| CN | 1930925 A | 3/2007 |
| CN | 1933315 A | 3/2007 |
| CN | 2891438 Y | 4/2007 |
| CN | 101030752 A | 9/2007 |
| CN | 101050770 A | 10/2007 |
| CN | 101107712 A | 1/2008 |
| CN | 100371843 C | 2/2008 |
| CN | 101128974 A | 2/2008 |
| CN | 101136129 A | 3/2008 |
| CN | 101180781 A | 5/2008 |
| CN | 101257221 A | 9/2008 |
| CN | 100426175 C | 10/2008 |
| CN | 201203438 Y | 3/2009 |
| CN | 101488271 A | 7/2009 |
| CN | 101523230 A | 9/2009 |
| CN | 101672252 A | 3/2010 |
| CN | 101779291 A | 7/2010 |
| CN | 101847939 A | 9/2010 |
| CN | 201601477 U | 10/2010 |
| CN | 201623478 U | 11/2010 |
| CN | 101939660 A | 1/2011 |
| CN | 101951011 A | 1/2011 |
| CN | 101953060 A | 1/2011 |
| CN | 101976952 A | 2/2011 |
| CN | 102089883 A | 6/2011 |
| CN | 102148584 A | 8/2011 |
| CN | 201926948 U | 8/2011 |
| CN | 102273039 A | 12/2011 |
| CN | 202103601 U | 1/2012 |
| CN | 102474112 A | 5/2012 |
| DE | 3236071 A1 | 1/1984 |
| DE | 3525630 A1 | 1/1987 |
| DE | 3729000 A1 | 3/1989 |
| DE | 4019710 A1 | 1/1992 |
| DE | 4032569 A1 | 4/1992 |
| DE | 4041672 A1 | 6/1992 |
| DE | 4232356 A1 | 3/1994 |
| DE | 4325436 A1 | 2/1995 |
| DE | 4328511 A1 | 3/1995 |
| DE | 19515786 A1 | 11/1995 |
| DE | 19502762 A1 | 8/1996 |
| DE | 19609189 A1 | 9/1997 |
| DE | 19618882 A1 | 11/1997 |
| DE | 19701897 A1 | 7/1998 |
| DE | 19718046 A1 | 11/1998 |
| DE | 19732218 C1 | 3/1999 |
| DE | 19737286 A1 | 3/1999 |
| DE | 19838230 A1 | 2/2000 |
| DE | 19846818 A1 | 4/2000 |
| DE | 19904561 C1 | 8/2000 |
| DE | 19928809 A1 | 1/2001 |
| DE | 019937410 A1 | 2/2001 |
| DE | 19961705 A1 | 7/2001 |
| DE | 10064039 A1 | 12/2001 |
| DE | 10060108 A1 | 6/2002 |
| DE | 10103431 A1 | 8/2002 |
| DE | 10136147 A1 | 2/2003 |
| DE | 10219956 A1 | 4/2003 |
| DE | 10222621 A1 | 11/2003 |
| DE | 202004001246 U1 | 4/2004 |
| DE | 10345302 A1 | 4/2005 |
| DE | 102004043478 A1 | 4/2005 |
| DE | 102004053942 A1 | 5/2006 |
| DE | 69734495 T2 | 7/2006 |
| DE | 69735169 T2 | 8/2006 |
| DE | 102005018173 A1 | 10/2006 |
| DE | 102005036153 A1 | 12/2006 |
| DE | 102005030907 A1 | 1/2007 |
| DE | 102005032864 A1 | 1/2007 |
| DE | 102006023563 A1 | 11/2007 |
| DE | 102006026073 A1 | 12/2007 |
| DE | 202007002077 U1 | 4/2008 |
| DE | 102007051134 A1 | 3/2009 |
| DE | 202008012345 U1 | 3/2009 |
| DE | 102007050031 B3 | 4/2009 |
| DE | 102008057874 A1 | 5/2010 |
| EP | 0027405 A1 | 4/1981 |
| EP | 169673 A1 | 1/1986 |
| EP | 0178757 A2 | 4/1986 |
| EP | 0206253 A1 | 12/1986 |
| EP | 0231211 A1 | 8/1987 |
| EP | 0293219 A2 | 11/1988 |
| EP | 0340006 A2 | 11/1989 |
| EP | 419093 A2 | 3/1991 |
| EP | 420295 A1 | 4/1991 |
| EP | 0521467 A2 | 1/1993 |
| EP | 0576271 A2 | 12/1993 |
| EP | 0577334 A2 | 1/1994 |
| EP | 604777 A1 | 7/1994 |
| EP | 0628901 A2 | 12/1994 |
| EP | 0642199 A1 | 3/1995 |
| EP | 0670915 A1 | 9/1995 |
| EP | 756178 A2 | 1/1997 |
| EP | 0756372 A1 | 1/1997 |
| EP | 0780750 A2 | 6/1997 |
| EP | 0809293 A1 | 11/1997 |
| EP | 827254 A2 | 3/1998 |
| EP | 0895146 A1 | 2/1999 |
| EP | 0906660 A1 | 4/1999 |
| EP | 0947905 A2 | 10/1999 |
| EP | 1012886 A1 | 6/2000 |
| EP | 1024575 A2 | 8/2000 |
| EP | 1034465 A1 | 9/2000 |
| EP | 1035640 A1 | 9/2000 |
| EP | 1039361 A1 | 9/2000 |
| EP | 1039620 A2 | 9/2000 |
| EP | 1039621 A2 | 9/2000 |
| EP | 1047179 A1 | 10/2000 |
| EP | 1130770 A2 | 9/2001 |
| EP | 1143594 A2 | 10/2001 |
| EP | 1187291 A2 | 3/2002 |
| EP | 1235339 A2 | 8/2002 |
| EP | 1239573 A1 | 9/2002 |
| EP | 1239576 A2 | 9/2002 |
| EP | 1254505 A2 | 11/2002 |
| EP | 1271742 A2 | 1/2003 |
| EP | 1330009 A2 | 7/2003 |
| EP | 1339153 A2 | 8/2003 |
| EP | 1369983 A1 | 12/2003 |
| EP | 1376706 A2 | 1/2004 |
| EP | 1388774 A1 | 2/2004 |
| EP | 1400988 A2 | 3/2004 |
| EP | 1407534 A2 | 4/2004 |
| EP | 1418482 A1 | 5/2004 |
| EP | 1429393 A2 | 6/2004 |
| EP | 1442473 A2 | 8/2004 |
| EP | 1447561 A1 | 8/2004 |
| EP | 1457857 A2 | 9/2004 |
| EP | 1463188 A2 | 9/2004 |
| EP | 1475882 A2 | 11/2004 |
| EP | 1503490 A1 | 2/2005 |
| EP | 1521345 A1 | 4/2005 |
| EP | 1526633 A2 | 4/2005 |
| EP | 1531542 A2 | 5/2005 |
| EP | 1531545 A2 | 5/2005 |
| EP | 1532727 A2 | 5/2005 |
| EP | 1552563 A2 | 7/2005 |
| EP | 1562281 A1 | 8/2005 |
| EP | 1580862 A1 | 9/2005 |
| EP | 1603212 A2 | 12/2005 |
| EP | 1610571 A2 | 12/2005 |
| EP | 1623495 A1 | 2/2006 |
| EP | 1657557 A1 | 5/2006 |
| EP | 1657797 A1 | 5/2006 |
| EP | 1691246 A2 | 8/2006 |
| EP | 1706937 A1 | 10/2006 |
| EP | 1708070 A1 | 10/2006 |
| EP | 1716272 A1 | 11/2006 |
| EP | 1728413 A1 | 12/2006 |
| EP | 1750193 A1 | 2/2007 |
| EP | 1766490 A1 | 3/2007 |
| EP | 1782146 A2 | 5/2007 |
| EP | 1785800 A1 | 5/2007 |

(56) References Cited

FOREIGN PATENT DOCUMENTS

| | | |
|---|---|---|
| EP | 1842121 A2 | 10/2007 |
| EP | 1887675 A2 | 2/2008 |
| EP | 1901419 A2 | 3/2008 |
| EP | 1902349 A2 | 3/2008 |
| EP | 1911101 A1 | 4/2008 |
| EP | 2048679 A1 | 4/2009 |
| EP | 2061088 A2 | 5/2009 |
| EP | 2092625 A2 | 8/2009 |
| EP | 2092631 A2 | 8/2009 |
| EP | 2135348 A2 | 12/2009 |
| EP | 2144133 A1 | 1/2010 |
| EP | 2206159 A2 | 7/2010 |
| EP | 2232690 A1 | 9/2010 |
| EP | 2234237 A1 | 9/2010 |
| EP | 2315328 A2 | 4/2011 |
| EP | 2374190 A1 | 10/2011 |
| EP | 2393178 A2 | 12/2011 |
| EP | 2495766 A1 | 9/2012 |
| EP | 2533299 A1 | 12/2012 |
| EP | 2549635 A1 | 1/2013 |
| EP | 2561596 A2 | 2/2013 |
| EP | 2621045 A2 | 7/2013 |
| EP | 2666222 A1 | 11/2013 |
| EP | 2722979 A1 | 4/2014 |
| EP | 2779251 A1 | 9/2014 |
| ES | 2249147 A1 | 3/2006 |
| ES | 2249149 A1 | 3/2006 |
| FR | 2796216 A1 | 1/2001 |
| FR | 2819653 A1 | 7/2002 |
| GB | 1211885 A | 11/1970 |
| GB | 1261838 A | 1/1972 |
| GB | 1571681 A | 7/1980 |
| GB | 1597508 A | 9/1981 |
| GB | 2128017 A | 4/1984 |
| GB | 2327208 A | 1/1999 |
| GB | 2339465 A | 1/2000 |
| GB | 2376801 A | 12/2002 |
| GB | 2399463 A | 9/2004 |
| GB | 2399465 A | 9/2004 |
| GB | 2415841 A | 1/2006 |
| GB | 2419968 A | 5/2006 |
| GB | 2421847 A | 7/2006 |
| GB | 2476508 A | 6/2011 |
| GB | 2480015 A | 11/2011 |
| GB | 2480015 B | 11/2011 |
| GB | 2482653 A | 2/2012 |
| GB | 2483317 A | 3/2012 |
| GB | 2485527 A | 5/2012 |
| GB | 2486408 A | 6/2012 |
| GB | 2487368 A | 7/2012 |
| GB | 2497275 A | 6/2013 |
| GB | 2498365 A | 7/2013 |
| GB | 2498790 A | 7/2013 |
| GB | 2498791 A | 7/2013 |
| GB | 2499991 A | 9/2013 |
| JP | 61065320 A | 4/1986 |
| JP | H01311874 A | 12/1989 |
| JP | H04219982 A | 8/1992 |
| JP | H04364378 A | 12/1992 |
| JP | 8009557 A | 1/1996 |
| JP | H0897460 A | 4/1996 |
| JP | H08116628 A | 5/1996 |
| JP | H08185235 A | 7/1996 |
| JP | H08227324 A | 9/1996 |
| JP | H08316517 A | 11/1996 |
| JP | H08317664 A | 11/1996 |
| JP | H094692 A | 1/1997 |
| JP | H09148611 A | 6/1997 |
| JP | H09275644 A | 10/1997 |
| JP | 2676789 B2 | 11/1997 |
| JP | H1017445 A | 1/1998 |
| JP | H1075580 A | 3/1998 |
| JP | H10201086A A | 7/1998 |
| JP | H10308523 A | 11/1998 |
| JP | 11041832 A | 2/1999 |
| JP | H1146457 A | 2/1999 |
| JP | 11103538 A | 4/1999 |
| JP | 2892183 B2 | 5/1999 |
| JP | 11206038 A | 7/1999 |
| JP | H11266545 A | 9/1999 |
| JP | 11289891 A | 10/1999 |
| JP | 11318042 A | 11/1999 |
| JP | 2000020150 A | 1/2000 |
| JP | 3015512 B2 | 3/2000 |
| JP | 2000160789 A | 6/2000 |
| JP | 2000166097 A | 6/2000 |
| JP | 2000174307 A | 6/2000 |
| JP | 2000232791 A | 8/2000 |
| JP | 2000232793 A | 8/2000 |
| JP | 2000316282 A | 11/2000 |
| JP | 2000324852 A | 11/2000 |
| JP | 2000339044 A | 12/2000 |
| JP | 2000341974 A | 12/2000 |
| JP | 2000347753 A | 12/2000 |
| JP | 2000358330 A | 12/2000 |
| JP | 2001060120 A | 3/2001 |
| JP | 2001075662 A | 3/2001 |
| JP | 2001178145 A | 6/2001 |
| JP | 2001189476 A | 7/2001 |
| JP | 2001224142 A | 8/2001 |
| JP | 2001250964 A | 9/2001 |
| JP | 2002073184 A | 3/2002 |
| JP | 2002238246 A | 8/2002 |
| JP | 2002270876 A | 9/2002 |
| JP | 2002300735 A | 10/2002 |
| JP | 2002339591 A | 11/2002 |
| JP | 2002354677 A | 12/2002 |
| JP | 2003102134 A | 4/2003 |
| JP | 2003124492 A | 4/2003 |
| JP | 2003134661 A | 5/2003 |
| JP | 2003134667 A | 5/2003 |
| JP | 2003282916 A | 10/2003 |
| JP | 2003289674 A | 10/2003 |
| JP | 2004055603 A | 2/2004 |
| JP | 2004111754 A | 4/2004 |
| JP | 2004194500 A | 7/2004 |
| JP | 2004260944 A | 9/2004 |
| JP | 2004312994 A | 11/2004 |
| JP | 2004334704 A | 11/2004 |
| JP | 3656531 B2 | 6/2005 |
| JP | 2005192314 A | 7/2005 |
| JP | 2005251039 A | 9/2005 |
| JP | 2006041440 A | 2/2006 |
| JP | 2006278755 A | 10/2006 |
| JP | 2007058845 A | 3/2007 |
| JP | 4174227H B2 | 10/2008 |
| JP | 2010-146047 A | 7/2010 |
| JP | 2010245532 A | 10/2010 |
| JP | 2011-249790 A | 12/2011 |
| JP | 2012511299 A | 5/2012 |
| KR | 20010044490 A | 6/2001 |
| KR | 20040086088 A | 10/2004 |
| KR | 100468127 B1 | 1/2005 |
| KR | 200402282 Y1 | 11/2005 |
| KR | 100725755 B1 | 5/2007 |
| KR | 100912892 B1 | 8/2009 |
| NL | 1011483 C2 | 9/2000 |
| TW | 497326 B | 8/2002 |
| TW | 200913291 A | 3/2009 |
| WO | 8202134 A1 | 6/1982 |
| WO | 8403402 A1 | 8/1984 |
| WO | 8804801 A1 | 6/1988 |
| WO | 9207418 A1 | 4/1992 |
| WO | 9313587 A1 | 7/1993 |
| WO | 95/25374 A1 | 9/1995 |
| WO | 9607130 A1 | 3/1996 |
| WO | 9613093 A1 | 5/1996 |
| WO | 9823021 A2 | 5/1998 |
| WO | 9928801 A1 | 6/1999 |
| WO | 00/00839 A1 | 1/2000 |
| WO | 00/21178 A1 | 4/2000 |
| WO | 0075947 A1 | 12/2000 |
| WO | 0077522 A1 | 12/2000 |
| WO | 0147095 A2 | 6/2001 |

(56) References Cited

FOREIGN PATENT DOCUMENTS

| | | |
|---|---|---|
| WO | 0231517 | 4/2002 |
| WO | 02056126 A1 | 7/2002 |
| WO | 0278164 A1 | 10/2002 |
| WO | 02078164 A1 | 10/2002 |
| WO | 02093655 A1 | 11/2002 |
| WO | 03012569 | 2/2003 |
| WO | 03012569 A1 | 2/2003 |
| WO | 03050938 A2 | 6/2003 |
| WO | 03071655 A1 | 8/2003 |
| WO | 03084041 A1 | 10/2003 |
| WO | 03098703 | 11/2003 |
| WO | 04001942 A1 | 12/2003 |
| WO | 2004006342 A1 | 1/2004 |
| WO | 2004008619 A2 | 1/2004 |
| WO | 2004023278 A2 | 3/2004 |
| WO | 2004053993 A1 | 6/2004 |
| WO | 2004090993 A2 | 10/2004 |
| WO | 2004098261 A2 | 11/2004 |
| WO | 2004100344 A2 | 11/2004 |
| WO | 2004100348 A1 | 11/2004 |
| WO | 2004107543 A2 | 12/2004 |
| WO | 2005015584 A2 | 2/2005 |
| WO | 2005027300 A1 | 3/2005 |
| WO | 2005053189 A1 | 6/2005 |
| WO | 2005069096 A1 | 7/2005 |
| WO | 2005076444 A1 | 8/2005 |
| WO | 2005076445 A1 | 8/2005 |
| WO | 2005089030 A1 | 9/2005 |
| WO | 2005112551 A2 | 12/2005 |
| WO | 2005119278 A1 | 12/2005 |
| WO | 2005119609 A2 | 12/2005 |
| WO | 2005124498 A1 | 12/2005 |
| WO | 2006002380 A2 | 1/2006 |
| WO | 2006005125 A1 | 1/2006 |
| WO | 2006007198 A1 | 1/2006 |
| WO | 2006011071 A2 | 2/2006 |
| WO | 2006011359 A1 | 2/2006 |
| WO | 2006013600 A2 | 2/2006 |
| WO | 2006048688 A1 | 5/2006 |
| WO | 2006048689 A2 | 5/2006 |
| WO | 2006/074561 A1 | 7/2006 |
| WO | 2006071436 A2 | 7/2006 |
| WO | 2006078685 A2 | 7/2006 |
| WO | 2006079503 A2 | 8/2006 |
| WO | 2006089778 A2 | 8/2006 |
| WO | 2006110613 A2 | 10/2006 |
| WO | 2006130520 A2 | 12/2006 |
| WO | 2007006564 A2 | 1/2007 |
| WO | 2007007360 A2 | 1/2007 |
| WO | 2007010326 A1 | 1/2007 |
| WO | 2007048421 A2 | 5/2007 |
| WO | 2007072517 A1 | 6/2007 |
| WO | 2007073951 A1 | 7/2007 |
| WO | 2007080429 A2 | 7/2007 |
| WO | 2007084196 A2 | 7/2007 |
| WO | 2007090476 A2 | 8/2007 |
| WO | 2007113358 A1 | 10/2007 |
| WO | 2007124518 A1 | 11/2007 |
| WO | 2008008528 A2 | 1/2008 |
| WO | 2008026207 A2 | 3/2008 |
| WO | 2008/046370 A1 | 4/2008 |
| WO | 2008077473 A2 | 7/2008 |
| WO | 2008097591 A2 | 8/2008 |
| WO | 2008119034 A1 | 10/2008 |
| WO | 2008121266 A2 | 10/2008 |
| WO | 2008125915 A2 | 10/2008 |
| WO | 2008132551 A2 | 11/2008 |
| WO | 2008132553 A2 | 11/2008 |
| WO | 2008142480 A2 | 11/2008 |
| WO | 2009006879 A2 | 1/2009 |
| WO | 2009007782 A2 | 1/2009 |
| WO | 2009011780 A2 | 1/2009 |
| WO | 2009020917 A2 | 2/2009 |
| WO | 2009046533 A1 | 4/2009 |
| WO | 2009051221 A1 | 4/2009 |
| WO | 2009051222 A1 | 4/2009 |
| WO | 2009051853 A1 | 4/2009 |
| WO | 2009056957 A2 | 5/2009 |
| WO | 2009059028 A2 | 5/2009 |
| WO | 2009064683 A2 | 5/2009 |
| WO | 2009/072075 A2 | 6/2009 |
| WO | 2009/073867 A1 | 6/2009 |
| WO | 2009072077 A1 | 6/2009 |
| WO | 2009073995 A1 | 6/2009 |
| WO | 2009114341 A2 | 9/2009 |
| WO | 2009118682 A2 | 10/2009 |
| WO | 2009118683 A2 | 10/2009 |
| WO | 2009073868 A1 | 11/2009 |
| WO | 2009136358 A1 | 11/2009 |
| WO | 2009155392 A1 | 12/2009 |
| WO | 2010/002960 A1 | 1/2010 |
| WO | 2010/003941 A2 | 1/2010 |
| WO | 2010014116 A1 | 2/2010 |
| WO | 2010020385 A2 | 2/2010 |
| WO | 2010037393 A1 | 4/2010 |
| WO | 2010062662 A2 | 6/2010 |
| WO | 2010065043 A1 | 6/2010 |
| WO | 2010065388 A1 | 6/2010 |
| WO | 20101071855 A2 | 6/2010 |
| WO | 2010072717 A1 | 7/2010 |
| WO | 2010078303 A2 | 7/2010 |
| WO | 2010091025 A2 | 8/2010 |
| WO | 2010094012 A1 | 8/2010 |
| WO | 2010/132369 A1 | 11/2010 |
| WO | 2010134057 A1 | 11/2010 |
| WO | 2011005339 A1 | 1/2011 |
| WO | 2011011711 A2 | 1/2011 |
| WO | 2011014275 A1 | 2/2011 |
| WO | 2011017721 A1 | 2/2011 |
| WO | 2011023732 A2 | 3/2011 |
| WO | 2011028456 A2 | 3/2011 |
| WO | 2011028457 A2 | 3/2011 |
| WO | 2011059067 A1 | 5/2011 |
| WO | 2011074025 A1 | 6/2011 |
| WO | 2011076707 A2 | 6/2011 |
| WO | 2011085259 A2 | 7/2011 |
| WO | 2011089607 A1 | 7/2011 |
| WO | 2011119587 A2 | 9/2011 |
| WO | 2011133843 A2 | 10/2011 |
| WO | 2011133928 A2 | 10/2011 |
| WO | 2011151672 A1 | 12/2011 |
| WO | 2013015921 A1 | 1/2013 |
| WO | 9823021 A | 7/2013 |
| WO | 2013130563 A1 | 9/2013 |

OTHER PUBLICATIONS

International Search Report and Written Opinion for PCT/IB2007/004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.
Chen, et al., "A New Low-Stress Buck-Boost Converter for Universal-Input PFC Applications", IEEE Applied Power Electronics Conference, Feb. 2001, Colorado Power Electronics Center Publications.
Chen, et al., "Buck-Boost PWM Converters Having Two Independently Controlled Switches", IEEE Power Electronics Specialists Conference, Jun. 2001, Colorado Power Electronics Center Publications.
Esram, et al., "Comparison of Photovoltaic Array Maximum Power Point Tracking Techniques", IEEE Transactions on Energy Conversion, vol. 22, No. 2, Jun. 2007, pp. 439-449.
Walker, et al., "Photovoltaic DC-DC Module Integrated Converter for Novel Cascaded and Bypass Grid Connection Topologies-Design and Optimisation", 37th IEEE Power Electronics Specialists Conference, Jun. 18-22, 2006, Jeju, Korea.
Geoffrey R. Walker Affidavit re: U.S. Appl. No. 11/950,307, submitted in an IDS for U.S. Appl. No. 11/950,271 on Mar. 9, 2010.
Geoffrey R. Walker Affidavit re: U.S. Appl. No. 11/950,271, submitted in an IDS for U.S. Appl. No. 11/950,271 on Mar. 9, 2010.

(56) References Cited

OTHER PUBLICATIONS

International Search Report for PCT/IB2007/004610 dated Feb. 23, 2009.
International Search Report for PCT/IB2007/004584 dated Jan. 28, 2009.
International Search Report for PCT/IB2007/004586 dated Mar. 5, 2009.
International Search Report for PCT/IB2007/004643 dated Jan. 30, 2009.
International Search Report for PCT/US2008/085736 dated Jan. 28, 2009.
International Search Report for PCT/US2008/085754 dated Feb. 9, 2009.
International Search Report for PCT/US2008/085755 dated Feb. 3, 2009.
Kajihara, et al., "Model of Photovoltaic Cell Circuits Under Partial Shading", 2005 IEEE, pp. 866-870.
Knaupp, et al., "Operation of a 10 KW PV Façade with 100 W AC Photovoltaic Modules", 1996 IEEE, 25th PVSC, May 13-17, 1996, pp. 1235-1238, Washington, DC.
Alonso, et al., "Cascaded H-Bridge Multilevel Converter for Grid Connected Photovoltaic Generators with Independent Maximum Power Point Tracking of Each Solar Array", 2003 IEEE 34th, Annual Power Electronics Specialists Conference, Acapulco, Mexico, Jun. 15-19, 2003, pp. 731-735, vol. 2.
Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.
Chen, et al., "Predictive Digital Current Programmed Control", IEEE Transactions on Power Electronics, vol. 18, Issue 1, Jan. 2003.
Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.
Alonso, "A New Distributed Converter Interface for PV Panels", 20th European Photovoltaic Solar Energy Conference, Jun. 6-10, 2005, Barcelona, Spain, pp. 2288-2291.
Alonso, "Experimental Results of Intelligent PV Module for Grid-Connected PV Systems", 21st European Photovoltaic Solar Energy Conference, Sep. 4-8, 2006, Dresden, Germany, pp. 2297-2300.
Enslin, "Integrated Photovoltaic Maximum Power Point Tracking Converter", IEEE Transactions on Industrial Electronics, vol. 44, No. 6, Dec. 1997, pp. 769-773.
Lindgren, "Topology for Decentralised Solar Energy Inverters with a Low Voltage AC-Bus", Chalmers University of Technology, Department of Electrical Power Engineering, EPE '99—Lausanne.
Nikraz, "Digital Control of a Voltage Source Inverter in a Photovoltaic Applications", 2004 35th Annual IEEE Power Electronics Specialists Conference, Aachen, Germany, 2004, pp. 3266-3271.
Orduz, "Evaluation Test Results of a New Distributed MPPT Converter", 22nd European Photovoltaic Solar Energy Conference, Sep. 3-7, 2007, Milan, Italy.
Palma, "A Modular Fuel Cell, Modular DC-DC Converter Concept for High Performance and Enhanced Reliability", IEEE 2007, pp. 2633-2638.
Quaschning, "Cost Effectiveness of Shadow Tolerant Photovoltaic Systems", Berlin University of Technology, Institute of Electrical Energy Technology, Renewable Energy Section. EuroSun '96, pp. 819-824.
Roman, "Intelligent PV Module for Grid-Connected PV Systems", IEEE Transactions on Industrial Electronics, vol. 52, No. 4, Aug. 2006, pp. 1066-1073.
Roman, "Power Line Communications in Modular PV Systems", 20th European Photovoltaic Solar Energy Conference, Jun. 6-10, 2005, Barcelona, Spain, pp. 2249-2252.
Uriarte, "Energy Integrated Management System for PV Applications", 20th European Photovoltaic Solar Energy Conference, Jun. 6-10, 2005, Barcelona, Spain, pp. 2292-2295.

Walker, "Cascaded DC-DC Converter Connection of Photovoltaic Modules", IEEE Transactions on Power Electronics, vol. 19, No. 4, Jul. 2004, pp. 1130-1139.
Matsui, et al., "A New Maximum Photovoltaic Power Tracking Control Scheme Based on Power Equilibrium at DC Link", IEEE, 1999, pp. 804-809.
Hou, et al., Application of Adaptive Algorithm of Solar Cell Battery Charger, Apr. 2004.
Stamenic, et al., "Maximum Power Point Tracking for Building Integrated Photovoltaic Ventilation Systems", 2000.
International Preliminary Report on Patentability for PCT/IB2008/055092 dated Jun. 8, 2010.
International Search Report for PCT/IB2008/055092 dated Sep. 8, 2009.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18 (3), Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.
Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.
Sandia Report SAND96-2797 I UC-1290 Unlimited Release, Printed Dec. 1996, "Photovoltaic Power Systems and The National Electrical Code: Suggested Practices", by John Wiles, Southwest Technology Development Institute New Mexico State University Las Cruces, NM.
United Kingdom Intellectual Property Office, Combined Search and Examination Report Under Sections 17 and 18(3), GB1020862.7, dated Jun. 16, 2011.
GB Combined Search and Examination Report—GB1203763.6—Mailing date: Jun. 25, 2012.
Mohammad Reza Amini et al., "Quasi Resonant DC Link Inverter with a Simple Auxiliary Circuit", Journal of Power Electronics, vol. 11, No. 1, Jan. 2011.
Khairy Fathy et al., "A Novel Quasi-Resonant Snubber-Assisted ZCS-PWM DC-DC Converter with High Frequency Link", Journal of Power Electronics, vol. 7, No. 2, Apr. 2007.
Cheng K.W.E., "New Generation of Switched Capacitor Converters", Department of Electrical Engineering, The Hong Kong Polytechnic University, Hung Hom, Hong Kong, Power Electronics Conference, 1998, PESC 98.
Per Karlsson, "Quasi Resonant DC Link Converters—Analysis and Design for a Battery Charger Application", Universitetstryckeriet, Lund University, 1999, ISBN 91-88934-14-4.
Hsiao Sung-Hsin et al., "ZCS Switched-Capacitor Bidirectional Converters with Secondary Output Power Amplifier for Biomedical Applications", Power Electronics Conference (IPEC) Jun. 21, 2010.
Yuang-Shung Lee et al.,"A Novel QR ZCS Switched-Capacitor Bidirectional Converter", IEEE, 2007.
Antti Tolvanen et al., "Seminar on Solar Simulation Standards and Measurement Principles", May 9, 2006 Hawaii.
J.A. Eikelboom and M.J. Jansen, "Characterisation of PV Modules of New Generations—Results of tests and simulations", Jun. 2000.
Yeong-Chau Kuo et al., "Novel Maximum-Power-Point-Tracking Controller for Photovoltaic Energy Conversion System", IEEE Transactions on Industrial Electronics, vol. 48, No. 3, Jun. 2001.

(56) References Cited

OTHER PUBLICATIONS

C. Liu et al., "Advanced Algorithm for MPPT Control of Photovoltaic Systems", Canadian Solar Buildings Conference, Montreal, Aug. 20-24, 2004.
Chihchiang Hua and Chihming Shen, "Study of Maximum Power Tracking Techniques and Control of DC/DC Converters for Photovoltaic Power System", IEEE 1998.
Tore Skjellnes et al., "Load sharing for parallel inverters without communication", Nordic Workshop in Power and Industrial Electronics, Aug. 12-14, 2002.
Giorgio Spiazzi at el., "A New Family of Zero-Current-Switching Variable Frequency dc-dc Converters", IEEE 2000.
Nayar, C.V., M. Ashari and W.W.L Keerthiphala, "A Gridinteractive Photovoltaic Uninterruptible Power Supply System Using Battery Storage and a Back up Diesel Generator", IEEE Transactions on Energy Conversion, vol. 15, No. 3, Sep. 2000, pp. 348?353.
Ph. Strauss et al., "AC coupled PV Hybrid systems and Micro Grids-state of the art and future trends", 3rd World Conference on Photovoltaic Energy Conversion, Osaka, Japan May 11-18, 2003.
Nayar, C.V., abstract, Power Engineering Society Summer Meeting, 2000. IEEE, 2000, pp. 1280-1282 vol. 2.
D. C. Martins et al., "Analysis of Utility Interactive Photovoltaic Generation System using a Single Power Static Inverter", Asian J. Energy Environ., vol. 5, Issue 2, (2004), pp. 115-137.
Rafael C. Beltrame et al., "Decentralized Multi String PV System With Integrated ZVT Cell", Congresso Brasileiro de Automática / 12 a Sep. 16, 2010, Bonito-MS.
Sergio Busquets-Monge et al., "Multilevel Diode-clamped Converter for Photovoltaic Generators With Independent Voltage Control of Each Solar Array", IEEE Transactions on Industrial Electronics, vol. 55, No. 7, Jul. 2008.
Soeren Baekhoej Kjaer et al., "A Review of Single-Phase Grid-Connected Inverters for Photovoltaic Modules", IEEE Transactions on Industry Applications, vol. 41, No. 5, Sep./Oct. 2005.
Office Action—JP 2011-539491—Mailing date: Mar. 26, 2013.
Supplementary European Search Report—EP08857456—Mailing Date Dec. 6, 2013.
Extended European Search Report—EP14151651.8—Mailing date: Feb. 25, 2014.
Iyomori H et al: "Three-phase bridge power block module type auxiliary resonant AC link snubber-assisted soft switching inverter for distributed AC power supply", INTELEC 2003. 25th. International Telecommunications Energy Conference. Yokohama, Japan, Oct. 19-23, 2003; Tokyo, IEICE, JP, Oct. 23, 2003, pp. 650-656, XP031895550, ISBN: 978-4-88552-196-6.
Yuqing Tang: "High Power Inverter EMI characterization and Improvement Using Auxiliary Resonant Snubber Inverter", Dec. 17, 1998, XP055055241, Blacksburg, Virginia Retrieved from the Internet: URL:http:jjscholar.lib.vt.edu/theses/available/etd-012299-165108/unrestricted/THESIS.PDF, [retrieved on Mar. 5, 2013].
Yoshida M et al: "Actual efficiency and electromagnetic noises evaluations of a single inductor resonant AC link snubber-assisted three-phase soft-switching inverter", INTELEC 2003. 25th. International Telecommunications Energy Conference. Yokohama, Japan, Oct. 19-23, 2003; Tokyo, IEICE, JP, Oct. 23, 2003, pp. 721-726, XP031895560, ISBN: 978-4-88552-196-6.
Third party observation—EP07874025.5—Mailing date: Aug. 6, 2011.
Extended European Search Report—EP 13152967.9—Mailing date: Aug. 28, 2014.
Extended European Search Report—EP 14159696—Mailing Date: Jun. 20, 2014.
Gow Ja A et al: "A Modular DC-DC Converter and Maximum Power Tracking Controller Formedium to Large Scale Photovoltaic Generating Plant" 8th European Conference on Power Electronics and Applications. Lausaane, CH, Sep. 7-9, 1999, EPE. European Conference on Power Electronics and Applications, Brussls: EPE Association, BE, vol. Conf. 8, Sep. 7, 1999, pp. 1-8, XP000883026.
Chihchiang Hua et al: "Comparative Study of Peak Power Tracking Techniques for Solar Storage System" Applied Power Electronics Conference and Exposition, 1998. APEC '98. Conference Proceedings 1998, Thirteenth Annual Anaheim, CA USA Feb. 15-19, 1998, New York, NY, USA, IEEE, US, Feb. 15, 1998, pp. 679-685, XP010263666.
Matsuo H et al: "Novel Solar Cell Power Supply System Using the Miltiple-input DC-DC Converter" 20th International telecommunications Energy Conference. Intelec '98 San Francisco, CA, Oct. 4-8, 1998, Intelec International Telecommunications Energy Conference, New York, NY: IEEE, US, Oct. 4, 1998, pp. 797-802, XP000896384.
Chihchiang Hua et al: "DSP-based controller application in battery storage of photovoltaic system" Industrial Electronics, Control, and Instrumentation, 1996, Proceedings of the 1996 IEEE IECON 22nd International Conference on Taipei, Taiwan Aug. 5-10, 1996, New York, NY, USA, IEEE, US, Aug. 5, 1996, pp. 1705-1710, XP010203239.
Hua C et al: "Implementation of a DSP-Controlled Photovoltaic System with Peak Power Tracking" IEEE Transactions on industrial Electronics, IEEE, Inc. New York, US, vol. 45, No. 1, Feb. 1, 1998, pp. 99-107, XP000735209.
I. Weiss et al.: "A new PV system technology—the development of a magnetic power transmission from the PV module to the power bus" 16th European Photovoltaic Solar Energy Conference, vol. III, May 1-5, 2000, pp. 2096-2099, XP002193468 Glasgow,UK.
Basso, Tim, "IEEE Standard for Interconnecting Distributed Resources With the Electric Power System," IEEE PES Meeting, Jun. 9, 2004.
Boostbuck.com, "The Four Boostbuck Topologies," located at http://www.boostbuck.com/TheFourTopologies.html, 2003.
Gautam, Nalin K. et al., "An Efficient Algorithm to Simulate the Electrical Performance of Solar Photovoltaic Arrays," Energy, vol. 27, No. 4, pp. 347-361, 2002.
Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.
Wiles, John, "Photovoltaic Power Systems and the National Electrical Code: Suggested Practices," Sandia National Laboratories, document No. SAND2001-0674, Mar. 2001.
Hewes, J. "Relays," located at http://web.archive.org/web/20030816010159/www.kpsec.freeuk.com/components/relay.htm, Aug. 16, 2003.
Advanced Energy Group, "The Basics of Solar Power Systems," located at http://web.archive.org/web/20010331044156/http://www.solar4power.com/solar-power-basics.html, Mar. 31, 2001.
International Patent Application No. PCT/AU2005/001017, International Search Report and Written Opinion, Aug. 18, 2005.
Baek, Ju-Won et al., "High Boost Converter using Voltage Multiplier," 2005 IEEE Conference, IECON 05, pp. 567-572, Nov. 2005.
Wikimedia Foundation, Inc., "Electric Power Transmission," located at http://web.archive.org/web/20041210095723/en.wikipedia.org/wiki/Electric-power-transmission, Nov. 17, 2004.
Jacobsen, K.S., "Synchronized Discrete Multi-Tone (SDMT) Modulation for Cable Modems: Making the Most of the Scarce Reverse Channel Bandwidth," Conference Proceedings of Wescon/97, pp. 374-380, Nov. 4, 1997.
Loyola, L. et al., "A Multi-Channel Infrastructure based on DCF Access Mechanism for Wireless LAN Mesh Networks Compliant with IEEE 802.11," 2005 Asia-Pacific Conference on Communications, pp. 497-501, Oct. 5, 2005.
Storfer, Lior, "Enhancing Cable Modem TCP Performance," Texas Instruments Inc. white paper, Jul. 2003.
International Preliminary Report on Patentability Issued in corresponding international application No. PCT/US04/16868, filed May 27, 2004.
International Application No. PCT/US13/27965, International Preliminary Examination Report, Sep. 2, 2014.
International Patent Application PCT/US13/027965, International Search Report and Written Opinion, Jun. 2, 2013.
International Application No. PCT/US12/44045, International Preliminary Examination Report, Jan. 28, 2014.

(56) References Cited

OTHER PUBLICATIONS

International Patent Application No. PCT/US2012/044045, International Search Report and Written Opinion, Jan. 2, 2013.
International Patent Application No. PCT/US2009/047734, International Search Report and Written Opinion, May 4, 2010.
Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.
International Patent Application No. PCT/US2010/029929, International Search Report and Written Opinion, Oct. 27, 2010.
International Patent Application No. PCT/US2011/020591, International Search Report and Written Opinion, Aug. 8, 2011.
International Patent Application No. PCT/US2011/033544, International Search Report and Written Opinion, Nov. 24, 2011.
J. Keller and B. Kroposki, titled, "Understanding Fault Characteristics of Inverter-Based Distributed Energy Resources", in a Technical Report NREL/TP-550-46698, published Jan. 2010, pp. 1 through 48.
International Patent Application No. PCT/US2008/081827, International Search Report and Written Opinion, Jun. 24, 2009.
International Patent Application No. PCT/US2010/046274 International Search Report and Written Opinion, Apr. 22, 2011.
International Patent Application No. PCT/US2011/033658, International Search Report and Written Opinion, Jan. 13, 2012.
International Patent Application No. PCT/US2011/029392, International Search Report and Written Opinion, Oct. 24, 2011.
European Patent Application No. 09829487.9, Extended Search Report, Apr. 21, 2011.
International Patent Application No. PCT/US2009/062536, International Search Report and Written Opinion, Jun. 17, 2010.
International Patent Application No. PCT/US2010/022915, International Search Report and Written Opinion, Aug. 23, 2010.
International Patent Application No. PCT/US2010/046272, International Search Report and Written Opinion, Mar. 31, 2011.
International Patent Application No. PCT/US2010/029936, International Search Report and Written Opinion, Nov. 12, 2010.
International Patent Application No. PCT/US08/75127, International Search Report and Written Opinion, Apr. 28, 2009.
International Patent Application No. PCT/US09/35890, International Search Report and Written Opinion, Oct. 1, 2009.
European Patent Appilcation No. 08845104.2, Extended Search Report, Jul. 31, 2014.
European Patent Appilcation No. 11772811.3, Extended Search Report, Dec. 15, 2014.
International Patent Application No. PCT/US2008/082935, International Search Report and Written Opinion, Jun. 25, 2009.
Rodriguez, C., and G. A. J. Amaratunga. "Dynamic stability of grid-connected photovoltaic systems." Power Engineering Society General Meeting, 2004. IEEE, pp. 2194-2200
Kikuchi, Naoto, et al. "Single phase amplitude modulation inverter for utility interaction photovoltaic system." Industrial Electronics Society, 1999. IECON'99 Proceedings. The 25th Annual Conference of the IEEE. vol. 1. IEEE, 1999.
Nonaka, Sakutaro, et al. "Interconnection system with single phase IGBT PWM CSI between photovoltaic arrays and the utility line." Industry Applications Society Annual Meeting, 1990., Conference Record of the 1990 IEEE.
Calais, Martina, et al. "Inverters for single-phase grid connected photovoltaic systems—an overview." Power Electronics Specialists Conference, 2002. pesc 02. 2002 IEEE 33rd Annual. vol. 4. IEEE, 2002.
Marra, Enes Goncalves, and Jose Antenor Pomilio. "Self-excited induction generator controlled by a VS-PWM bidirectional converter for rural applications." Industry Applications, IEEE Transactions on 35.4 (1999): 877-883.
Xiaofeng Sun, Weiyang Wu, Xin Li, Qinglin Zhao: A Research on Photovoltaic Energy Controlling System with Maximum Power Point Tracking:; Proceedings of the Power Conversion Conference—Osaka 2002 (Cat. No. 02TH8579) IEEE—Piscataway, NJ, USA, ISBN 0-7803-7156-9, vol. 2, p. 822-826, XP010590259: the whole document.
International Search Report for corresponding PCT/GB2005/050198 completed Jun. 28, 2006 by C. Wirner of the EPO.
Brunello, Gustavo, et al., "Shunt Capacitor Bank Fundamentals and Protection," 2003 Conference for Protective Relay Engineers, Apr. 8-10, 2003, pp. 1-17, Texas A&M University, College Station, TX, USA.
Cordonnier, Charles-Edouard, et al., "Application Considerations for Sensefet Power Devices," PCI Proceedings, May 11, 1987, pp. 47-65.
Kotsopoulos, Andrew, et al., "Predictive DC Voltage Control of Single-Phase PV Inverters with Small DC Link Capacitance," IEEE International Symposium, Month Unknown, 2003, pp. 793-797.
Meinhardt, Mike, et al., "Multi-String-Converter with Reduced Specific Costs and Enhanced Functionality," Solar Energy, May 21, 2001, pp. 217-227, vol. 69, Elsevier Science Ltd.
Kimball, et al.: "Analysis and Design of Switched Capacitor Converters"; Grainger Center for Electric Machinery and Electromechanics, University of Illinois at Urbana-Champaign, 1406 W. Green St, Urbana, IL 61801 USA, © 2005 IEEE;1473-1477.
Martins, et al.: "Interconnection of a Photovoltaic Panels Array to a Single-Phase Utility Line From a Static Conversion System"; Power Electronics Specialists Conference, 2000. PESC 00. 2000 IEEE 31st Annual; Jun. 18, 2000-Jun. 23, 2000; ISSN: 0275-9306; pp. 1207-1211, vol. 3.
International Search Report for corresponding PCT/GB2005/050197, completed Dec. 20, 2005 by K-R Zettler of the EPO.
Kjaer, Soeren Baekhoej, et al., "Design Optimization of a Single Phase Inverter for Photovoltaic Applications," IEEE 34th Annual Power Electronics Specialist Conference, Jun. 15-19, 2003, pp. 1183-1190, vol. 3, IEEE.
Shimizu, Toshihisa, et al., "A Flyback-type Single Phase Utility Interactive Inverter with Low-frequency Ripple Current Reduction on the DC Input for an AC Photovoltaic Module System," IEEE 33rd Annual Power Electronics Specialist Conference, Month Unknown, 2002, pp. 1483-1488, vol. 3, IEEE.
Written Opinion of PCT/GB2005/050197, Feb. 14, 2006 (mailing date), Enecsys Limited.
Yatsuki, Satoshi, et al., "A Novel AC Photovoltaic Module System based on the Impedance-Admittance Conversion Theory," IEEE 32nd Annual Power Electronics Specialists Conference, Month Unknown, 2001, pp. 2191-2196, vol. 4, IEEE.
International Search Report for corresponding PCT/GB2004/001965, completed Aug. 16, 2004 by A. Roider.
Naik et al., A Novel Grid Interface for Photovoltaic, Wind-Electric, and Fuel-Cell Systems With a Controllable Power Factor or Operation, IEEE, 1995, pp. 995-998.
Petkanchin, Processes following changes of phase angle between current and voltage in electric circuits, Aug. 1999, Power Engineering Review, IEEE vol. 19, Issue 8, pp. 59-60.
Mumtaz, Asim, et al., "Grid Connected PV Inverter Using a Commercially Available Power IC," PV in Europe Conference, Oct. 2002, 3 pages, Rome, Italy.
Koutroulis, Eftichios, et al., "Development of a Microcontroller-Based, Photovoltaic Maximum Power Point Tracking Control System," IEEE Transactions on Power Electronics, Jan. 2001, pp. 46-54, vol. 16, No. 1, IEEE.
European Search Report—EP App. 14159457.2—mailed Jun. 12, 2015.
European Search Report and Written Opinion—EP Appl. 12150819.6—dated Jul. 06, 2015.
Alonso, O. et al. "Cascaded H-Bridge Multilevel Converter for Grid Connected Photovoltaic Generators With Independent Maximum Power Point Tracking of Each Solar Array." IEEE 34th Annual Power Electronics Specialists Conference. vol. 2, Jun. 15, 2003.
Chinese Office Action—CN Appl. 201280006369.2—dated Aug. 4, 2015.
Chinese Office Action—CN Appl. 201210253614.1—dated Aug. 18, 2015.

(56) References Cited

OTHER PUBLICATIONS

European Office Action—EP Appl. 09725443.7—dated Aug. 18, 2015.
QT Technical Application Papers, "ABB Circuit-Breakers for Direct current Applications", ABB SACE S.p.A., An ABB Group Company, L.V. Breakers, Via Baioni, 35, 24123 Bergamo-Italy, Tel.: +39 035.395.111—Telefax: +39 035.395.306-433, Sep. 2007.
Woyte, et al., "Mains Monitoring and Protection in a European Context", 17th European Photovoltaic Solar Energy Conference and Exhibition, Munich, Germany, Oct. 22-26, 2001, Achim, Woyte, et al., pp. 1-4.
"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.
Fairchild Semiconductor, Application Note 9016, IGBT Basics 1, by K.S. Oh Feb. 1, 2001.
"Disconnect Switches in Photoovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.
Walker, "A DC Circuit Breaker for an Electric Vehicle Battery Pack", Australasian Universities Power Engineering Conference and IEAust Electric Energy Conference, Sep. 26-29, 1999.
Combined Search and Examination Report for GB1018872.0 dated Apr. 15, 2011, 2 pages.
International Search Report and Opinion of International Patent Application PCT/2009/051221, dated Oct. 19, 2009.
International Search Report and Opinion of International Patent Application PCT/2009/051222, dated Oct. 7, 2009.
Communication in EP07874025.5 dated Aug. 17, 2011.
IPRP for PCT/IB2008/055095 dated Jun. 8, 2010, with Written Opinion.
ISR for PCT/IB2008/055095 dated Apr. 30, 2009.
ISR for PCT/IL07/01064 dated Mar. 25, 2008.
IPRP for PCT/IB2007/004584 dated Jun. 10, 2009, with Written Opinion.
IPRP for PCT/IB2007/004591 dated Jul. 13, 2010, with Written Opinion.
IPRP for PCT/IB2007/004643 dated Jun. 10, 2009, with Written Opinion.
Written Opinion for PCT/IB2008/055092 submitted with IPRP dated Jun. 8, 2010.
IPRP for PCT/US2008/085754 dated Jun. 8, 2010, with Written Opinion dated Jan. 21, 2009.
IPRP for PCT/US2008/085755 dated Jun. 8, 2010, with Written Opinion dated Jan. 20, 2009.
IPRP for PCT/IB2009/051221 dated Sep. 28, 2010, with Written Opinion.
IPRP for PCT/IB2009/051222 dated Sep. 28, 2010, with Written Opinion.
IPRP for PCT/IB2009/051831 dated Nov. 9, 2010, with Written Opinion.
IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
UK Intellectual Property Office, Application No. GB1109618.7, Patents Act 1977, Examination Report Under Section 18(3), Sep. 16, 2011.
UK Intellectual Property Office, Patents Act 1977: Patents Rules Notification of Grant: Patent Serial No. GB2480015, Nov. 29, 2011.
Walker, et al. "PV String Per-Module Maximum Power Point Enabling Converters", School of Information Technology and Electrical Engineering The University of Queensland, Sep. 28, 2003.
Walker, "Cascaded DC-DC Converter Connection of Photovoltaic Modules", 33rd Annual IEEE Power Electronics Specialists Conference. PESC 2002. Conference Proceedings. Cairns, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0-7803-7262-7, figure 1.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.
Duarte, "A Family of ZVX-PWM Active-Clamping DC-to-DC Converters: Synthesis, Analysis and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.
IPRP for PCT/IL2007/001064 dated Mar. 17, 2009, with Written Opinion dated Mar. 25, 2008.
IPRP for PCT/IB2007/004586 dated Jun. 10, 2009, with Written Opinion.
Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.
IPRP PCT/IB2007/004610—date of issue Jun. 10, 2009.
Extended European Search Report—EP12176089.6—Mailing date: Nov. 8, 2012.
Gwon-Jong Yu et al: "Maximum power point tracking with temperature compensation of photovoltaic for air conditioning system with fuzzy controller", May 13, 1996-May 17, 1996, pp. 1429-1432, XP010208423.
Extended European Search Report—EP12177067.1—Mailing Date: Dec. 7, 2012.
GB Combined Search and Examination Report—GB1200423.0—Mailing date: Apr. 30, 2012.
GB Combined Search and Examination Report—GB1201499.9—Mailing date: May 28, 2012.
GB Combined Search and Examination Report—GB1201506.1—Mailing date: May 22, 2012.
"Study of Energy Storage Capacitor Reduction for Single Phase PWM Rectifier", Ruxi Wang et al., Virginia Polytechnic Institute and State University, Feb. 2009.
"Multilevel Inverters: A Survey of Topologies, Controls, and Applications", José Rodriguez et al., IEEE Transactions on Industrial Electronics, vol. 49, No. 4, August 2002.
Extended European Search Report—EP 08878650A—Mailing date: Mar. 28, 2013.
Satcon Solstice—Satcon Solstice 100 kW System Solution Sheet—2010.
John Xue, "PV Module Series String Balancing Converters", University of Queensland—School of Information Technology & Electrical Engineering, Nov. 6, 2002.
Robert W. Erickson, "Future of Power Electronics for Photovoltaics", IEEE Applied Power Electronics Conference, Feb. 2009.
Chinese Office Action—CN Appl. 201310035223.7—dated Dec. 29, 2015.
Chinese Office Action—CN Application 201210334311.2—dated Jan. 20, 2016.
Chinese Office Action—CN Appl. 201110349734.7—dated Oct. 13, 2015.
European Office Action—EP Appl. 12176089.6—dated Dec. 16, 2015.

(56) References Cited

OTHER PUBLICATIONS

Chinese Office Action—CN Appl. 201210007491.3—dated Nov. 23, 2015.
European Search Report—EP Appl. 13800859.4—mailed Feb. 15, 2016.
Chinese Office Action—CN App. 201310035221.8—mailed Mar. 1, 2016.
International Search Report and Written Opinion mailed Feb. 6, 2009. In counteprart PCT/US2008/008451, 13 pages.
D. Ton and W. Bower; Summary Report of the DOE High-Tech Inverter Workshop; Jan. 2005.
CN Office Action—CN Appl. 201310004123.8—dated May 5, 2016.
European Notice of Opposition—EP Patent 2374190—dated Jul. 19, 2016.
"Es werde Dunkelheit. Freischaltung von Solarmodulen im Brandfall" —"Let there be Darkness: Quality control of Solar Modules in Case of Fire"; PHOTON, May 2005, 75-77, ISSN 1430-5348, English translation provided.
Chinese Office Action—CN Appl. 201380029450.7—dated Jul. 28, 2016.

\* cited by examiner

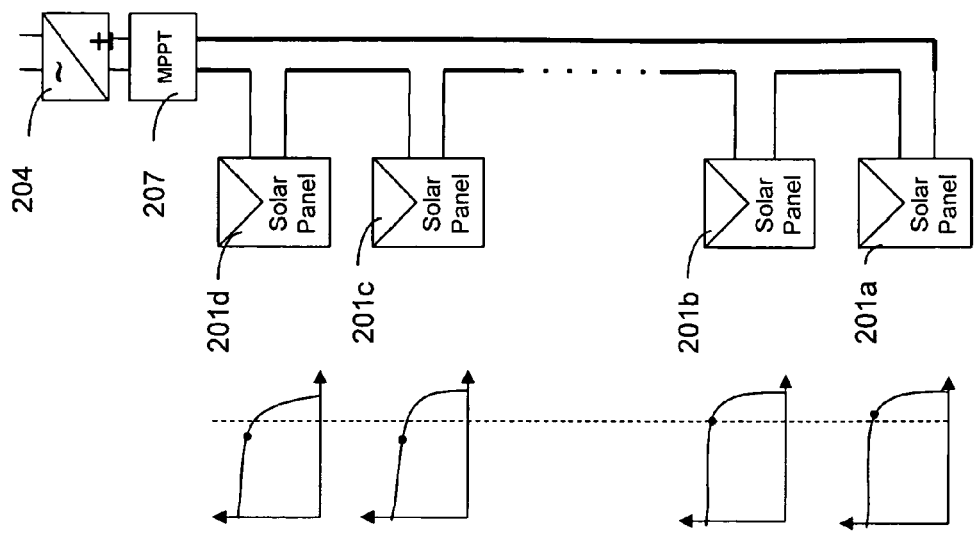
*Figure 2 – Prior Art*
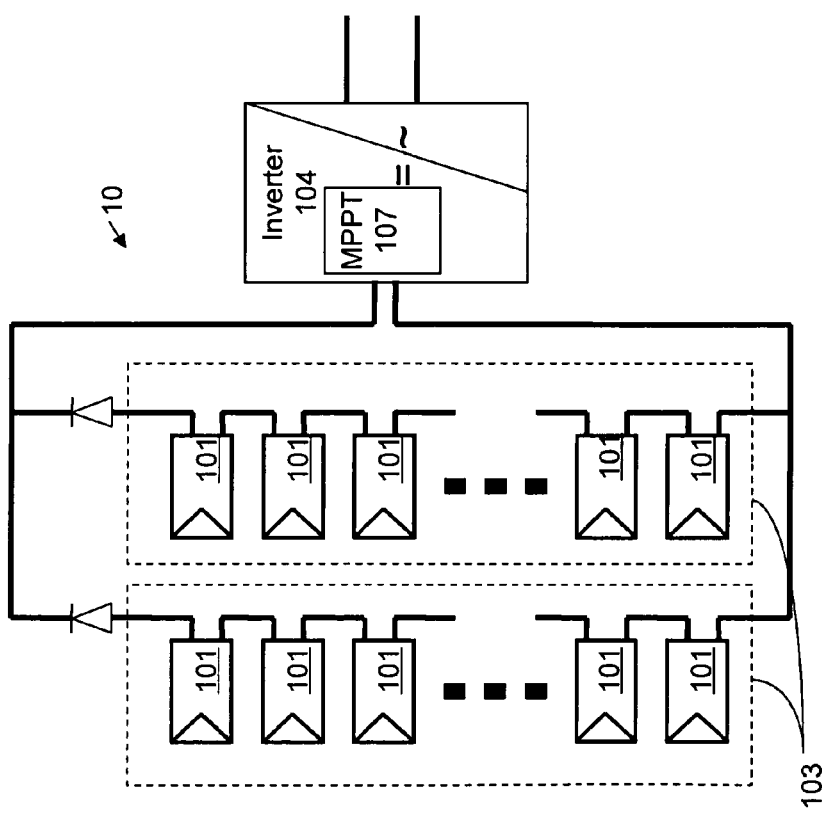
*Figure 1 – Prior Art*

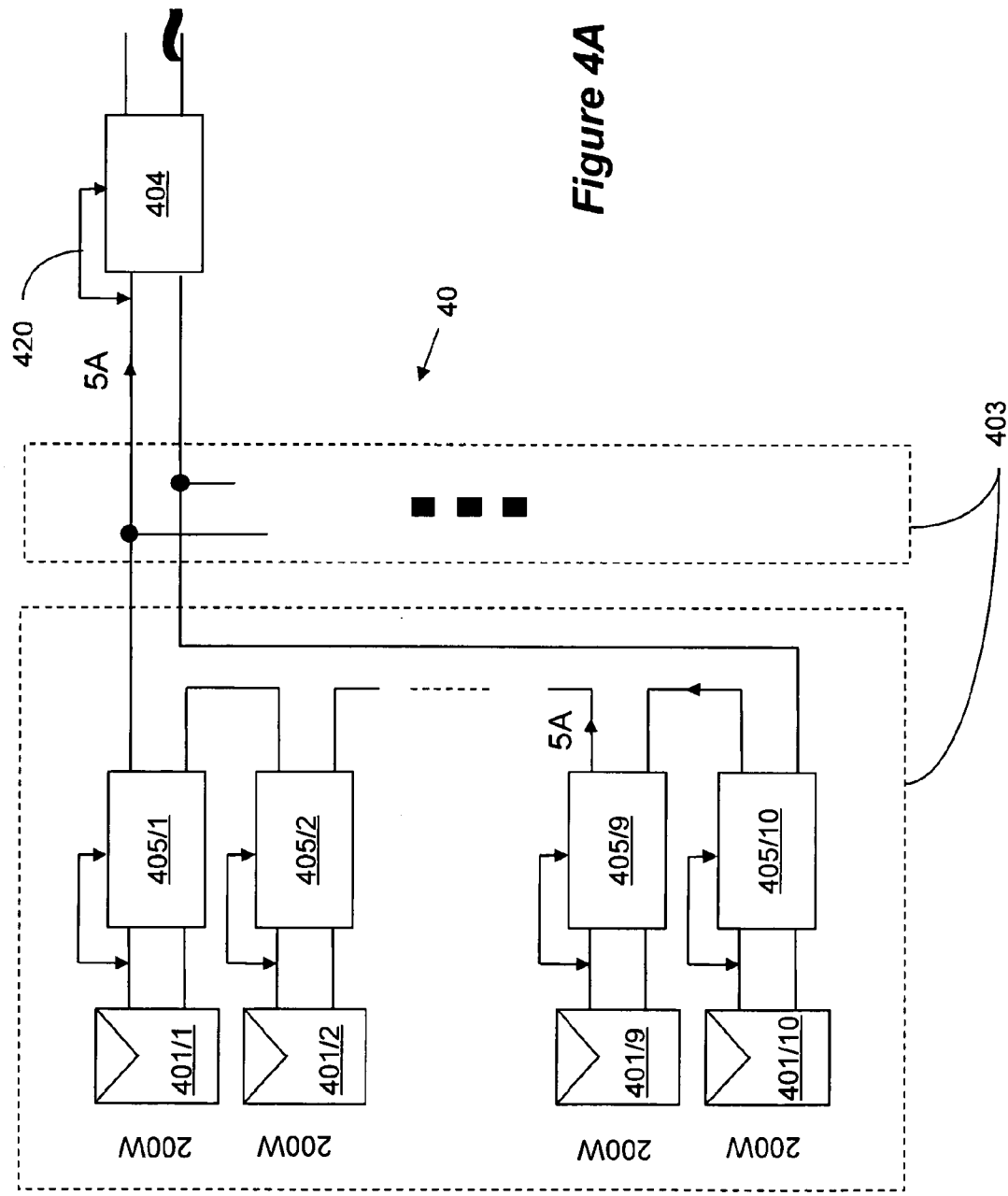

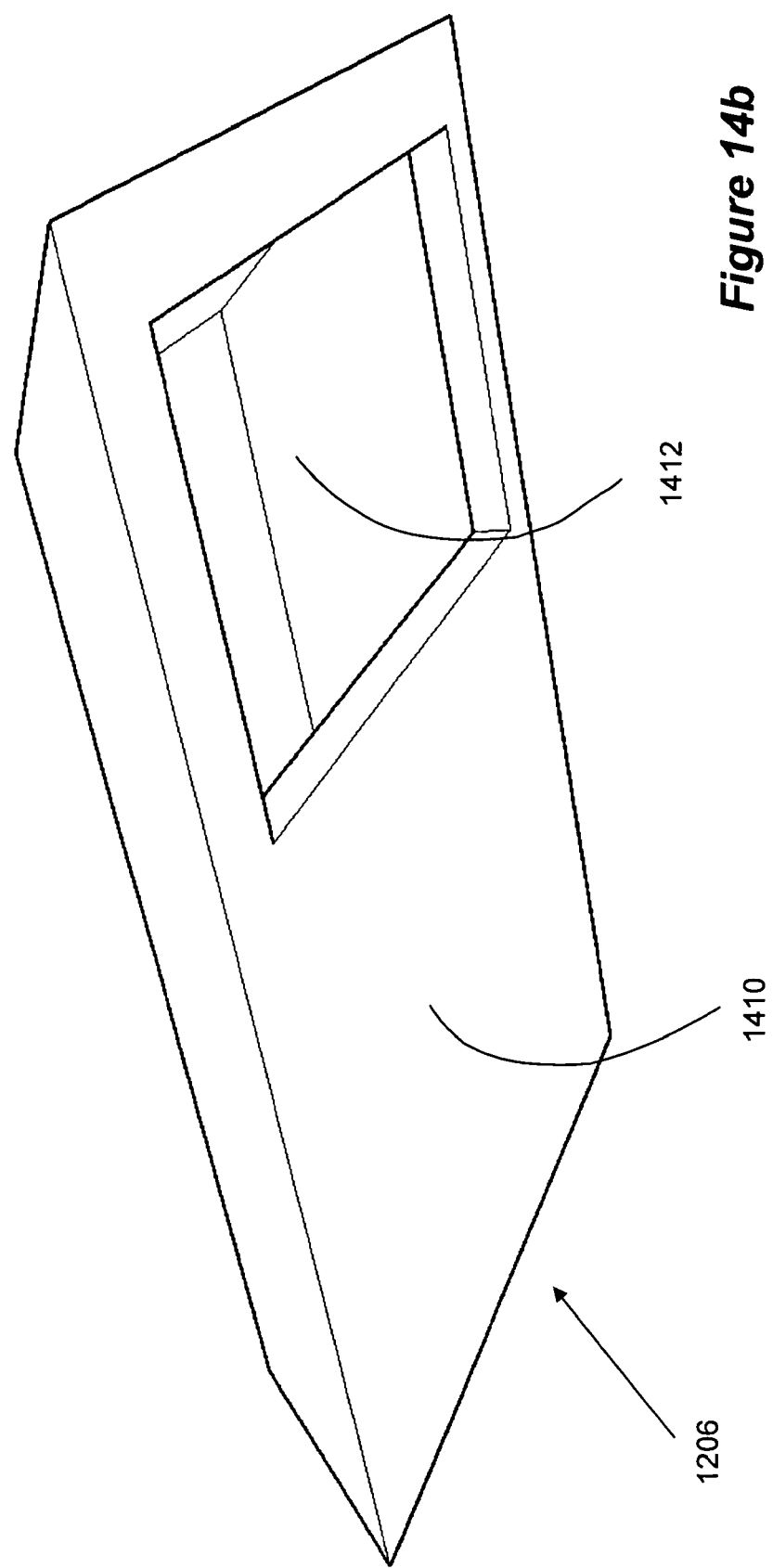

DISTRIBUTED POWER HARVESTING SYSTEMS USING DC POWER SOURCES

CROSS REFERENCE TO RELATED APPLICATIONS

The present application is a continuation of U.S. patent application Ser. No. 12/411,294, filed Mar. 25, 2009, by the same inventors, which is a continuation-in-part application of U.S. patent application Ser. No. 11/950,271 filed on Dec. 4, 2007, by the same inventors, the disclosures of which are incorporated herein by reference. The present application also claims the benefit of U.S. patent application Ser. No. 61/039,113 filed on Mar. 25, 2008, by the same inventors, the disclosure of which is incorporated herein.

BACKGROUND

1. Field of the Invention

The field of the invention relates generally to power production from distributed DC power sources, and more particularly to management of distributed DC power sources in series installations.

2. Related Arts

The recent increased interest in renewable energy has led to increased research in systems for distributed generation of energy, such as photovoltaic cells (PV), fuel cells, batteries (e.g., for hybrid cars), etc. Various topologies have been proposed for connecting these power sources to the load, taking into consideration various parameters, such as voltage/current requirements, operating conditions, reliability, safety, costs, etc. For example, most of these sources provide low voltage output (normally a few volts for one cell, or a few tens of volts for serially connected cells), so that many of them need to be connected serially to achieve the required operating voltage. Conversely, a serial connection may fail to provide the required current, so that several strings of serial connections may need to be connected in parallel to provide the required current.

It is also known that power generation from each of these sources depends on manufacturing, operating, and environmental conditions. For example, various inconsistencies in manufacturing may cause two identical sources to provide different output characteristics. Similarly, two identical sources may react differently to operating and/or environmental conditions, such as load, temperature, etc. In practical installations, different source may also experience different environmental conditions, e.g., in solar power installations some panels may be exposed to full sun, while others be shaded, thereby delivering different power output. In a multiple-battery installation, some of the batteries may age differently, thereby delivering different power output. While these problems and the solutions provided by the subject invention are applicable to any distributed power system, the following discussion turns to solar energy so as to provide better understanding by way of a concrete example.

A conventional installation of solar power system 10 is illustrated in FIG. 1. Since the voltage provided by each individual solar panel 101 is low, several panels are connected in series to form a string of panels 103. For a large installation, when higher current is required, several strings 103 may be connected in parallel to form the overall system 10. The solar panels are mounted outdoors, and their leads are connected to a maximum power point tracking (MPPT) module 107 and then to an inverter 104. The MPPT 107 is typically implemented as part of the inverter 104. The harvested power from the DC sources is delivered to the inverter 104, which converts the fluctuating direct-current (DC) into alternating-current (AC) having a desired voltage and frequency, which is usually 110V or 220V at 60 Hz, or 220V at 50 Hz (It is interesting to note the even in the US many inverters produce 220V, which is then split into two 110V feeds in the electric box). The AC current from the inverter 104 may then be used for operating electric appliances or fed to the power grid. Alternatively, if the installation is not tied to the grid, the power extracted from the inverter may be directed to a conversion and charge/discharge circuit to store the excess power created as charge in batteries. In case of a battery-tied application, the inversion stage might be skipped altogether, and the DC output of the MPPT stage 107 may be fed into the charge/discharge circuit.

As noted above, each solar panel 101 supplies relatively very low voltage and current. The problem facing the solar array designer is to produce a standard AC current at 120V or 220V root-mean-square (RMS) from a combination of the low voltages of the solar panels. The delivery of high power from a low voltage requires very high currents, which cause large conduction losses on the order of the second power of the current ($I^2$). Furthermore, a power inverter, such as the inverter 104, which is used to convert DC current to AC current, is most efficient when its input voltage is slightly higher than its output RMS voltage multiplied by the square root of 2. Hence, in many applications, the power sources, such as the solar panels 101, are combined in order to reach the correct voltage or current. The most common method connects the power sources in series in order to reach the desirable voltage and in parallel in order to reach the desirable current, as shown in FIG. 1. A large number of the panels 101 are connected into a string 103 and the strings 103 are connected in parallel to the power inverter 104. The panels 101 are connected in series in order to reach the minimal voltage required for the inverter. Multiple strings 103 are connected in parallel into an array to supply higher current, so as to enable higher power output.

While this configuration is advantageous in terms of cost and architecture simplicity, several drawbacks have been identified in the literature for such architecture. One recognized drawback is inefficiencies cause by non-optimal power draw from each individual panel, as explained below. As explained above, the output of the DC power sources is influenced by many conditions. Therefore, to maximize the power draw from each source, one needs to draw the combination of voltage and current that provides the peak power for the currently prevailing conditions. As conditions change, the combination of voltage and current draw may need to be changed as well.

FIG. 2 illustrates one serial string of DC sources, e.g., solar panels 201 a-201 d, connected to MPPT circuit 207 and inverter 204. The current versus voltage (IV) characteristics plotted (210a-210d) to the left of each DC source 201. For each DC source 201, the current decreases as the output voltage increases. At some voltage value the current goes to zero, and in some applications may assume a negative value, meaning that the source becomes a sink. Bypass diodes are used to prevent the source from becoming a sink. The power output of each source 201, which is equal to the product of current and voltage (P=I*V), varies depending on the voltage drawn from the source. At a certain current and voltage, close to the falling off point of the current, the power reaches its maximum. It is desirable to operate a power generating cell at this maximum power point. The purpose of the MPPT is to find this point and operate the system at this point so as to draw the maximum power from the sources.

In a typical, conventional solar panel array, different algorithms and techniques are used to optimize the integrated power output of the system 10 using the MPPT module 107.

The MPPT module 107 receives the current extracted from all of the solar panels together and tracks the maximum power point for this current to provide the maximum average power such that if more current is extracted, the average voltage from the panels starts to drop, thus lowering the harvested power. The MPPT module 107 maintains a current that yields the maximum average power from the overall system 10.

Maximum power point tracking techniques are reviewed in: "Comparison of Photovoltaic Array Maximum Power Point Tracking Techniques" by T. Esram & P. L. Chapman, IEEE Transactions on Energy Conversion (Accepted for future publication, Volume PP, Issue 99, 2006 Page(s): 1-1, Digital Object Identifier 10.1109/TEC.2006.874230), the entire content of which is incorporated herein by this reference.

However, since the sources 201a-201d are connected in series to a single MPPT 207, the MPPT must select a single point, which would be somewhat of an average of the MPP of the serially connected sources. In practice, it is very likely that the MPPT would operate at an I-V point that is optimum to only a few or none of the sources. In the example of FIG. 2, the selected point is the maximum power point for source 201b, but is off the maximum power point for sources 201a, 201c and 201d. Consequently, the arrangement is not operated at best achievable efficiency.

Turning back to the example of a solar system 10 of FIG. 1, fixing a predetermined constant output voltage from the strings 103 may cause the solar panels to supply lower output power than otherwise possible. Further, each string carries a single current that is passed through all of the solar panels along the string. If the solar panels are mismatched due to manufacturing differences, aging or if they malfunction or are placed under different shading conditions, the current, voltage and power output of each panel will be different. Forcing a single current through all of the panels of the string causes the individual panels to work at a non-optimal power point and can also cause panels which are highly mismatched to generate "hot spots" due to the high current flowing through them. Due to these and other drawbacks of conventional centralized methods, the solar panels have to be matched properly. In some cases external diodes are used to bypass the panels that are highly mismatched. In conventional multiple string configurations all strings have to be composed of exactly the same number of solar panels and the panels are selected of the same model and must be install at exactly the same spatial orientation, being exposed to the same sunlight conditions at all times. This is difficult to achieve and can be very costly.

Various different topologies have been proposed in order to overcome the above deficiencies of the serial installation. For example, some have proposed to have inverters coupled to each DC source, and connect all of the inverters in parallel. Others have proposed to have DC/DC converter connected to each DC source, and to connect all of the converters serially or in parallel to a central inverter. Among the DC/DC converters proposed for use with the DC sources are boost converter, buck converter, buck-boost converter, or a Cuk converter. It has also been proposed to incorporate MPPT into each DC power source, e.g., into each solar panel, and connect the panels serially.

For further discussion of the above issues relating to distributed power sources and solar panels, the reader is highly encouraged to review the following literature, which may or may not be prior art.

Cascade DC-DC Converter Connection of Photovoltaic Modules, G. R. Walker and P. C. Sernia, *Power Electronics Specialists Conference*, 2002 (PESC 02), Vol. 1 IEEE, Cairns, Australia, pp. 24-29.

Topology for Decentralized Solar Energy Inverters with a Low Voltage AC-Bus, Bjorn Lindgren.

Integrated Photovoltaic Maximum Power Point Tracking Converter, Johan H. R. Enslin et al., IEEE Transactions on Industrial Electronics, Vol. 44, No. 6, December 1997.

A New Distributed Converter Interface for PV Panels, R. Alonso et al., 20th European Photovoltaic Solar Energy Conference, 6-10 Jun. 2005, Barcelona, Spain.

Intelligent PV Module for Grid-Connected PV Systems, Eduardo Roman, et al., IEEE Transactions on Industrial Electronics, Vol. 53, No. 4, August 2006. Also in Spanish patent application ES2249147.

A Modular Fuel Cell, Modular DC-DC Converter Concept for High Performance and Enhanced Reliability, L. Palma and P. Enjeti, Power Electronics Specialists Conference, 2007, PESC 2007, IEEE Volume, Issue, 17-21 Jun. 2007 Page(s): 2633-2638. Digital Object Identifier 10.1109/PESC.2007.4342432.

Experimental Results of Intelligent PV Module for Grid-Connected PV Systems, R. Alonso et al., Twenty first European Photovoltaic Solar Energy Conference, Proceedings of the International Conference held in Dresden, Germany, 4-8 Sep. 2006.

Cascaded DC-DC Converter Connection of Photovoltaic Modules, G. R. Walker and P. C. Sernia, IEEE Transactions on Power Electronics, Vol. 19, No. 4, July 2004.

Cost Effectiveness of Shadow Tolerant Photovoltaic Systems, Quaschning, V.; Piske, R.; Hanitsch, R., Euronsun 96, Freiburg, Sep. 16-19, 1996.

Evaluation Test results of a New Distributed MPPT Converter, R. Orduz and M. A. Egido, 22nd European Photovoltaic Solar Energy Conference, 3-7 Sep. 2007, Milan, Italy.

Energy Integrated Management System for PV Applications, S. Uriarte et al., 20th European Photovoltaic Solar Energy Conference, 6-10 Jun. 2005, Barcelona, Spain.

U.S. Published Application 2006/0185727

As noted in some of the above cited works, integrating inverters into the individual cells has many drawbacks, including high costs, low safety (especially in solar installations), and reliability. Therefore, serial connection is still preferred, especially for solar panel installations. The proposals for including DC-DC converters and MPPT into the individual sources, and then connect their outputs serially to an inverter are attractive. However, incorporating MPPT into each panel is still problematic in serial application, as each MPPT would attempt to drive its source at different current, while in a serial connection the same current must flow through all of the panels. Moreover, it is unclear what type of DC-DC converter would provide the best results and how to incorporate an MPPT into such an arrangement. Therefore, solutions are still needed for an effective topology for connecting multiple DC power sources to the load, i.e., power grid, power storage bank, etc.

As already mentioned above, various environmental and operational conditions impact the power output of DC power sources. In the case of solar panels, solar radiance, ambient temperature, and shading, whether from near objects such as trees or far objects such as clouds, impact the power extracted from each solar panel. Depending on the number and type of panels used, the extracted power may vary widely in the voltage and current. Owners and even professional installers find it difficult to verify the correct operation of the solar system. With time, many other factors, such as aging, dust and dirt collection and module degradation affect the performance of the solar array.

The sensitivity of photovoltaic panels to external conditions is even more profound when concentrated photovoltaics (CPV) are used. In such installations, the sun radiation is concentrated by use of lenses or mirrors onto small cells. These cells may be much more efficient then typical PV cells and use a technology knows as double- or triple-junction, in which a number of p-n junctions are constructed one on top of the other—each junction converts light from a certain part of the spectrum and allows the rest to pass-through to the next junction. Thus, these cells are much more efficient (with peak efficiencies of over 40%). Since these cells are expensive, they are usually used in CPV applications which call for smaller cells. However, the power output of CPV installations now depends upon fluctuations in the intensity of different parts of the spectrum of the sun (and not only the total intensity), and imperfections or distortions in the lenses or mirrors used. Thus, having a single MPPT for many panels will lead to significant power loss, and great benefits are realized from using a panel- (or cell-) level MPPT as described in aspects of the present invention.

Another field in which traditional photovoltaic installations face many problems is the developing market of building-integrated photovoltaics (BIPV). In BIPV installations, the panels are integrated into buildings during construction—either as roof panels or as structural or additional elements in the walls and windows. Thus, BIPV installations suffer greatly from local partial shading due to the existence of other structural elements in the vicinity of the panels. Moreover, the panels are naturally positioned on many different facets of the building, and therefore the lighting conditions each panel experiences may vary greatly. Since in traditional solutions the panels are stringed together to a joint MPPT, much power is lost. A solution that could harvest more power would obviously be very beneficial in installations of this type.

Yet another problem with traditional installations is the poor energy utilization in cases of low sun-light. Most inverters require a certain minimal voltage (typically between 150V to 350V) in order to start functioning. If there is low light, the aggregated voltage from the panels may not reach this minimal value, and the power is thus lost. A solution that could boost the voltage of panels suffering from low light, would therefore allow for the produced energy to be harvested.

During installation of a solar array according to the conventional configurations 10, the installer can verify the correctness of the installation and performance of the solar array by using test equipment to check the current-voltage characteristics of each panel, each string and the entire array. In practice, however, individual panels and strings are generally either not tested at all or tested only prior to connection. This happens because current measurement is done by either a series connection to the solar array or a series resistor in the array which is typically not convenient. Instead, only high-level pass/fail testing of the overall installation is performed.

After the initial testing of the installation, the solar array is connected to inverter 104 which optionally includes a monitoring module which monitors performance of the entire array. The performance information gathered from monitoring within the inverter 104 includes integrated power output of the array and the power production rate, but the information lacks any fine details about the functioning of individual solar panels. Therefore, the performance information provided by monitoring at the inverter 104 is usually not sufficient to understand if power loss is due to environmental conditions, from malfunctions or from poor installation or maintenance of the solar array. Furthermore, integrated information does not pinpoint which of solar panels 101 is responsible for a detected power loss.

In view of the above, a newly proposed topology for connecting multiple DC power sources to the load should also lend itself to easy testing and operational verification during and after installation.

BRIEF SUMMARY

The following summary of the invention is provided in order to provide a basic understanding of some aspects and features of the invention. This summary is not an extensive overview of the invention, and as such it is not intended to particularly identify key or critical elements of the invention, or to delineate the scope of the invention. Its sole purpose is to present some concepts of the invention in a simplified form as a prelude to the more detailed description that is presented below.

Aspects of the invention provide a topology for distributed DC power sources serially connected to a central power supplier, e.g., a single inverter or a single converter. Aspects of the invention provide system and a method for monitoring of individual DC power sources in a distributed power harvesting installation and adjusting the current and voltage from each DC power source to maximize power output from each DC power source.

According to aspects of the invention, a distributed power harvesting system comprising: a plurality of DC power sources; a plurality of converters, each of the converters comprising: input terminals coupled to a respective DC power source; output terminals coupled in series to the other converters, thereby forming a serial string; a circuit loop setting the voltage and current at the input terminals of the converter according to predetermined criteria; and, a power conversion portion for converting the power received at the input terminals to an output power at the output terminals; and a power supplier coupled to the serial string, the power supplier comprising a control part maintaining the input to the power supplier at a predetermined value. The control part may maintain the input voltage to the power supplier at a predetermined value. The control part may maintain the input current to the power supplier at a predetermined value. The power supplier may comprise a DC/AC inverter. The power supplier may comprise a battery charger. The circuit loop may comprise an MPPT part setting the voltage and current at the input terminals of the converter to maximum power point of the respective DC power source. The power conversion portion may comprise: a buck converter; a boost converter; a controller selectively activating either the buck converter or the boost converter in response to the MPPT part and current or voltage at the output terminals. An inductor may be shared by the buck converter and the boost converter, and the controller comprises a pulse-width modulation portion. The control part may comprise a shunt regulator coupled in parallel with the power supplier and regulating the input voltage to a preselected constant input voltage. The system may further comprise one or more additional serial strings coupled to the power supplier. The system may further comprise: a plurality of current sensors;

and a plurality of voltage sensors; wherein each of the current sensors and each of the voltage sensors is coupled between a respective converter and DC power source and providing current information and voltage information to the MPPT part. Each of the plurality of DC power sources may comprise a solar panel or a building integrated solar panel. At least one of the plurality of DC power sources may comprise a fuel cell. At least one of the plurality of DC power sources may comprise a battery. Each of the plurality of converters may further comprise a safety module limiting the output to a preset safe value until a predetermined event has occurred. The predetermined event may comprise one of a load above a preset threshold is applied to the converter or a release signal has been detected. Each of the converters may further comprise a plurality of switching devices, each of the switching devices forming a current bypass to at least one DC power source. The solar panel may comprise a plurality of cell strings, each cell string comprising serially connected solar cells and a switching device coupled to bypass the serially connected solar cells. The switching device may comprise a transistor. Each of the converters may further comprise a monitoring module monitoring and transmitting status related data, the status related data comprising at least one of: input current to the converter, input voltage to the converter, temperature of the power source, input power to the converter, and available illumination.

According to an aspect of the invention, a method for harvesting power from a distributed power system having a plurality of DC power sources and a plurality of DC power converters is provided, the method comprising: coupling each of the power sources to a respective DC power converter; coupling the power converters in series, to thereby form at least one serial string; coupling the serial string to a power delivery device; fixing one of input voltage or input current to the power delivery device to a predetermined value, thereby forcing current flowing through the serial string to vary according to power provided by the power sources; and controlling power output from each power source individually and individually varying the input voltage and current to each respective converter according to a predetermined criteria. Fixing one of the input voltage or input current may comprise fixing to a predetermined constant value. Coupling the serial string to a power delivery device may comprise coupling the serial string to a DC/AC inverter and fixing the input voltage to the inverter. Monitoring power output may comprise tracking maximum power point of the power source, and individually varying the input voltage and current comprises setting the input voltage and current so as to draw maximum power from each power source. The method may further comprise individually converting the input voltage and current of each converter to output power at current level dictated by the current flowing through the serial string and at a floating voltage. The method may further comprise individually converting the input voltage and current of each converter to output power at current level dictated by the current flowing through the serial string and at a floating voltage. The method may further comprise monitoring load on each converter individually and limiting power output from each converter to a preset safe level until the load reaches a preset value. The method may further comprise monitoring power output of at least one of the power source and DC power converter and directing current to a bypass when the power output exhibits predetermined characteristics. The method may further comprise individually operating each power converter to monitor and report power related data, the power related data comprising at least one of: input current to the converter, input voltage to the converter, temperature of the power source, input power to the converter, and available illumination.

According to aspects of the invention, a solar power installation is provided, comprising: a DC/AC inverter comprising means for maintaining the input voltage or current to the inverter at a predetermined value; a plurality of serial strings coupled in parallel to the DC/AC inverter, each of the serial string comprising: a plurality of solar panels; a plurality of converters, each of the converters comprising: input terminals coupled to a respective solar panel; output terminals coupled in series to the other converters, thereby forming one serial string; an MPPT part setting the voltage and current at the input terminals of the converter according to maximum power point of the respective solar panel; and, a power conversion portion for converting the power received at the input terminals to an output power at the output terminals. The predetermined value may comprise a constant value. The power conversion portion may convert the power received at the input terminals to output power having current substantially equal to the total power provided by the plurality of solar panels in the serial string divided by the predetermined constant voltage at the input of the inverter. The power conversion portion may comprise a power conversion controller controlling pulse width modulation of the power conversion portion so as to output power having current substantially equal to the total power provided by the plurality of solar panels in the serial string divided by the predetermined constant voltage at the input of the inverter. Each of the power conversion portion may comprise: a buck converter; a boost converter; a pulse width modulator; and, a digital controller controlling the pulse width modulator to selectively operate either the buck converter or the boost converter. Each of the serial strings may further comprise: a plurality of current sensors, each measuring current output of one solar panel and sending measured current signal to a respective digital controller; and a plurality of voltage sensors, each measuring voltage output of one solar panel and sending measured voltage signal to a respective digital controller; wherein each digital controller adjusts current and voltage draw to obtain maximum available power. The solar power installation may further comprise a safety module limiting the output voltage to a preset safe value as long as no load above a preset threshold is applied to the converter. The solar power installation may include a plurality of cell strings, each cell string comprising serially connected solar cells and a switching device coupled to bypass the serially connected solar cells. The switching device may comprise a transistor. Each of the converters may further comprise a monitoring module monitoring and transmitting power related data, the power related data comprising at least one of: input current to the converter, input voltage to the converter, temperature of the power source, spatial orientation of the power source, and available illumination.

According to aspects of the invention, a method for improving the reliability of components within the load in a distributed power system having a plurality of DC power sources coupled to a central load is provided, comprising: coupling the DC power sources to the central load; maintaining the input to the central load to a fixed predetermined voltage, the voltage being a safe operating voltage for the components within the load; varying the current input to the central load according to the power drawn from the DC power sources. The central load may comprise a DC/AC inverter, and the step of maintaining the input comprises maintaining the input voltage to the inverter. Coupling the DC power sources may comprise coupling each of a plurality of solar panels to a respective converter from a plurality of converters, and coupling all of the converters to the inverter. The method may further comprise operating each converter to boost the voltage obtained from a respective solar panel as soon as the respective solar panel starts to output electrical energy.

According to further features of the present invention there is provided a distributed power harvesting system including multiple direct current (DC) power sources with respective DC outputs adapted for interconnection into an interconnected DC power source output. A converter includes input terminals adapted for coupling to the interconnected DC power source output. A circuit loop sets the voltage and current at the input terminals of the converter according to predetermined criteria. A power conversion portion converts the power received at the input terminals to an output power at the output terminals. A power supplier is coupled to the output terminals. The power supplier includes a control part for maintaining the input to the power supplier at a predetermined value. The control part maintains the input voltage and/or input current to the power supplier at a predetermined value. The control part may include a shunt regulator coupled in parallel with the power supplier and regulating the input voltage to a preselected constant input voltage. The power supplier may include a DC/AC inverter and/or a battery charger.

The circuit loop may include a maximum power point tracking (MPPT) part for setting the voltage and current at the input terminals of the converter to a maximum power point of the interconnected DC power source output. The power conversion portion may include: a buck converter; a boost converter; a controller selectively activating either the buck converter or the boost converter in response to the MPPT part and current or voltage at the output terminals. An inductor may be shared by the buck converter and the boost converter, and the controller may include a pulse-width modulation portion. The system may include a current sensor and/or a voltage sensor coupled between the converter and the interconnected DC power source output providing current information and voltage information to the MPPT part. The DC power sources are crystalline Silicon solar panels, thin film solar panels, building integrated solar panels, fuel cells and/or batteries, or combinations thereof. The converter optionally includes a safety module limiting the interconnected DC power source output to a preset safe value until a predetermined event has occurred. The predetermined event may include a load above a preset threshold applied to the converter or a release signal has been detected. The converter may include a monitoring module monitoring and transmitting status related data. The status related data may include at least one of: input current to the converter, input voltage to the converter, temperature of the power source, input power to the converter, and available illumination.

According to a feature of the present invention there is provided a junction box adapted for attaching to a solar panel. An attachment mechanism may be provided to either a solar panel or to a frame. The junction box includes an input connector adapted for inputting DC power respectively from at least one other solar panel. A mechanism is provided for internally connecting between the solar panel to other solar panels or just one other solar panel and typically four other solar panels. An interconnected DC power source is produced. An output connector is adapted for outputting power from said DC power source the power sourced from both the solar panel and the at least one other solar panel. The junction box may include a converter with input terminals adapted for coupling to the DC power source, a circuit loop for setting the voltage and current at the input terminals of the converter according to predetermined criteria, and a power conversion portion for converting the power received at the input terminals to an output power at the output terminals. The input terminals operatively connect to the input connector and the output terminals operatively connect to the output connector. The junction box may have a surface adapted for adhering to the back surface of the solar panel, or may be designed as a stand-alone box.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 illustrates a conventional centralized power harvesting system using DC power sources.

FIG. 2 illustrates current versus voltage characteristic curves for one serial string of DC sources.

FIGS. 4A and 4B illustrate the operation of the system of FIG. 3 under different conditions, according to aspects of the invention.

FIG. 14b is another view of the cascading junction box of FIG. 14a.

DETAILED DESCRIPTION

Figure 3:
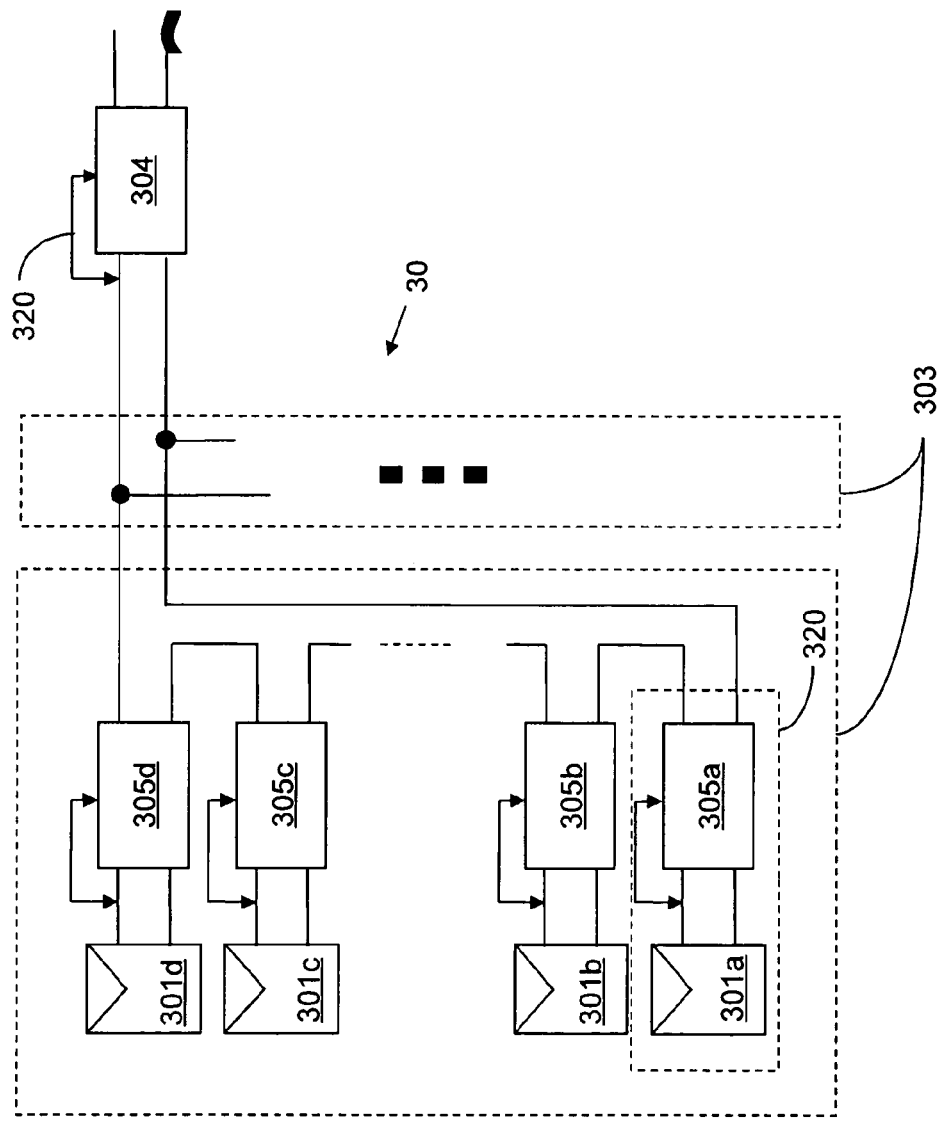
FIG. 3 illustrates a distributed power harvesting system, according to aspects of the invention, using DC power sources.

The topology provided by the subject invention solves many of the problems associated with, and has many advantages over, the prior art topologies. For example, the inventive topology enables serially connecting mismatched power sources, such as mismatched solar panels, panel of different models and power ratings, and even panels from different manufacturers and semiconductor materials. It allows serial connection of sources operating under different conditions, such as, e.g., solar panels exposed to different light or temperature conditions. It also enables installations of serially connected panels at different orientations or different sections of the roof or structure. This and other features and advantages will become apparent from the following detailed description.

Aspects of the present invention provide a system and method for combining power from multiple DC power sources into a single power supply. According to aspects of the present invention, each DC power source is associated with a DC-DC power converter. Modules formed by coupling the DC power sources to their associated converters are coupled in series to provide a string of modules. The string of modules is then coupled to an inverter having its input voltage fixed. A maximum power point control loop in each converter harvests the maximum power from each DC power source and transfers this power as output from the power converter. For each converter, substantially all the input power is converted to the output power, such that the conversion efficiency may be 90% or higher in some situations. Further, the controlling is performed by fixing the input current or input voltage of the converter to the maximum power point and allowing output voltage of the converter to vary. For each power source, one or more sensors perform the monitoring of the input power level to the associated converter. In some aspects of the invention, a microcontroller may perform the maximum power point tracking and control in each converter by using pulse width modulation to adjust the duty cycle used for transferring power from the input to the output.

One aspect of the present invention provides a greater degree of fault tolerance, maintenance and serviceability by monitoring, logging and/or communicating the performance of each solar panel. In one aspect of the invention, the microcontroller that is used for maximum power point tracking, may also be used to perform the monitoring, logging and communication functions. These functions allow for quick and easy troubleshooting during installation, thereby significantly reducing installation time. These functions are also beneficial for quick detection of problems during maintenance work. Aspects of the present invention allow easy location, repair, or replacement of failed solar panels. When repair or replacement is not feasible, bypass features of the current invention provide increased reliability.

In one aspect, the present invention relates to arrays of solar cells where the power from the cells is combined. Each converter may be attached to a single solar cell, or a plurality of cell connected in series, in parallel, or both, e.g., parallel connection of strings of serially connected cells. In one embodiment each converter is attached to one panel of photovoltaic strings. However, while applicable in the context of solar power technology, the aspects of the present invention may be used in any distributed power network using DC power sources. For example, they may be used in batteries with numerous cells or hybrid vehicles with multiple fuel cells on board. The DC power sources may be solar cells, solar panels, electrical fuel cells, electrical batteries, and the like. Further, although the discussion below relates to combining power from an array of DC power sources into a source of AC voltage, the aspects of the present invention may also apply to combining power from DC sources into another DC voltage.

FIG. 3 illustrates a distributed power harvesting configuration 30, according to an embodiment of the present invention. Configuration 30 enables connection of multiple power sources, for example solar panels 301 *a*-301 *d*, to a single power supply. In one aspect of the invention, the series string of all of the solar panels may be coupled to an inverter 304. In another aspect of the invention, several serially connected strings of solar panels may be connected to a single inverter 304. The inverter 304 may be replaced by other elements, such as, e.g., a charging regulator for charging a battery bank.

In configuration 30, each solar panel 301*a*-301*d* is connected to a separate power converter circuit 305*a*-305*d*. One solar panel together with its associated power converter circuit forms a module, e.g., module 320. Each converter 305*a*-305*d* adapts optimally to the power characteristics of the connected solar panel 301*a*-301*d* and transfers the power efficiently from converter input to converter output. The converters 305*a*-305*d* can be buck converters, boost converters, buck/boost converters, flyback or forward converters, etc. The converters 305*a*-305*d* may also contain a number of component converters, for example a serial connection of a buck and a boost converter.

Each converter 305*a*-305*d* includes a control loop that receives a feedback signal, not from the converter's output current or voltage, but rather from the converter's input coming from the solar panel 301. An example of such a control loop is a maximum power point tracking (MPPT) loop. The MPPT loop in the converter locks the input voltage and current from each solar panel 301*a*-301*d* to its optimal power point.

Conventional DC-to-DC converters may have a wide input voltage range at their input and an output voltage that is predetermined and fixed. In these conventional DC-to-DC voltage converters, a controller within the converter monitors the current or voltage at the input, and the voltage at the output. The controller determines the appropriate pulse width modulation (PWM) duty cycle to fix the output voltage to the predetermined value by increasing the duty cycle if the output voltage drops. Accordingly, the conventional converter includes a feedback loop that closes on the output voltage and uses the output voltage to further adjust and fine tune the output voltage from the converter. As a result of changing the output voltage, the current extracted from the input is also varied.

In the converters 305*a*-305*d*, according to aspects of the present invention, a controller within the converter 405 monitors the voltage and current at the converter input and determines the PWM in such a way that maximum power is extracted from the attached panel 301*a*-301*d*. The controller of the converter 405 dynamically tracks the maximum power point at the converter input. In the aspects of the present invention, the feedback loop is closed on the input power in order to track maximum input power rather than closing the feedback loop on the output voltage as performed by conventional DC-to-DC voltage converters.

As a result of having a separate MPPT circuit in each converter 305*a*-305*d*, and consequently for each solar panel 301*a*-301*d*, each string 303 in the embodiment shown in FIG. 3 may have a different number or different brand of panels 301*a*-301*d* connected in series. The circuit of FIG. 3 continuously performs MPPT on the output of each solar panel 301 *a*-301 *d* to react to changes in temperature, solar radiance, shading or other performance factors that impact that particular solar panel 301a-301d. As a result, the MPPT circuit within the converters 305a-305d harvests the maximum possible power from each panel 301a-301d and transfers this power as output regardless of the parameters impacting the other solar panels.

As such, the aspects of the invention shown in FIG. 3 continuously track and maintain the input current and the input voltage to each converter at the maximum power point of the DC power source providing the input current and the input voltage to the converter. The maximum power of the DC power source that is input to the converter is also output from the converter. The converter output power may be at a current and voltage different from the converter input current and voltage. The output current and voltage from the converter are responsive to requirements of the series connected portion of the circuit.

In one aspect of the invention, the outputs of converters 305a-305d are series connected into a single DC output that forms the input to the load or power supplier, in this example, inverter 304. The inverter 304 converts the series connected DC output of the converters into an AC power supply. The load, in this case inverter 304, regulates the voltage at the load's input. That is, in this example, an independent control loop 320 holds the input voltage at a set value, say 400 volts. Consequently, the inverter's input current is dictated by the available power, and this is the current that flows through all serially connected DC sources. On the other hand, while the output of the DC-DC converters must be at the inverter's current input, the current and voltage input to the converter is independently controlled using the MPPT.

In the prior art, the input voltage to the load was allowed to vary according to the available power. For example, when a lot of sunshine is available in a solar installation, the voltage input to the inverter can vary even up to 1000 volts. Consequently, as sunshine illumination varies, the voltage varies with it, and the electrical components in the inverter (or other power supplier or load) are exposed to varying voltage. This tends to degrade the performance of the components and ultimately causes them to fail. On the other hand, by fixing the voltage or current to the input of the load or power supplier, here the inverter, the electrical components are always exposed to the same voltage or current and therefore would have extended service life. For example, the components of the load (e.g., capacitors, switches and coil of the inverter) may be selected so that at the fixed input voltage or current they operate at, say, 60% of their rating. This would improve the reliability and prolong the service life of the component, which is critical for avoiding loss of service in applications such as solar power systems.

Figure 4B:
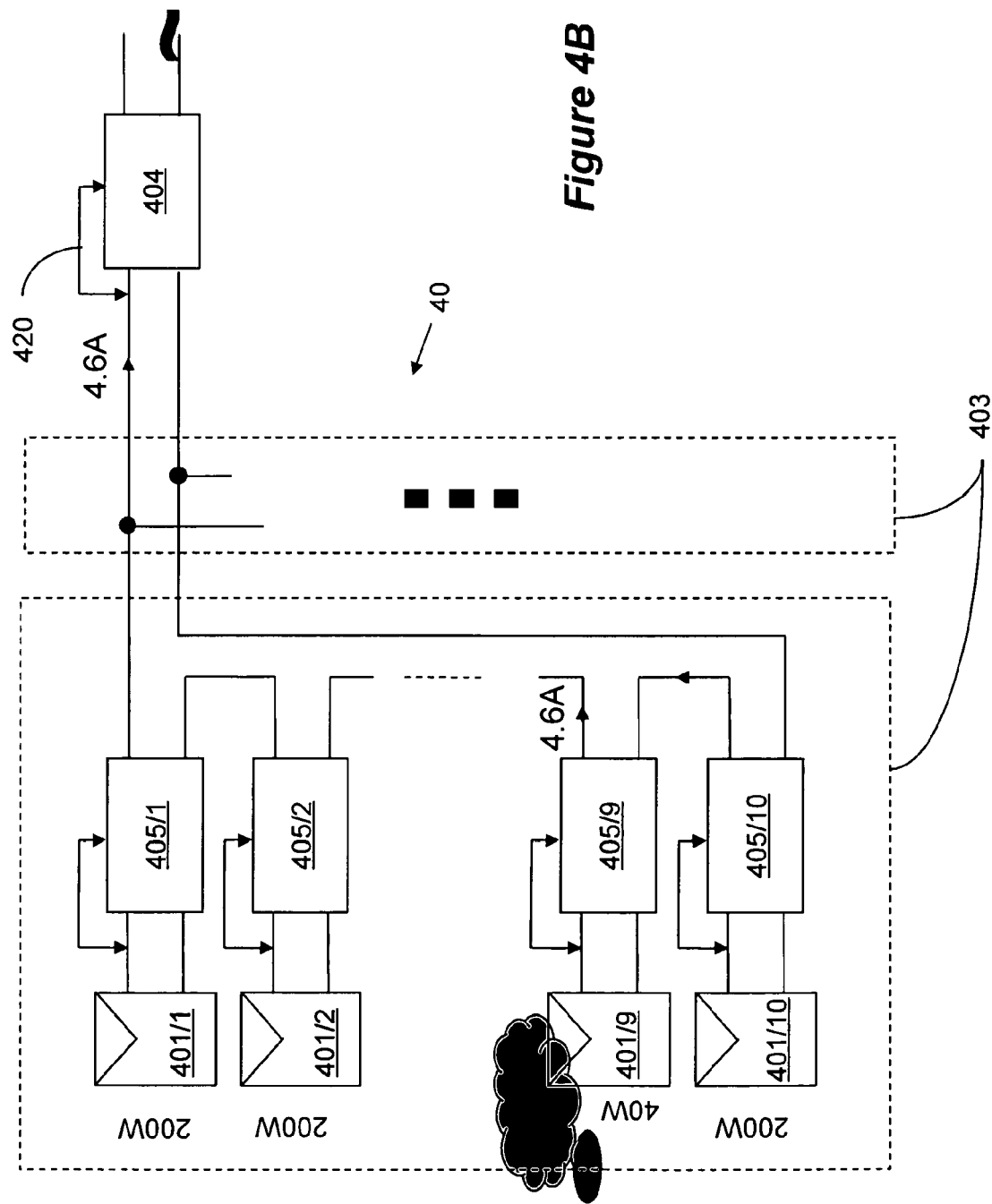

FIGS. 4A and 4B illustrate the operation of the system of FIG. 3 under different conditions, according to aspects of the invention. The exemplary configuration 40 is similar to configuration 30 of FIG. 3. In the example shown, ten DC power sources 401/1 through 401/10 are connected to ten power converters 405/1 through 405/10, respectively. The modules formed by the DC power sources and their corresponding converters are coupled together in series to form a string 403. In one aspect of the invention, the series-connected converters 405 are coupled to a DC-to-AC inverter 404.

The DC power sources may be solar panels and the example is discussed with respect to solar panels as one illustrative case. Each solar panel 401 may have a different power output due to manufacturing tolerances, shading, or other factors. For the purpose of the present example, an ideal case is illustrated in FIG. 4A, where efficiency of the DC-to-DC conversion is assumed to be 100% and the panels 501 are assumed to be identical. In some aspects of the invention, efficiencies of the converters may be quite high and range at about 95%-99%. So, the assumption of 100% efficiency is not unreasonable for illustration purposes. Moreover, according to embodiments of the subject invention, each of the DC-DC converters are constructed as a power converter, i.e., it transfers to its output the entire power it receives in its input with very low losses.

Power output of each solar panel 401 is maintained at the maximum power point for the panel by a control loop within the corresponding power converter 405. In the example shown in FIG. 4A, all of the panels are exposed to full sun illumination and each solar panel 401 provides 200 W of power. Consequently, the MPPT loop will draw current and voltage level that will transfer the entire 200 W from the panel to its associated converter. That is, the current and voltage dictated by the MPPT form the input current $I_{in}$, and input voltage $V_{in}$, to the converter. The output voltage is dictated by the constant voltage set at the inverter 404, as will be explained below. The output current $I_{out}$ would then be the total power, i.e., 200 W, divided by the output voltage $V_{Out}$.

As noted above, according to a feature of the invention, the input voltage to inverter 404 is controlled by the inverter (in this example, kept constant), by way of control loop 420. For the purpose of this example, assume the input voltage is kept as 400V (ideal value for inverting to 220 VAC). Since we assume that there are ten serially connected power converters, each providing 200 W, we can see that the input current to the inverter 404 is 2000 W/400V=5 A. Thus, the current flowing through each of the converters 401/1-401/10 must be 5 A. This means that in this idealized example each of the converters provides an output voltage of 200 W/5 A=40V. Now, assume that the MPPT for each panel (assuming perfect matching panels) dictates $V_{MPP}$=32V. This means that the input voltage to the inverter would be 32V, and the input current would be 200 W/32V=6.25 A.

We now turn to another example, wherein the system is still maintained at an ideal mode (i.e., perfectly matching DC sources and entire power is transferred to the inverter), but the environmental conditions are not ideal. For example, one DC source is overheating, is malfunctioning, or, as in the example of FIG. 4B, the ninth solar panel 401/9 is shaded and consequently produces only 40 W of power. Since we keep all other conditions as in the example of FIG. 4A, the other nine solar panels 401 are unshaded and still produce 200 W of power. The power converter 405/9 includes MPPT to maintain the solar panel 501/9 operating at the maximum power point, which is now lowered due to the shading.

The total power available from the string is now 9×200 W+40 W=1840 W. Since the input to the inverter is still maintained at 400V, the input current to the inverter will now be 1840 W/40V=4.6 A. This means that the output of all of the power converters 405/1-405/10 in the string must be at 4.6 A. Therefore, for the nine unshaded panels, the converters will output 200 W/4.6 A=43.5V. On the other hand, the converter 405/9 attached to the shaded panel 401/9 will output 40 W/4.6 A=8.7V. Checking the math, the input to the inverter can be obtained by adding nine converters providing 43.5V and one converter providing 8.7V, i.e., (9×43.5V)+8.7V=400V.

The output of the nine non-shaded panels would still be controlled by the MPPT as in FIG. 4A, thereby standing at 32V and 6.25 A. On the other hand, since the nines panel 401/9 is shaded, lets assume its MPPT dropped to 28V. Consequently, the output current of the ninth panel is 40

W/28V=1.43 A. As can be seen by this example, all of the panels are operated at their maximum power point, regardless of operating conditions. As shown by the example of FIG. 4B, even if the output of one DC source drops dramatically, the system still maintains relatively high power output by fixing the voltage input to the inverter, and controlling the input to the converters independently so as to draw power from the DC source at the MPP.

As can be appreciated, the benefit of the topology illustrated in FIGS. 4A and 4B are numerous. For example, the output characteristics of the serially connected DC sources, such as solar panels, need not match. Consequently, the serial string may utilize panels from different manufacturers or panels installed on different parts of the roofs (i.e., at different spatial orientation). Moreover, if several strings are connected in parallel, it is not necessary that the strings match; rather each string may have different panels or different number of panels. This topology also enhances reliability by alleviating the hot spot problem. That is, as shown in FIG. 4A the output of the shaded panel 401/9 is 1.43 A, while the current at the output of the unshaded panels is 6.25 A. This discrepancy in current when the components are series connected causes a large current being forced through the shaded panel that may cause overheating and malfunction at this component. However, by the inventive topology wherein the input voltage is set independently, and the power draw from each panel to its converter is set independently according to the panels MPP at each point in time, the current at each panel is independent on the current draw from the serially connected converters.

It is easily realized that since the power is optimized independently for each panel, panels could be installed in different facets and directions in BIPV installations. Thus, the problem of low power utilization in building-integrated installations is solved, and more installations may now be profitable.

The described system could also easily solve the problem of energy harvesting in low light conditions. Even small amounts of light are enough to make the converters 405 operational, and they then start transferring power to the inverter. If small amounts of power are available, there will be a low current flow—but the voltage will be high enough for the inverter to function, and the power will indeed be harvested.

According to aspects of the invention, the inverter 404 includes a control loop 420 to maintain an optimal voltage at the input of inverter 404. In the example of FIG. 4B, the input voltage to inverter 404 is maintained at 400V by the control loop 420. The converters 405 are transferring substantially all of the available power from the solar panels to the input of the inverter 404. As a result, the input current to the inverter 404 is dependent only on the power provided by the solar panels and the regulated set, i.e., constant, voltage at the inverter input.

The conventional inverter 104, shown in FIG. 1 and FIG. 3A, is required to have a very wide input voltage to accommodate for changing conditions, for example a change in luminance, temperature and aging of the solar array. This is in contrast to the inverter 404 that is designed according to aspects of the present invention. The inverter 404 does not require a wide input voltage and is therefore simpler to design and more reliable. This higher reliability is achieved, among other factors, by the fact that there are no voltage spikes at the input to the inverter and thus the components of the inverter experience lower electrical stress and may last longer.

When the inverter 404 is a part of the circuit, the power from the panels is transferred to a load that may be connected to the inverter. To enable the inverter 404 to work at its optimal input voltage, any excess power produced by the solar array, and not used by the load, is dissipated. Excess power may be handled by selling the excess power to the utility company if such an option is available. For off-grid solar arrays, the excess power may be stored in batteries. Yet another option is to connect a number of adjacent houses together to form a micro-grid and to allow load-balancing of power between the houses. If the excess power available from the solar array is not stored or sold, then another mechanism may be provided to dissipate excess power.

Figure 4C:
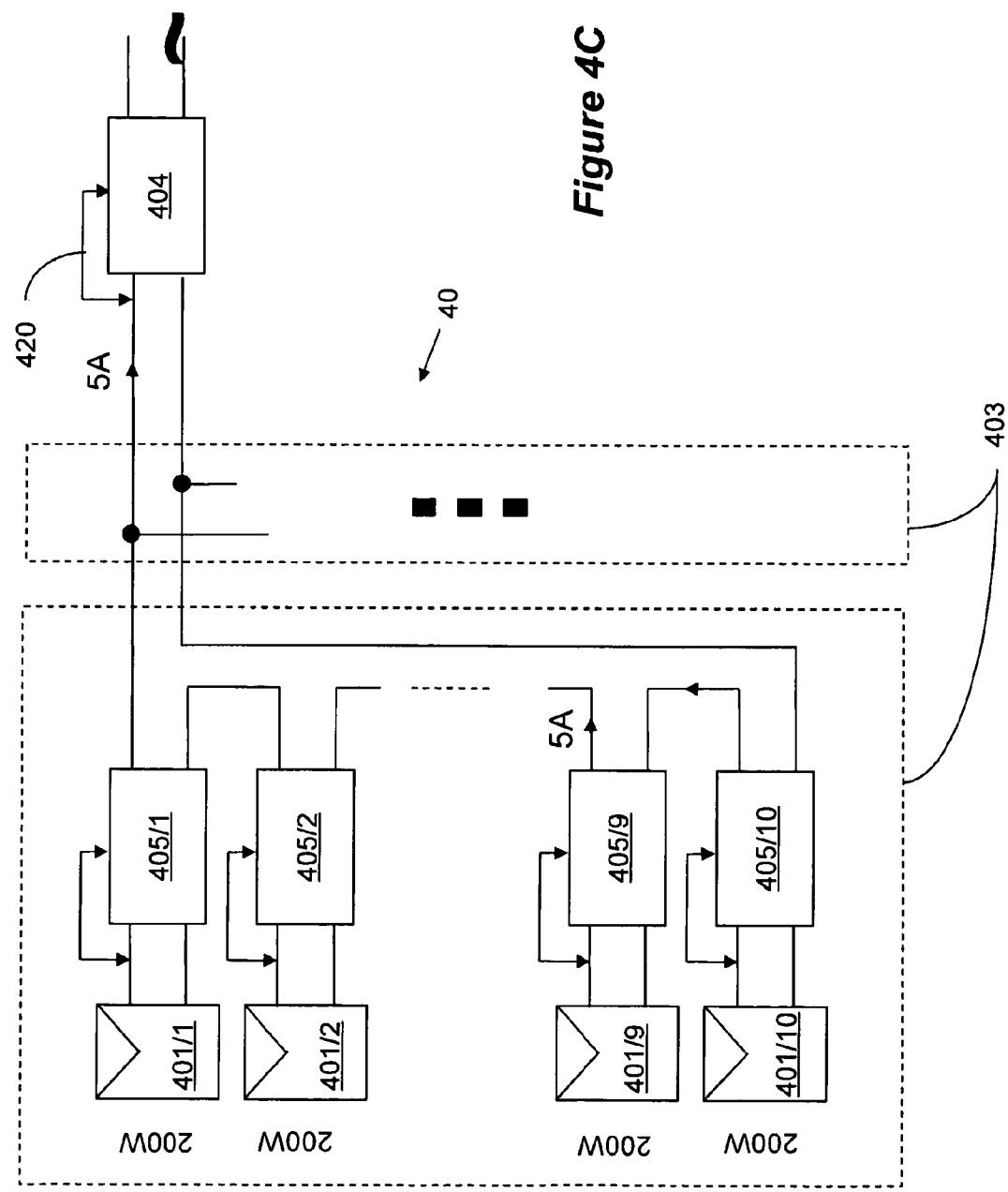
FIG. 4C illustrates an embodiment of the invention wherein the inverter controls the input current.

The features and benefits explained with respect to FIGS. 4A and 4B stem, at least partially, from having the inverter dictates the voltage provided at its input. Conversely, a design can be implemented wherein the inverter dictates the current at its input. Such an arrangement is illustrated in FIG. 4C. FIG. 4C illustrates an embodiment of the invention wherein the inverter controls the input current. Power output of each solar panel 401 is maintained at the maximum power point for the panel by a control loop within the corresponding power converter 405. In the example shown in FIG. 4C, all of the panels are exposed to full sun illumination and each solar panel 401 provides 200 W of power. Consequently, the MPPT loop will draw current and voltage level that will transfer the entire 200 W from the panel to its associated converter. That is, the current and voltage dictated by the MPPT form the input current $I_{in}$, and input voltage $V_{in}$ to the converter. The output voltage is dictated by the constant current set at the inverter 404, as will be explained below. The output voltage $V_{out}$ would then be the total power, i.e., 200 W, divided by the output current $I_{out}$.

As noted above, according to a feature of the invention, the input current to inverter 404 is dictated by the inverter by way of control loop 420. For the purpose of this example, assume the input current is kept as 5 A. Since we assume that there are ten serially connected power converters, each providing 200 W, we can see that the input voltage to the inverter 404 is 2000 W/5 A=400V. Thus, the current flowing through each of the converters 401/1-401/10 must be 5 A. This means that in this idealized example each of the converters provides an output voltage of 200 W/5 A=40V. Now, assume that the MPPT for each panel (assuming perfect matching panels) dictates $V_{MPP}$=32V. This means that the input voltage to the inverter would be 32V, and the input current would be 200 W/32V=6.25 A.

Consequently, similar advantages have been achieved by having the inverter control the current, rather than the voltage. However, unlike the prior art, changes in the output of the panels will not cause in changes in the current flowing to the inverter, as that is dictated by the inverter itself. Therefore, if the inverter is designed to keep the current or the voltage constant, then regardless of the operation of the panels, the current or voltage to the inverter will remain constant.

Figure 5:
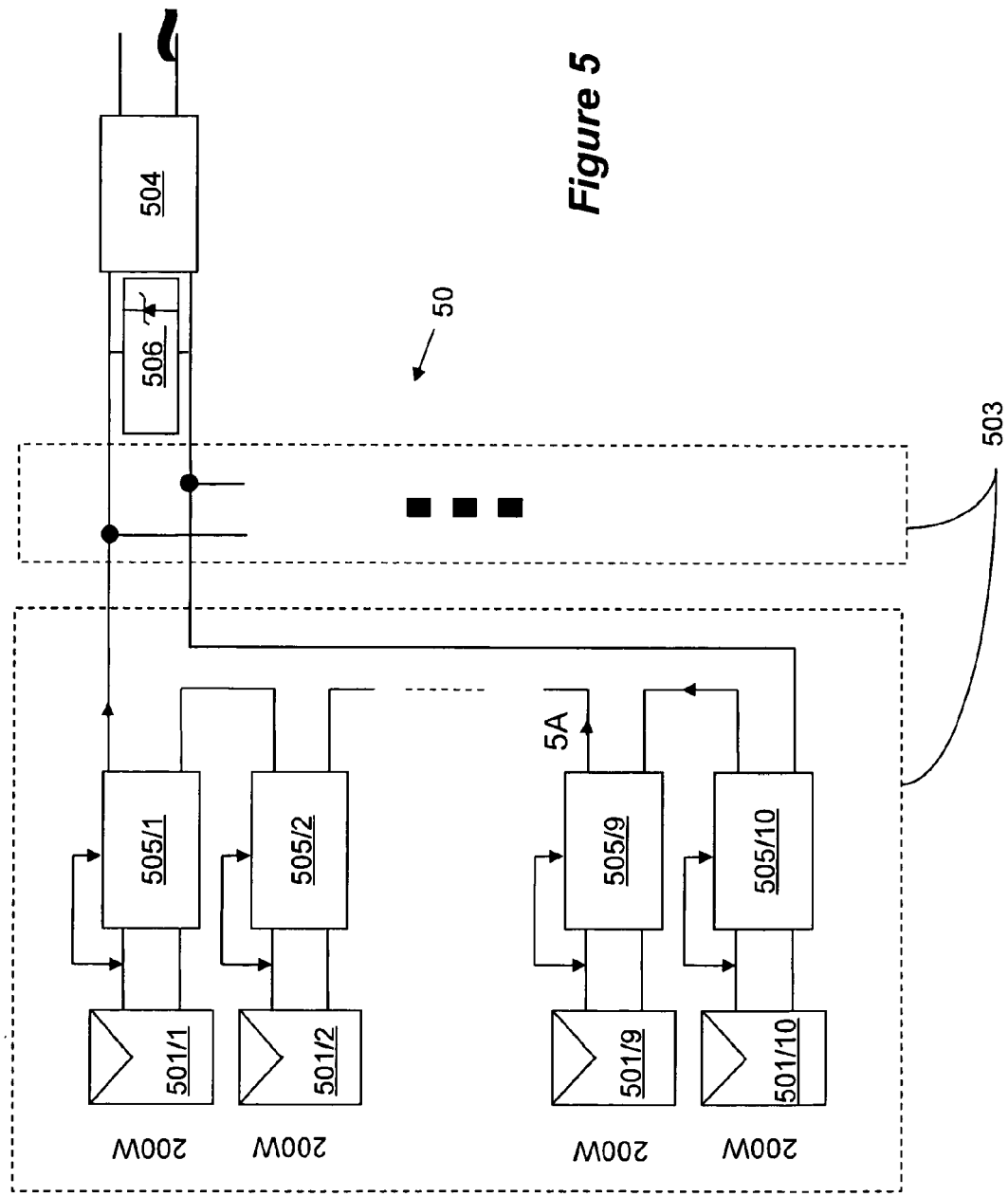
FIG. 5 illustrates a distributed power harvesting system, according to other aspects of the invention, using DC power sources.

FIG. 5 illustrates a distributed power harvesting system, according to other aspects of the invention, using DC power sources. FIG. 5 illustrates multiple strings 503 coupled together in parallel. Each of the strings is a series connection of multiple modules and each of the modules includes a DC power source 501 that is coupled to a converter 505. The DC power source may be a solar panel. The output of the parallel connection of the strings 503 is connected, again in parallel, to a shunt regulator 506 and a load controller 504. The load controller 504 may be an inverter as with the embodiments of FIGS. 4A and 4B. Shunt regulators automatically maintain a constant voltage across its terminals. The shunt regulator 506 is configured to dissipate excess power to maintain the input voltage at the input to the inverter 504 at a regulated level and prevent the inverter input voltage from increasing. The current which flows through shunt regulator 506 complements the current drawn by inverter 504 in order to ensure that the input voltage of the inverter is maintained at a constant level, for example at 400V.

By fixing the inverter input voltage, the inverter input current is varied according to the available power draw. This current is divided between the strings 503 of the series connected converters. When each converter includes a controller loop maintaining the converter input voltage at the maximum power point of the associated DC power source, the output power of the converter is determined. The converter power and the converter output current together determine the converter output voltage. The converter output voltage is used by a power conversion circuit in the converter for stepping up or stepping down the converter input voltage to obtain the converter output voltage from the input voltage as determined by the MPPT.

Figure 6:
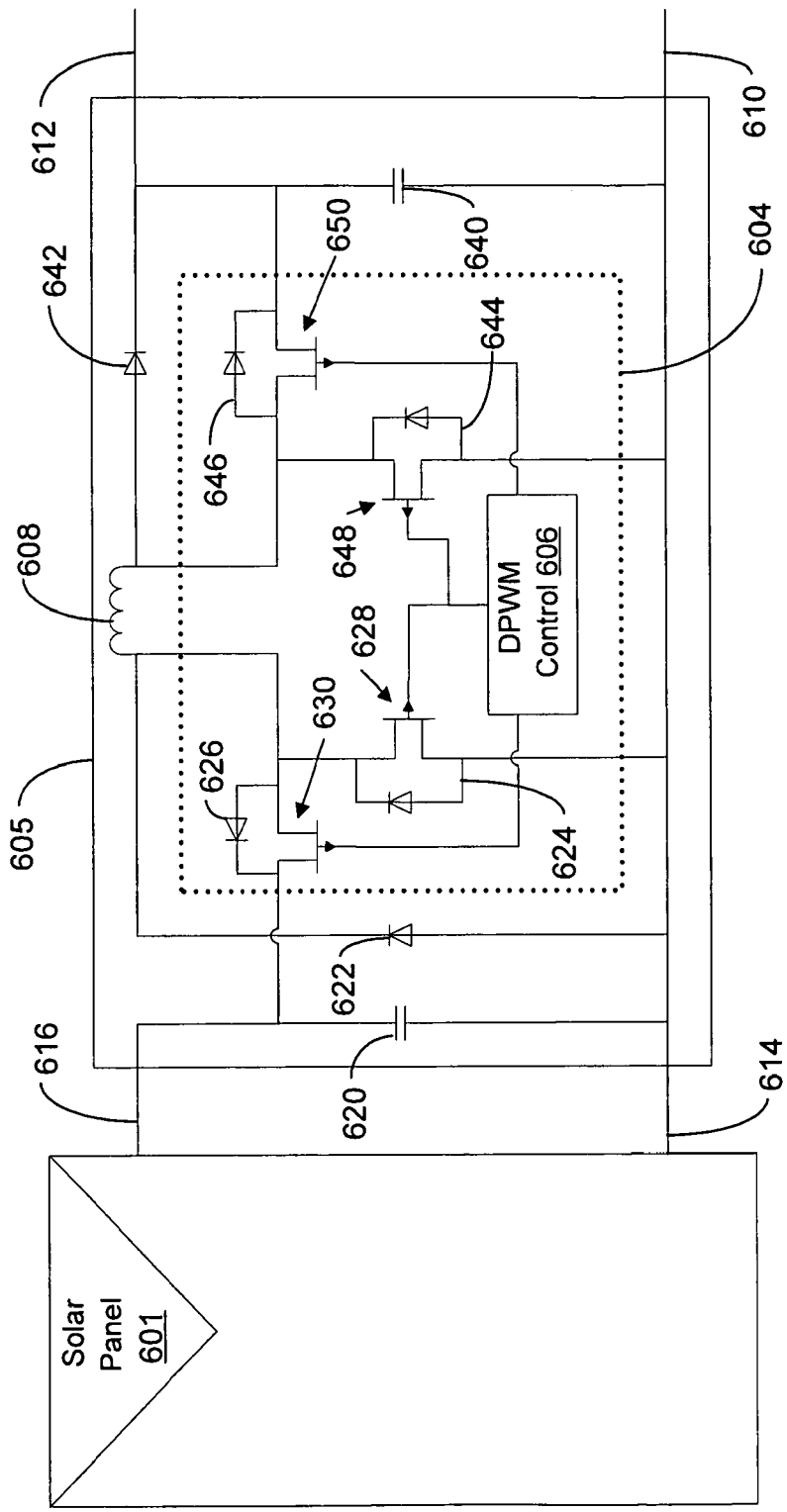
FIG. 6 illustrates an exemplary DC-to-DC converter according to aspects of the invention.

FIG. 6 illustrates an exemplary DC-to-DC converter 605 according to aspects of the invention. DC-to-DC converters are conventionally used to either step down or step up a varied or constant DC voltage input to a higher or a lower constant voltage output, depending on the requirements of the circuit. However, in the embodiment of FIG. 6 the DC-DC converter is used as a power converter, i.e., transferring the input power to output power, the input voltage varying according to the MPPT, while the output current being dictated by the constant input voltage to the inverter. That is, the input voltage and current may vary at any time and the output voltage and current may vary at any time, depending on the operating condition of the DC power sources.

The converter 605 is connected to a corresponding DC power source 601 at input terminals 614 and 616. The converted power of the DC power source 601 is output to the circuit through output terminals 610, 612. Between the input terminals 614, 616 and the output terminals 610, 612, the remainder of the converter circuit is located that includes input and output capacitors 620, 640, back flow prevention diodes 622, 642 and a power conversion circuit including a controller 606 and an inductor 608.

The inputs 616 and 614 are separated by a capacitor 620 which acts as an open to a DC voltage. The outputs 610 and 612 are also separated by a capacitor 640 that also acts an open to DC output voltage. These capacitors are DC-blocking or AC-coupling capacitors that short when faced with alternating current of a frequency for which they are selected. Capacitor 640 coupled between the outputs 610, 612 and also operates as a part of the power conversion circuit discussed below.

Diode 642 is coupled between the outputs 610 and 612 with a polarity such that current may not backflow into the converter 605 from the positive lead of the output 612. Diode 622 is coupled between the positive output lead 612 through inductor 608 which acts a short for DC current and the negative input lead 614 with such polarity to prevent a current from the output 612 to backflow into the solar panel 601.

The DC power sources 601 may be solar panels. A potential difference exists between the wires 614 and 616 due to the electron-hole pairs produced in the solar cells of panel 601. The converter 605 maintains maximum power output by extracting current from the solar panel 601 at its peak power point by continuously monitoring the current and voltage provided by the panel and using a maximum power point tracking algorithm. The controller 606 includes an MPPT circuit or algorithm for performing the peak power tracking. Peak power tracking and pulse width modulation, PWM, are performed together to achieve the desired input voltage and current. The MPPT in the controller 606 may be any conventional MPPT, such as, e.g., perturb and observe (P&O), incremental conductance, etc. However, notably the MPPT is performed on the panel directly, i.e., at the input to the converter, rather than at the output of the converter. The generated power is then transferred to the output terminals 610 and 612. The outputs of multiple converters 605 may be connected in series, such that the positive lead 612 of one converter 605 is connected to the negative lead 610 of the next converter 605.

In FIG. 6, the converter 605 is shown as a buck plus boost converter. The term "buck plus boost" as used herein is a buck converter directly followed by a boost converter as shown in FIG. 6, which may also appear in the literature as "cascaded buck-boost converter". If the voltage is to be lowered, the boost portion is substantially shorted. If the voltage is to be raised, the buck portion is substantially shorted. The term "buck plus boost" differs from buck/boost topology which is a classic topology that may be used when voltage is to be raised or lowered. The efficiency of "buck/boost" topology is inherently lower then a buck or a boost. Additionally, for given requirements, a buck-boost converter will need bigger passive components then a buck plus boost converter in order to function. Therefore, the buck plus boost topology of FIG. 6 has a higher efficiency than the buck/boost topology. However, the circuit of FIG. 6 continuously decides whether it is bucking or boosting. In some situations when the desired output voltage is similar to the input voltage, then both the buck and boost portions may be operational.

The controller 606 may include a pulse width modulator, PWM, or a digital pulse width modulator, DPWM, to be used with the buck and boost converter circuits. The controller 606 controls both the buck converter and the boost converter and determines whether a buck or a boost operation is to be performed. In some circumstances both the buck and boost portions may operate together. That is, as explained with respect to the embodiments of FIGS. 4A and 4B, the input voltage and current are selected independently of the selection of output current and voltage. Moreover, the selection of either input or output values may change at any given moment depending on the operation of the DC power sources. Therefore, in the embodiment of FIG. 6 the converter is constructed so that at any given time a selected value of input voltage and current may be up converted or down converted depending on the output requirement.

In one implementation, an integrated circuit (IC) 604 may be used that incorporates some of the functionality of converter 605. IC 604 is optionally a single ASIC able to withstand harsh temperature extremes present in outdoor solar installations. ASIC 604 may be designed for a high mean time between failures (MTBF) of more than 25 years. However, a discrete solution using multiple integrated circuits may also be used in a similar manner. In the exemplary embodiment shown in FIG. 6, the buck plus boost portion of the converter 605 is implemented as the IC 604. Practical considerations may lead to other segmentations of the system. For example, in one aspect of the invention, the IC 604 may include two ICs, one analog IC which handles the high currents and voltages in the system, and one simple low-voltage digital IC which includes the control logic. The analog IC may be implemented using power FETs which may alternatively be implemented in discrete components, FET drivers, A/Ds, and the like. The digital IC may form the controller 606.

In the exemplary circuit shown, the buck converter includes the input capacitor 620, transistors 628 and 630 a diode 622 positioned in parallel to transistor 628, and an inductor 608. The transistors 628, 630 each have a parasitic body diode 624, 626. In the exemplary circuit shown, the boost converter includes the inductor 608, which is shared with the buck converter, transistors 648 and 650 a diode 642 positioned in parallel to transistor 650, and the output capacitor 640. The transistors 648, 650 each have a parasitic body diode 644, 646.

As shown in FIG. 1, adding electronic elements in the series arrangement may reduce the reliability of the system, because if one electrical component breaks it may affect the entire system. Specifically, if a failure in one of the serially connected elements causes an open circuit in the failed element, current ceases to flow through the entire series, thereby causing the entire system to stop function. Aspects of the present invention provide a converter circuit where electrical elements of the circuit have one or more bypass routes associated with them that carry the current in case of the electrical element fails. For example, each switching transistor of either the buck or the boost portion of the converter has its own bypass. Upon failure of any of the switching transistors, that element of the circuit is bypassed. Also, upon inductor failure, the current bypasses the failed inductor through the parasitic diodes of the transistor used in the boost converter.

Figure 7:
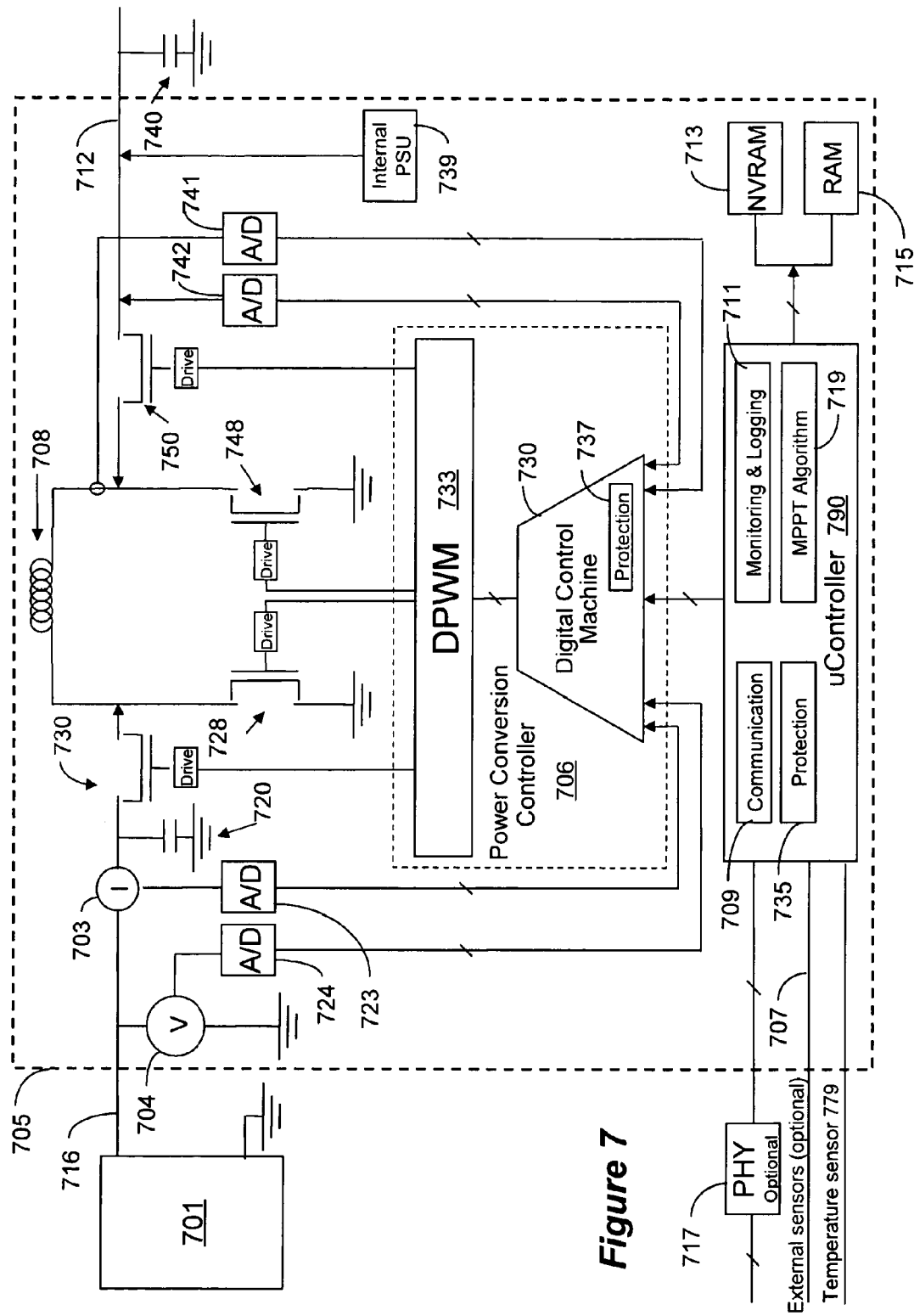
FIG. 7 illustrates a power converter, according to aspects of the invention including control features of the aspects of the invention.

FIG. 7 illustrates a power converter, according to aspects of the invention. FIG. 7 highlights, among others, a monitoring and control functionality of a DC-to-DC converter 705, according to embodiments of the present invention. A DC voltage source 701 is also shown in the figure. Portions of a simplified buck and boost converter circuit are shown for the converter 705. The portions shown include the switching transistors 728, 730, 748 and 750 and the common inductor 708. Each of the switching transistors is controlled by a power conversion controller 706.

The power conversion controller 706 includes the pulse-width modulation (PWM) circuit 733, and a digital control machine 730 including a protection portion 737. The power conversion controller 706 is coupled to microcontroller 790, which includes an MPPT module 719, and may also optionally include a communication module 709, a monitoring and logging module 711, and a protection module 735.

A current sensor 703 may be coupled between the DC power source 701 and the converter 705, and output of the current sensor 703 may be provided to the digital control machine 730 through an associated analog to digital converter 723. A voltage sensor 704 may be coupled between the DC power source 701 and the converter 705 and output of the voltage sensor 704 may be provided to the digital control machine 730 through an associated analog to digital converter 724. The current sensor 703 and the voltage sensor 704 are used to monitor current and voltage output from the DC power source, e.g., the solar panel 701. The measured current and voltage are provided to the digital control machine 730 and are used to maintain the converter input power at the maximum power point.

The PWM circuit 733 controls the switching transistors of the buck and boost portions of the converter circuit. The PWM circuit may be a digital pulse-width modulation (DPWM) circuit. Outputs of the converter 705 taken at the inductor 708 and at the switching transistor 750 are provided to the digital control machine 730 through analog to digital converters 741, 742, so as to control the PWM circuit 733.

A random access memory (RAM) module 715 and a non-volatile random access memory (NVRAM) module 713 may be located outside the microcontroller 790 but coupled to the microcontroller 790. A temperature sensor 779 and one or more external sensor interfaces 707 may be coupled to the microcontroller 790. The temperature sensor 779 may be used to measure the temperature of the DC power source 701. A physical interface 717 may be coupled to the microcontroller 790 and used to convert data from the microcontroller into a standard communication protocol and physical layer. An internal power supply unit 739 may be included in the converter 705.

In various aspects of the invention, the current sensor 703 may be implemented by various techniques used to measure current. In one aspect of the invention, the current measurement module 703 is implemented using a very low value resistor. The voltage across the resistor will be proportional to the current flowing through the resistor. In another aspect of the invention, the current measurement module 703 is implemented using current probes which use the Hall Effect to measure the current through a conductor without adding a series resistor. After translating the current to voltage, the data may be passed through a low pass filter and then digitized. The analog to digital converter associated with the current sensor 703 is shown as the A/D converter 723 in FIG. 7. Aliasing effect in the resulting digital data may be avoided by selecting an appropriate resolution and sample rate for the analog to digital converter. If the current sensing technique does not require a series connection, then the current sensor 703 may be connected to the DC power source 701 in parallel.

In one aspect of the invention, the voltage sensor 704 uses simple parallel voltage measurement techniques in order to measure the voltage output of the solar panel. The analog voltage is passed through a low pass filter in order to minimize aliasing. The data is then digitized using an analog to digital converter. The analog to digital converter associated with the voltage sensor 704 are shown as the A/D converter 724 in FIG. 7. The A/D converter 724 has sufficient resolution to generate an adequately sampled digital signal from the analog voltage measured at the DC power source 701 that may be a solar panel.

The current and voltage data collected for tracking the maximum power point at the converter input may be used for monitoring purposes also. An analog to digital converter with sufficient resolution may correctly evaluate the panel voltage and current. However, to evaluate the state of the panel, even low sample rates may be sufficient. A low-pass filter makes it possible for low sample rates to be sufficient for evaluating the state of the panel. The current and voltage date may be provided to the monitoring and logging module 711 for analysis.

The temperature sensor 779 enables the system to use temperature data in the analysis process. The temperature is indicative of some types of failures and problems. Furthermore, in the case that the power source is a solar panel, the panel temperature is a factor in power output production.

The one or more optional external sensor interfaces 707 enable connecting various external sensors to the converter 705. External sensors are optionally used to enhance analysis of the state of the solar panel 701, or a string or an array formed by connecting the solar panels 701. Examples of external sensors include ambient temperature sensors, solar radiance sensors, and sensors from neighboring panels.

External sensors may be integrated into the converter 705 instead of being attached externally.

In one aspect of the invention, the information acquired from the current and voltage sensors 703, 704 and the optional temperature and external sensors 705, 707 may be transmitted to a central analysis station for monitoring, control, and analysis using the communications interface 709. The central analysis station is not shown in the figure. The communication interface 709 connects a microcontroller 790 to a communication bus.

The communication bus can be implemented in several ways. In one aspect of the invention, the communication bus is implemented using an off-the-shelf communication bus such as Ethernet or RS422. Other methods such as wireless communications or power line communications, which could be implemented on the power line connecting the panels, may also be used. If bidirectional communication is used, the central analysis station may request the data collected by the microcontroller 790. Alternatively or in addition, the information acquired from sensors 703, 704, 705, 707 is logged locally using the monitoring and logging module 711 in local memory such as the RAM 715 or the NVRAM 713.

Analysis of the information from sensors 703, 704, 705, 707 enables detection and location of many types of failures associated with power loss in solar arrays. Smart analysis can also be used to suggest corrective measures such as cleaning or replacing a specific portion of the solar array. Analysis of sensor information can also detect power losses caused by environmental conditions or installation mistakes and prevent costly and difficult solar array testing.

Consequently, in one aspect of the invention, the microcontroller 790 simultaneously maintains the maximum power point of input power to the converter 705 from the attached DC power source or solar panel 701 based on the MPPT algorithm in the MPPT module 719 and manages the process of gathering the information from sensors 703, 704, 705, 707. The collected information may be stored in the local memory 713, 715 and transmitted to an external central analysis station. In one aspect of the invention, the microcontroller 790 uses previously defined parameters stored in the NVRAM 713 in order to operate. The information stored in the NVRAM 713 may include information about the converter 705 such as serial number, the type of communication bus used, the status update rate and the ID of the central analysis station. This information may be added to the parameters collected by the sensors before transmission.

The converters 705 may be installed during the installation of the solar array or retrofitted to existing installations. In both cases, the converters 705 may be connected to a panel junction connection box or to cables connecting the panels 701. Each converter 705 may be provided with the connectors and cabling to enable easy installation and connection to solar panels 701 and panel cables.

In one aspect of the invention, the physical interface 717 is used to convert to a standard communication protocol and physical layer so that during installation and maintenance, the converter 705 may be connected to one of various data terminals, such as a computer or PDA. Analysis may then be implemented as software which will be run on a standard computer, an embedded platform or a proprietary device.

The installation process of the converters 705 includes connecting each converter 705 to a solar panel 701. One or more of the sensors 703, 704, 705, 707 may be used to ensure that the solar panel 701 and the converter 705 are properly coupled together. During installation, parameters such as serial number, physical location and the array connection topology may be stored in the NVRAM 713. These parameters may be used by analysis software to detect future problems in solar panels 701 and arrays.

When the DC power sources 701 are solar panels, one of the problems facing installers of photovoltaic solar panel arrays is safety. The solar panels 701 are connected in series during the day when there is sunlight. Therefore, at the final stages of installation, when several solar panels 701 are connected in series, the voltage across a string of panels may reach dangerous levels. Voltages as high as 600V are common in domestic installations. Thus, the installer faces a danger of electrocution. The converters 705 that are connected to the panels 701 may use built-in functionality to prevent such a danger. For example, the converters 705 may include circuitry or hardware of software safety module that limits the output voltage to a safe level until a predetermined minimum load is detected. Only after detecting this predetermined load, the microcontroller 790 ramps up the output voltage from the converter 705.

Another method of providing a safety mechanism is to use communications between the converters 705 and the associated inverter for the string or array of panels. This communication, that may be for example a power line communication, may provide a handshake before any significant or potentially dangerous power level is made available. Thus, the converters 705 would wait for an analog or digital release signal from the inverter in the associated array before transferring power to inverter.

The above methodology for monitoring, control and analysis of the DC power sources 701 may be implemented on solar panels or on strings or arrays of solar panels or for other power sources such as batteries and fuel cells.

Figure 8:
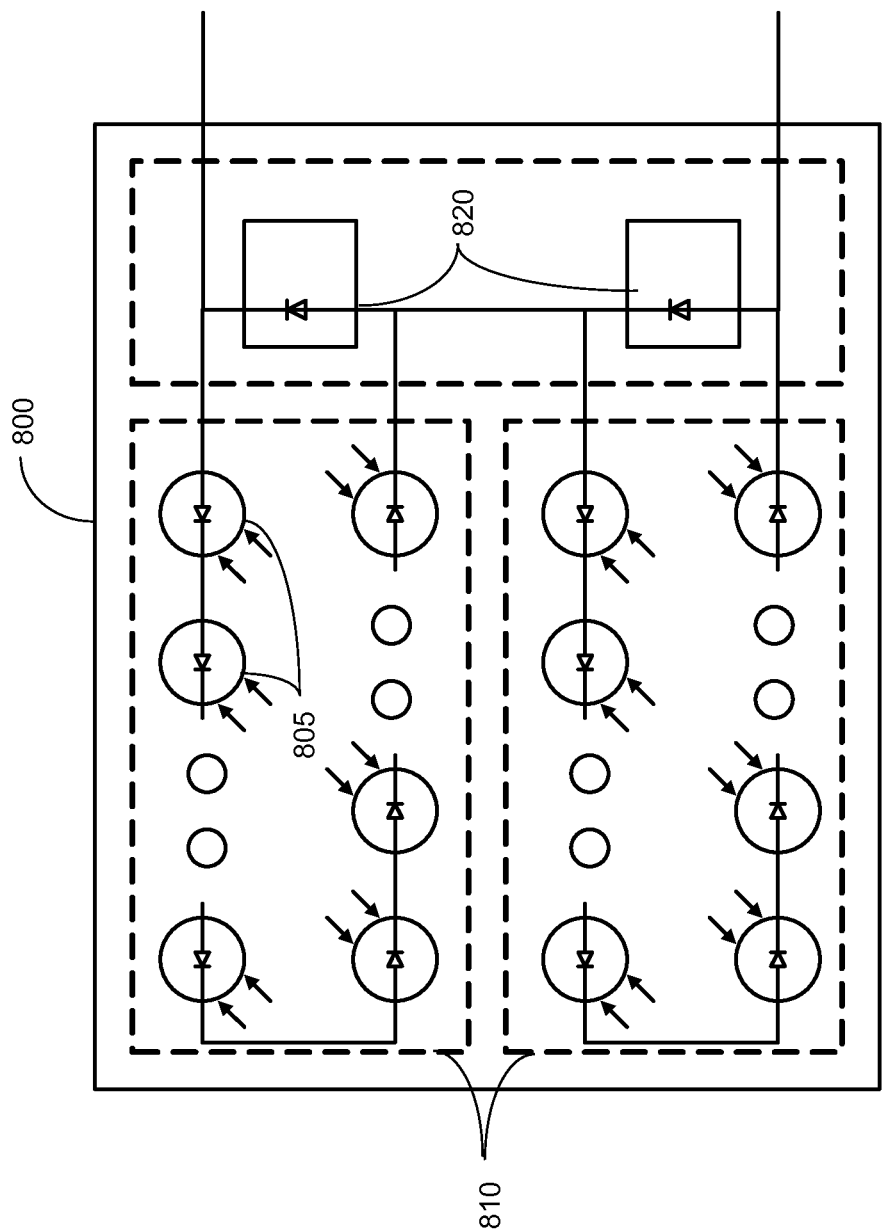
FIG. 8 illustrates an arrangement of a solar panel according to the prior art.

FIG. 8 illustrates an arrangement of a solar panel according to the prior art. In FIG. 8, solar panel 800 comprises solar cells 805, which are grouped into serially connected strings 810. The strings 810 are connected together in series. For each string 810, a bypass diode 820 is provided so that in the event of drop in power output of one string, that string may be bypassed via the respective diode 820 instead of having the cells enter a negative voltage region, which will lead to power dissipation across them and may cause them to burn. However, when current flows through the diodes, they dissipate energy. For example, if a current of 5 A flows through a conventional diode having 0.7 volt cut-in voltage, the loss is 3.5 W. In practice the loss may easily amount to 10 W.

Figure 9:
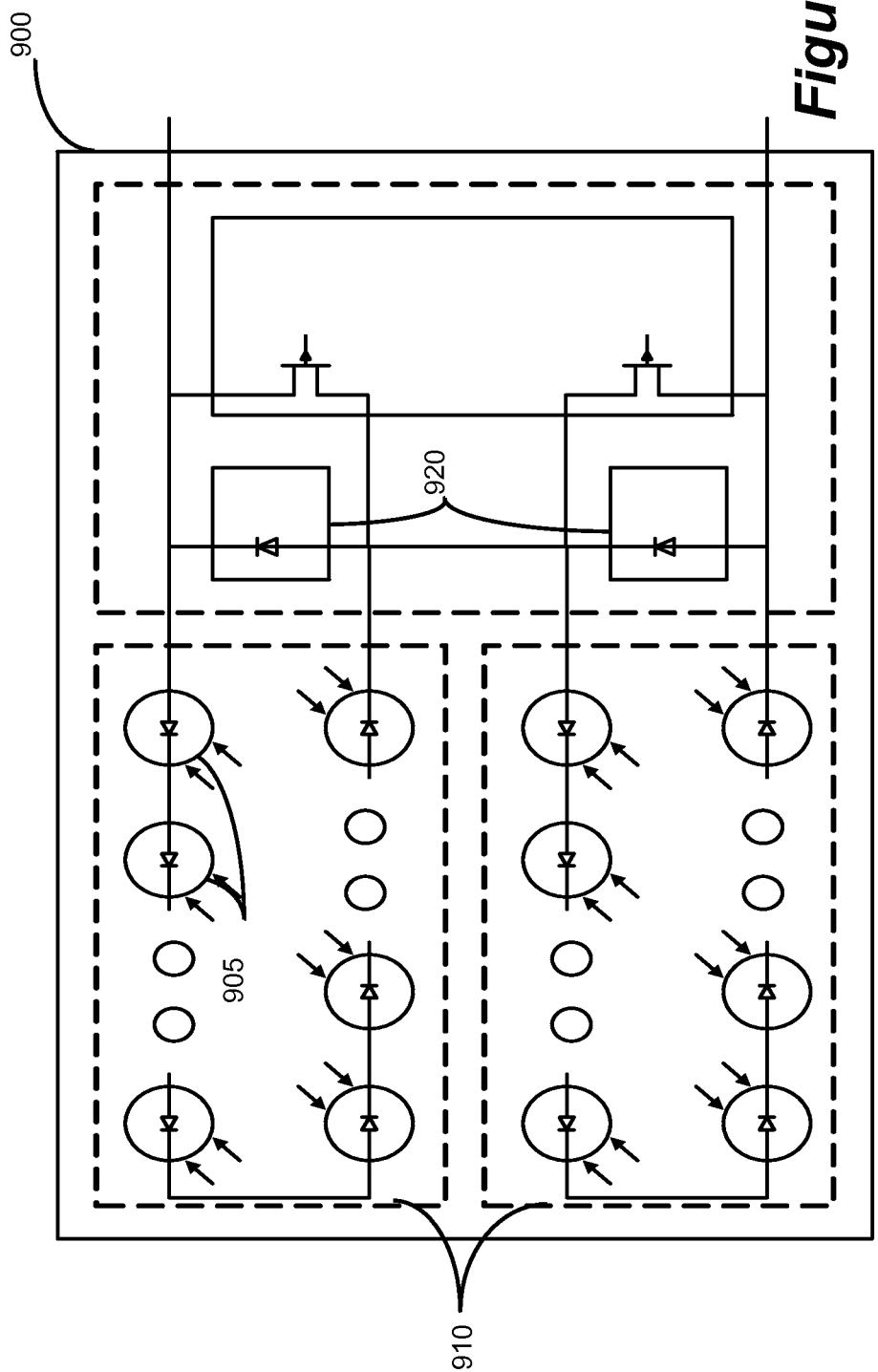
FIG. 9 illustrates an arrangement according to an embodiment of the invention for reducing the power loss in solar strings.

FIG. 9 illustrates an arrangement according to an embodiment of the invention for reducing the power loss in solar strings. In FIG. 9, the solar panel 900 is made of solar cells 905, which are grouped into serially connected strings 910. The strings 910 are connected together in series. For each string 910, a bypass diode 920 is provided so that in the event of drop in power output of one string, that string may be bypassed via the respective diode 920. Additionally, one switching device, such as FET or IGBT (insulated gate bipolar transistor), 925 is connected in a by-pass configuration so as to bypass the respective diode. Once it is sensed that current is flowing via one diode 920 (or once the voltage across string 910 is sensed to be negative), its respective switching device 925 is activated. This directs the current through the switching device, so that the loss of energy is drastically reduced. The sensing can be done by, for example, sensing the voltage across the string or the current across the diode.

Figure 10:
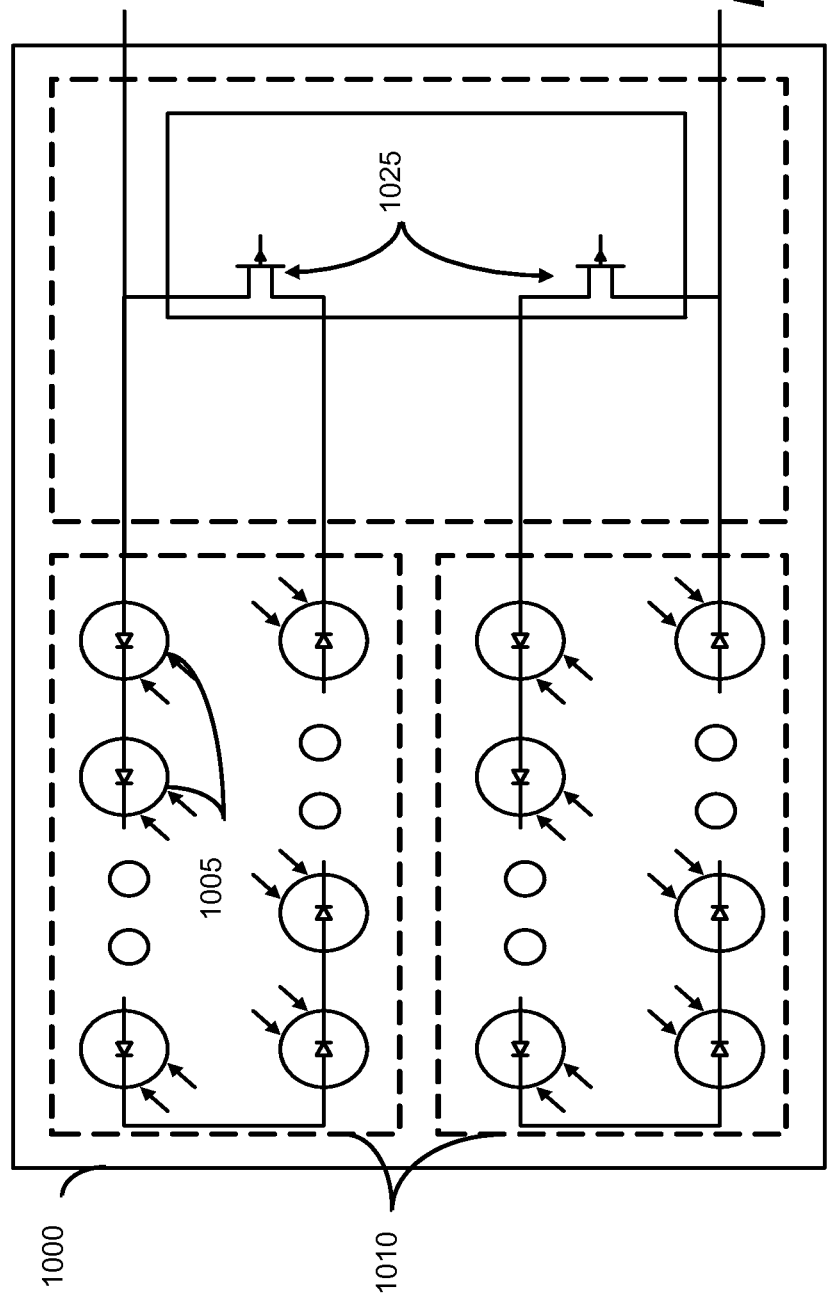
FIG. 10 illustrates another arrangement according to an embodiment of the invention for reducing the power loss in solar strings.

FIG. 10 illustrates another arrangement according to an embodiment of the invention for reducing the power loss in solar strings. In FIG. 10, the solar panel 1000 is made of solar cells 1005, which are grouped into serially connected strings 1010. The strings 1010 are connected together in parallel. For each string 1010, a bypass switching device 1025, such as FET or IGBT, is provided so that in the event of drop in power output of one string, that string may be bypassed via the respective switching device 1025. Once it is sensed that a string 1010 enters reverse bias (whether due to poor lighting or malfunction), the respective switching device 1025 is turned on so that current is flowing via its respective switching device 1025. The sensing can be done by, for example, sensing the voltage or current of the string.

Figure 11:
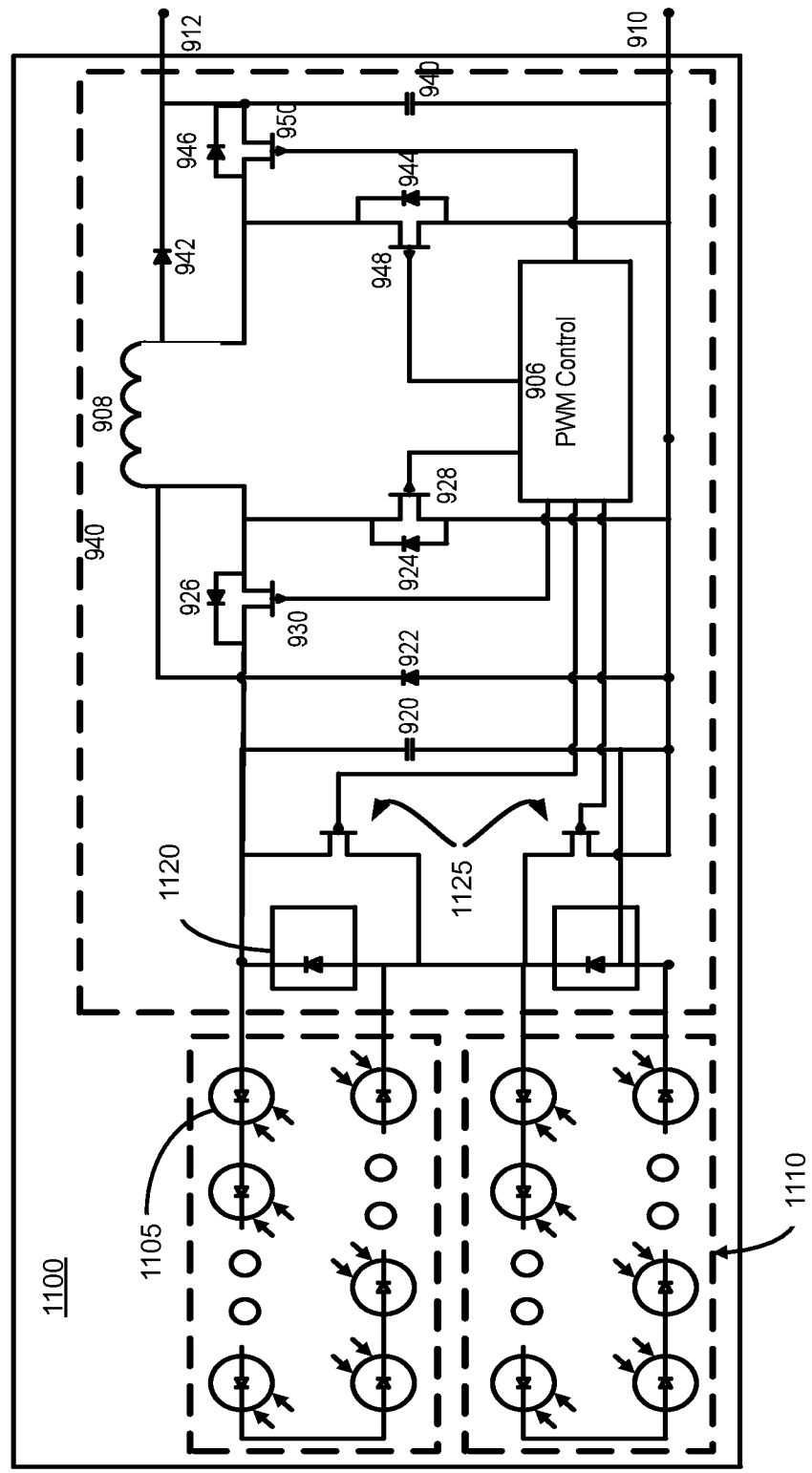
FIG. 11 illustrates an arrangement according to an embodiment of the invention for bypassing a solar string.

FIG. 11 illustrates an arrangement according to an embodiment of the invention for bypassing a solar string. That is, FIG. 11 illustrates how a converter, such as, for example, the converter of FIG. 6, may be utilized to trigger the bypass of the solar string and/or a diode coupled across a solar string. In FIG. 11, the solar panel 1100 are made of solar cells 1105, which are grouped into serially connected strings 1110. The strings 1110 are connected together in parallel. For each string 1110, a bypass diode 1120 is provided so that in the event of drop in power output of one string, that string may be bypassed via the respective diode 1120. However, as explained with respect to FIG. 10, the diodes may be eliminated. Additionally, one switching device, such as FET or IGBT, 1125 is connected in a by-pass configuration so as to bypass the respective string 1110 and/or diode 1120. Once it is sensed that a solar string enters reverse bias, its respective switching device 1125 is activated by the controller 906. This directs the current through the switching device 1125, so that the loss of energy is drastically reduced. The sensing can be done by, for example, sensing the voltage across the string or the current across the diode, as explained with respect to elements 703 and 704 of FIG. 7.

According to different embodiments of the present invention a number of DC power sources or solar panels are cascaded together in serial and/or parallel connections and the cascade of solar panels is integrated with an electronics circuit which performs one or more functions such as maximum power point tracking (MPPT), power conversion, control and monitoring functions. In cases where solar panels are of relatively low power, such as small panels for building-integrated photovoltaic (BIPV) technology, thin-film solar panels manufactured by thin film deposition, or small concentrating photovoltaic elements (CPV), a system design with a number of solar panels interconnected or cascaded together may reduce overall cost of the electronics circuit per installed Watt. Furthermore, the use of a single converter may improve system power efficiency by reducing self-consumption of the system (since there is only one converter consuming power for numerous solar panels, rather then one converter per panel). Photovoltaic panels may be cascaded in parallel, since typically small panels utilize smaller cells, which means each smaller panel outputs a voltage similar to larger solar panels, but at low currents. Similarly, thin film panels typically have low output currents.

Figure 12:
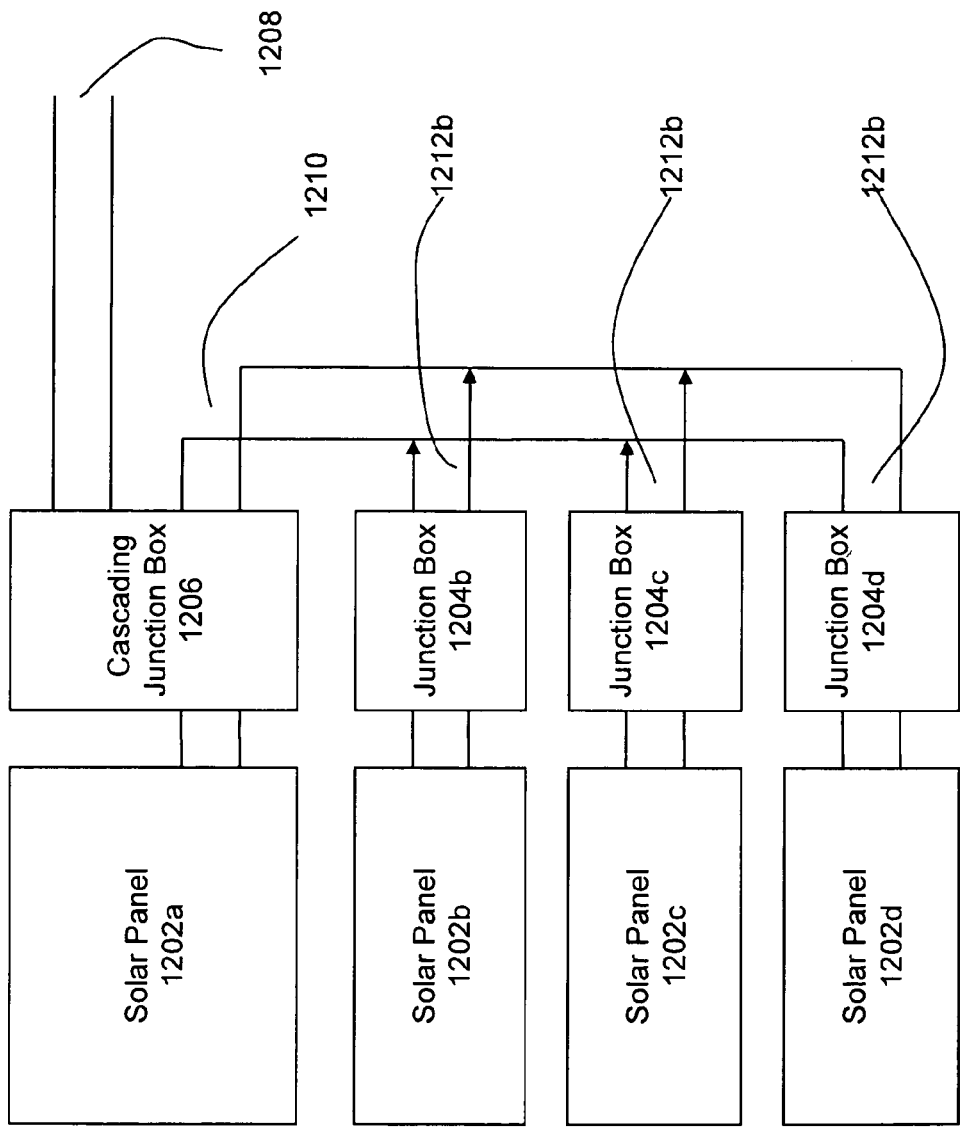
FIG. 12 illustrates a simplified cascaded system according to an embodiment of the present invention.

Reference is now made to FIG. 12, which illustrates a simplified system according to an embodiment of the present invention. A cascading junction box 1206 connects to four solar panels 1202a-1202d cascaded in parallel. One panel 1202a connects directly to junction box 1206, while other panels 1202b, 1202c, and 1202d connect in parallel with external cabling via respective junction boxes 1204b, 1204c, and 1204d to input connectors 1210. The cascading of solar panels 1202b, 1202c and 1202d is may be alternatively performed with the respective parallel connections being implemented inside respective junction boxes 1204b, 1204c and 12041 (not as shown in FIG. 12). Output cables 1208 (or connectors) may be used to connect panels 1202a-1202d (which may be considered an electronic equivalent to a single larger panel) to other similar cascaded panels or solar panels 101, 201, 301, 401, 501 in a standard manner to form a photovoltaic installation.

Figure 13:
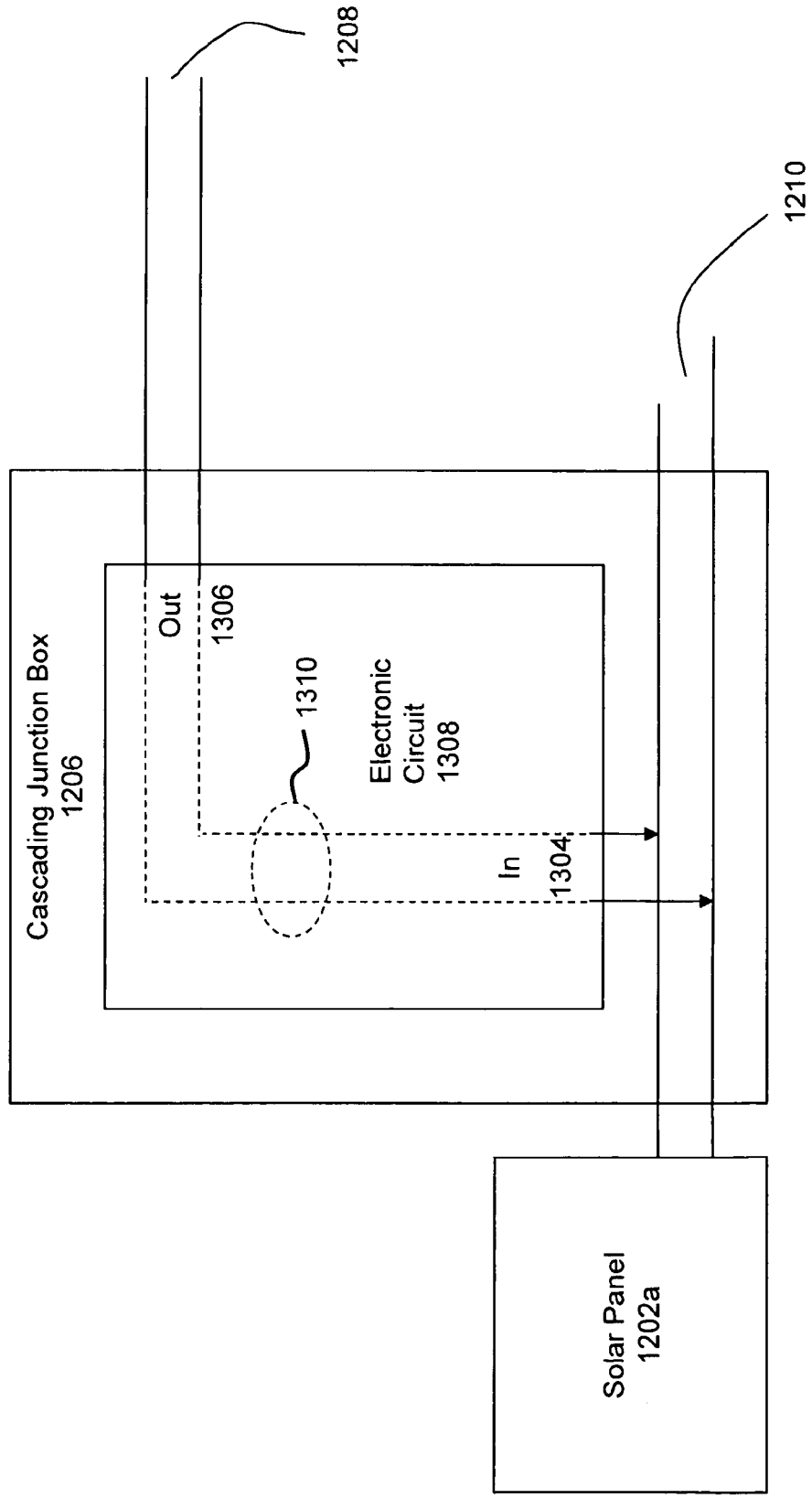
FIG. 13 illustrates in more detail cascading junction box according to embodiments of the present invention

FIG. 13 illustrates in more detail cascading junction box 1206 according to an embodiment of the present invention. Cascading junction box 1206 has an electronic circuit 1308, which is for example the same as or includes power converters 305, 405 and 505 used in conjunction with solar panels 301, 401, 501. Input 1304 of electronic circuit 1308 connect in parallel with solar panel 1202a. The connection between input 1304 and solar panel 1202a also provides the downstream input connection 1210 of cascading junction box 1206. Electronic circuit 1308 has an output 1306; output 1306 provides upstream output connection 1208 of cascading junction box 1206. In cases where electronic circuit 1308 is retrofit or otherwise not immediately required a two wire bypass link 1310 is connectable inside cascading junction boxes 1206 between upstream output connector 1208 and downstream input connector 1210 instead.

Figure 14A:
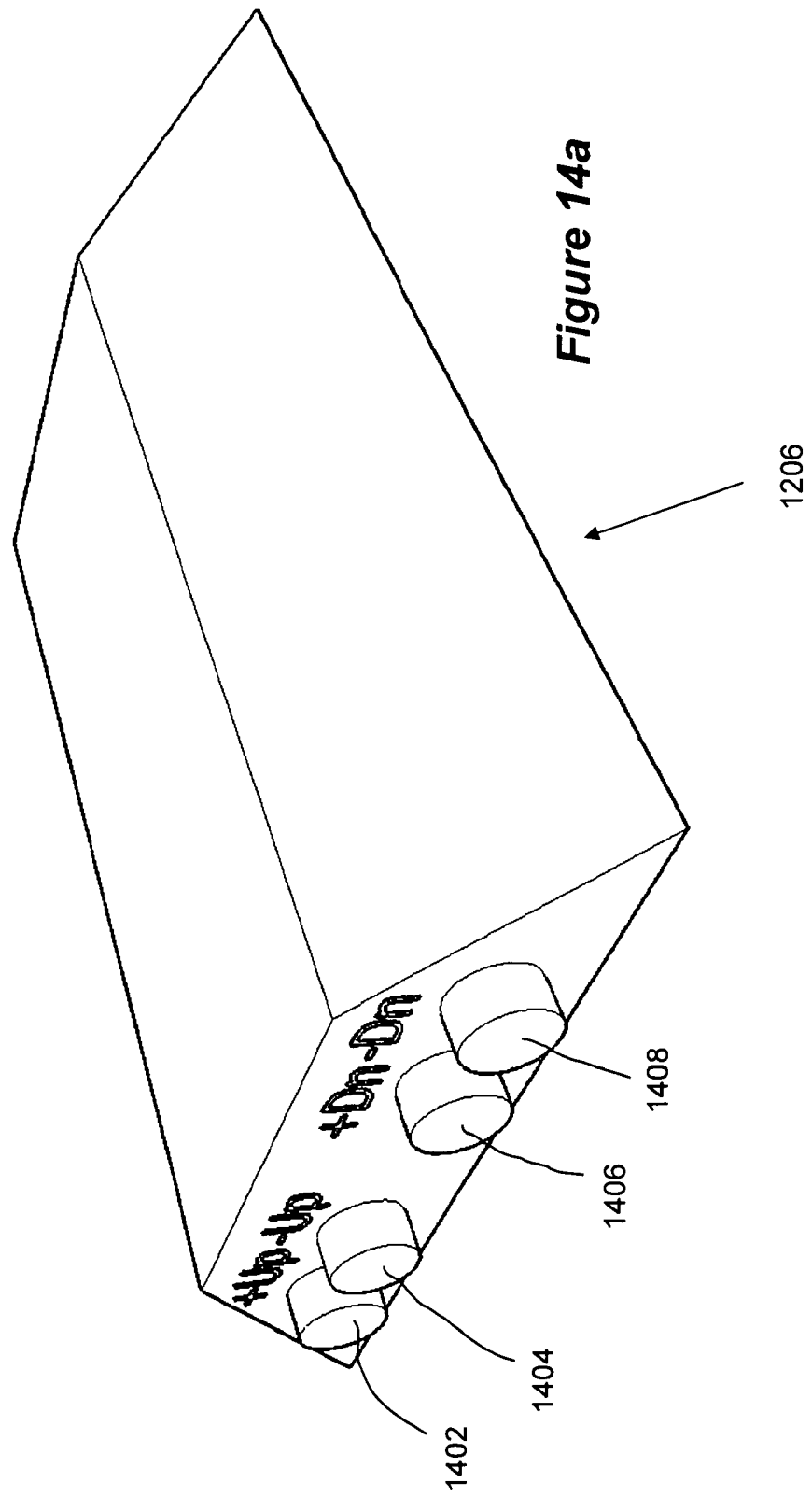
FIG. 14a illustrates a simplified mechanical drawing of a cascading junction box according to embodiments of the present invention.

According to an embodiment of the invention, FIG. 14a illustrates a simplified mechanical drawing of cascading junction box 1206. Cascading junction box 1206 has positive and negative polarity downstream input connectors 1406 and 1408 corresponding to downstream input connection 1210 shown in FIG. 12. Cascading junction box 1206 also has positive and negative polarity upstream output connectors 1402 and 1404 corresponding to connections 1208 shown in FIG. 12. Connectors 1402, 1404, 1406 and 1408 are preferably industry-standard connectors such as MC3, MC4, or others.

According to a further feature of the present invention, FIG. 14b depicts the back side view of the cascading junction box 1206. Cascading junction box 1206 has a surface 1410 provided for mechanically attaching cascading junction box 1206 to a solar panel (for example using a thermoset adhesive, e.g. epoxy based resin and hardener). Surface 1410 has an opening 1412, through which electrical connections for example between solar panel 1202a (FIG. 12) and input 1304 (FIG. 13) of electronic circuit 1308 (not shown) are made inside cascading junction box 1206.

Figure 15A:
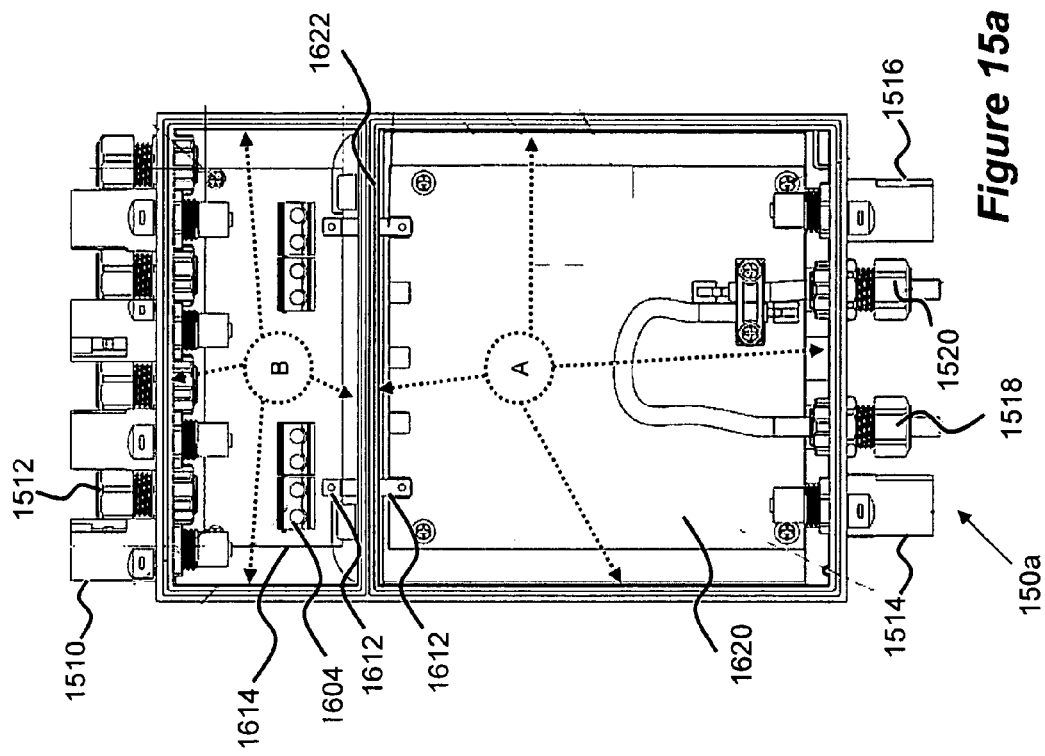
FIGS. 15 and 15a show a more detailed isometric view and plan view respectively of cascading junction box according to other embodiments of the present invention.
Figure 15:
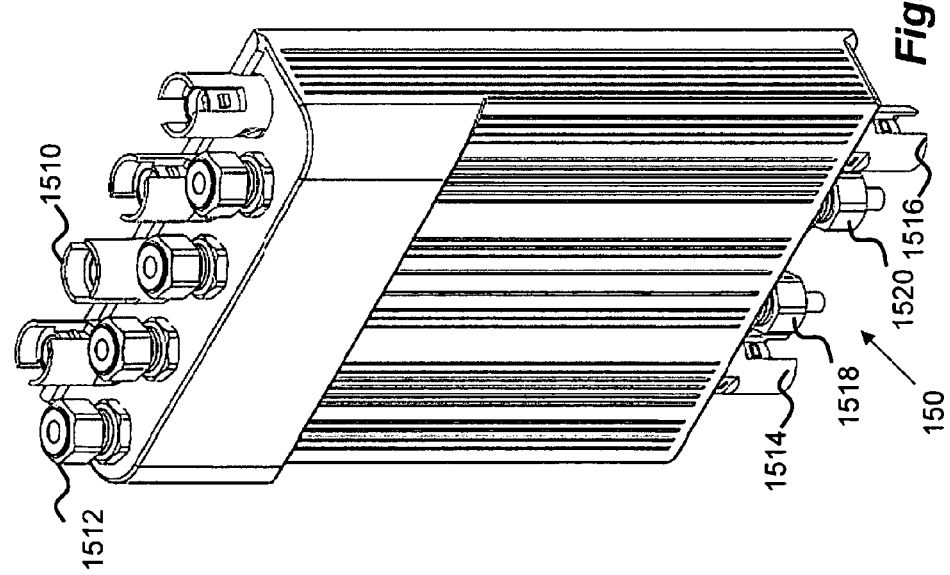

FIG. 15 and FIG. 15a show a more detailed isometric view 150 and plan view 150a of cascading junction box 1206 according to an embodiment of the present invention. Cascading junction box 1206 includes two chambers A and B to according to an embodiment of the present invention. A method of forming cascading junction box 1206 uses an injection molding process. A material of cascading junction box 1206 is a thermoplastic such as polyvinyl chloride or a thermoset such as epoxy resin. Chamber A includes supports for and is adapted to receive a circuit board 1620 mounted in chamber A. A lid (not shown) gives access to chamber A. Wall 1622 provides physical separation between chambers A and B. Electrical connectivity between circuit board 1620 in chamber A and electrical connectors 1604 in chamber B is via connectors 1612. In an embodiment of the present invention, connectors 1612 are sealed in wall 1622 in such a way as to preserve the desired integrity of chamber A for example against the ingress of water or humidity. Chamber B has electrical connectors 1604 supported by connector supports 1614. One end of electrical connectors 1604 connects electrically to circuit board 1620 via connectors 1612, the other end of electrical connectors 1604 connect electrically and mechanically to positive and negative terminals 1510 and 1512 respectively of cascading junction box 1206.

Glands 1518 and 1520 provide access for the direct connection of cables to printed circuit board 1620. Terminals 1514 and 1516 provide additional connectivity to printed circuit board 1620.

The mechanical aspect of sealing connectors 1612 (attached to wall 1622) and connector supports 1614 establishes additional mechanical support for electrical connectors 1604. A lid (not shown) gives access to chamber B whilst cascading junction box 1206 is optionally mechanically and electrically attached to a photovoltaic panel or a frame via connectors 1604. A preferred mechanism of attaching lid to cascading junction box 1206 is to use a rubber gasket arrangement such that chamber B is hermetically sealed against for example the ingress of water/humidity through lid into chamber B.

After circuit board 1620 is mounted and connected to connectors 1612, the lid is optionally permanently and/or hermetically sealed to chamber A.

According to another embodiment of the present invention, cascading junction box 1206 is constructed with a double wall 1622 so that chamber A and chamber B are mutually separable and re-attachable. Similarly, connectors 1612 are re-connectable between chamber A and chamber B. In this embodiment, a failure within the electronics of circuit board 1620 may be repaired by replacing chamber A with a new circuit board 1620 without requiring disconnection of chamber B from the photovoltaic panel and/or wiring panel. Similarly, an electronics upgrade may be easily achieved. Cascading junction box 1206 including chambers A and B, are preferably adapted to comply with temperature and insulation standard of IEC 61215 (Ed. 2) or other applicable industry standards for use with connection to photovoltaic panels. A lid not shown gives access to chamber A. Cascading junction box 1206 and lids thereof may be manufactured by injection molding of Acrylonitrile butadiene styrene (ABS) thermoplastic.

The definite articles "a", "an" is used herein, such as "a converter", "an output connector" have the meaning of "one or more" that is "one or more converters" or "one or more output connectors".

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

The invention claimed is:

1. A junction box comprising:
   a first chamber formed therein comprising a first separable side of a wall structure, a first separable portion of a first connector, and a second connector configured to receive direct current (DC) source power from at least one solar panel and to output the DC source power via the first separable portion of the first connector; and
   a second chamber formed therein comprising a second separable portion of the first connector and a second separable side of the wall structure, wherein the second chamber is configured to receive the DC source power from the first separable portion of the first connector via the second separable portion of the first connector and is configured to output DC output power on an output connector, and wherein the second chamber with the second separable side of the wall structure and with the second separable portion of the first connector is removable, via the wall structure, from the first chamber with the first separable side of the wall structure and with the first separable portion of the first connector without the first chamber being disconnected from the at least one solar panel.

2. The junction box of claim 1, further comprising:
   a circuit disposed in the second chamber, the circuit being configured to receive the DC source power from the second separable portion of the first connector and to output the DC output power on the output connector.

3. The junction box of claim 2, wherein the circuit comprises a bypass link, the bypass link being configured to pass the DC source power from the second separable portion of the first connector to the output connector.

4. The junction box of claim 2, wherein the circuit comprises a power converter, the power converter being configured to convert the DC source power received from the first separable portion of the first connector to converted DC power output on the output connector.

5. The junction box of claim 4, wherein the power converter comprises a circuit loop configured to set a voltage or a current at the first connector or at the second connector.

6. The junction box of claim 1, wherein the second connector is configured to receive first DC source power from a first solar panel and second DC source power from a second solar panel.

7. The junction box of claim 1, wherein the second connector is configured to receive first DC source power from a first solar panel connected to the first chamber and second DC source power from at least a second solar panel.

8. The junction box of claim 1, wherein the second connector is configured to receive at least a portion of the DC source power from one or more second junction boxes connected to the second connector.

9. The junction box of claim 1, further comprising a rubber gasket configured to hermetically seal the first chamber.

10. The junction box of claim 1, wherein the second chamber comprises a removable bypass link in a first configuration and a removable power converter in a second configuration.

11. A method comprising:
    forming a junction box to have:
    a first chamber formed therein comprising a first separable side of a wall structure, a first separable portion of a first connector, and a second connector configured to receive direct current (DC) source power from at least one solar panel and to output the DC source power via the first separable portion of the first connector; and
    a second chamber formed therein comprising a second separable portion of the first connector and a second separable side of the wall structure, wherein the second chamber is configured to receive the DC source power from the first separable portion of the first connector via the second separable portion of the first connector and is configured to output DC output power on an output connector, and wherein the second chamber with the second separable side of the wall structure and with the second separable portion of the first connector is removable, via the wall structure, from the first chamber with the first separable side of the wall structure and with the first separable portion of the first connector without the first chamber being disconnected from the at least one solar panel.

12. The method of claim 11, further comprising forming a circuit disposed in the second chamber, the circuit being configured to receive the DC source power from the second separable portion of the first connector and to pass the DC output power on the output connector.

13. The method of claim 12, wherein forming the circuit comprises forming a bypass link, the bypass link being configured to pass the DC source power from the second separable portion of the first connector to the output connector.

14. The method of claim 12, wherein forming the circuit comprises forming a power converter, the power converter being configured to convert the DC source power received from the first separable portion of the first connector to converted DC power output on the output connector.

15. The method of claim 14, further comprising forming the power converter with a circuit loop configured to set a voltage or a current at the first connector or at the second connector.

16. The method of claim 11, further comprising:
connecting a bypass link in the second chamber;
disconnecting the bypass link from the junction box; and
connecting a power converter in the second chamber.

17. A junction box having formed therein a first chamber and a second chamber, the junction box comprising:
a wall structure separating the first chamber and the second chamber with first and second separable sides, the first chamber comprising the first separable side of the wall structure and the second chamber comprising the second separable side of the wall structure;
a first connector disposed in the first chamber and configured to connect to at least one solar panel and to receive direct current (DC) source power from the at least one solar panel; and
a second connector coupled to the wall structure and comprising first and second separable portions respectively extending into the first and the second chambers, wherein the first separable portion of the second connector is configured to receive the DC source power from the first connector, wherein and the second separable portion of the second connector is configured to receive the DC source power from the first separable portion of the second connector and to input the DC source power into circuitry disposed in the second chamber,
wherein the second chamber, the circuitry, the second separable portion of the second connector, and the second separable side of the wall structure are configured to be removable as a single unit, via the wall structure, from the first chamber, the first separable portion of the second connector, and the first separable side of the wall structure without disconnecting the first chamber from the at least one solar panel.

18. The junction box of claim 17, wherein the circuitry comprises a bypass link configured to pass the DC source power from the second separable portion of the second connector to an output connector.

19. The junction box of claim 17, wherein the circuitry comprises a power converter, the power converter being configured to convert the DC source power received from the first separable portion of the second connector to converted DC source power on an output connector.

20. The junction box of claim 17, wherein the first connector is configured to receive at least a portion of the DC source power from one or more second junction boxes connected to the first connector.

21. The junction box of claim 1, wherein when the second chamber is removed via the wall structure from the first chamber without the first chamber being disconnected from the at least one solar panel, and wherein the first separable portion of the first connector is disposed in the first chamber.

22. The junction box of claim 1, wherein when the second chamber is removed via the wall structure from the first chamber without the first chamber being disconnected from the at least one solar panel, the second separable portion of the first connector is separated from the first separable portion of the first connector.

23. The junction box of claim 22, wherein the first separable portion of the first connector is disposed in the first chamber and the second separable portion of the first connector is disposed in the second chamber.

24. The junction box of claim 1, wherein the first and the second separable sides of the wall structure each extend continuously from a first end of the wall structure to a second end of the wall structure.

* * * * *